(12) United States Patent
Yamazaki et al.

(10) Patent No.: US 9,864,411 B2
(45) Date of Patent: *Jan. 9, 2018

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yuichi Yanagisawa, Atsugi (JP); Hisao Ikeda, Zama (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/428,327

(22) Filed: Feb. 9, 2017

(65) Prior Publication Data

US 2017/0153671 A1 Jun. 1, 2017

Related U.S. Application Data

(63) Continuation of application No. 14/551,989, filed on Nov. 24, 2014, now Pat. No. 9,572,268.

(30) Foreign Application Priority Data

Nov. 27, 2013 (JP) ................................. 2013-244743
Jun. 27, 2014 (JP) ................................. 2014-132607
Sep. 4, 2014 (JP) ................................. 2014-180540

(51) Int. Cl.
*G09G 3/32* (2016.01)
*G06F 1/16* (2006.01)
(Continued)

(52) U.S. Cl.
CPC ......... *G06F 1/1652* (2013.01); *G09G 3/3225* (2013.01); *H01L 51/0097* (2013.01);
(Continued)

(58) Field of Classification Search
None
See application file for complete search history.

(56) References Cited

U.S. PATENT DOCUMENTS 6,144,417 A 11/2000 Yanagisawa
7,260,135 B2 8/2007 Shimomura et al.
(Continued)

FOREIGN PATENT DOCUMENTS

| JP | 2011-228759 A | 11/2011 |
| JP | 2011-238908 A | 11/2011 |
| WO | WO-2004/003630 | 1/2004 |

OTHER PUBLICATIONS

Three Dimensional Effect Filter—Stress of Three Dimensional Effect—, The Journal of the Institute of Image Information and Television Engineers, Nov. 17, 2000, vol. 24, No. 72, pp. 7-12, The Institute of Image Information and Television Engineers.

*Primary Examiner* — Christopher Kohlman
(74) *Attorney, Agent, or Firm* — Robinson Intellectual Property Law Office; Eric J. Robinson

(57) ABSTRACT

To provide a display device that gives a viewer a strong stereoscopic effect or sense of depth or a natural stereoscopic effect or sense of depth in a two-dimensional image, a display device including a display portion having a curved surface is provided. The display portion may be bent in a horizontal direction or a vertical direction. Alternatively, the display portion may have a convex surface or a concave surface on a display surface side. The display device may include a frame portion. A display device including a frame portion and a display portion which has a display surface on a frame portion side, is located so as to be apart from the frame portion with a distance therebetween, and has a curved surface, in which the display portion overlaps with an opening of the frame portion, and an end portion of the display portion overlaps with the frame portion, is provided.

26 Claims, 28 Drawing Sheets

(51) Int. Cl.
   *H01L 51/00*    (2006.01)
   *H01L 51/52*    (2006.01)
   *G09G 3/3225*   (2016.01)
   *H01L 27/32*    (2006.01)
   *G09G 3/00*     (2006.01)

(52) U.S. Cl.
   CPC ...... *H01L 51/5237* (2013.01); *H01L 51/5284* (2013.01); *G09G 3/003* (2013.01); *G09G 2380/02* (2013.01); *H01L 27/3244* (2013.01); *H01L 2251/5338* (2013.01)

(56) References Cited

U.S. PATENT DOCUMENTS

| | | | |
|---|---|---|---|
| 7,335,573 B2 | 2/2008 | Takayama et al. | |
| 7,502,392 B2 | 3/2009 | Nomura et al. | |
| 7,580,085 B2 | 8/2009 | Jacobs et al. | |
| 8,188,474 B2 | 5/2012 | Hatano et al. | |
| 8,766,269 B2 | 7/2014 | Yamazaki et al. | |
| 8,859,304 B2 | 10/2014 | Momma et al. | |
| 2008/0224951 A1 | 9/2008 | Alberth | |
| 2010/0149149 A1 | 6/2010 | Lawther | |
| 2011/0134145 A1 | 6/2011 | Moriwaki | |
| 2011/0254037 A1 | 10/2011 | Arasawa | |
| 2012/0075166 A1 | 3/2012 | Marti et al. | |
| 2012/0140147 A1 | 6/2012 | Satoh et al. | |
| 2013/0114193 A1 | 5/2013 | Joo et al. | |
| 2013/0135259 A1 | 5/2013 | King et al. | |
| 2013/0155655 A1* | 6/2013 | Lee | H05K 5/03 362/97.1 |
| 2013/0164437 A1 | 6/2013 | Yamazaki et al. | |
| 2014/0045283 A1 | 2/2014 | Hirakata et al. | |
| 2014/0118319 A1 | 5/2014 | Jeon | |
| 2014/0307314 A1 | 10/2014 | Yanagisawa et al. | |
| 2014/0320543 A1* | 10/2014 | Oh | H01L 27/326 345/690 |

* cited by examiner

FIG. 1A1
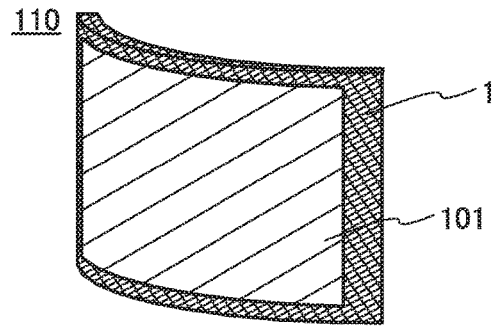
FIG. 1B1
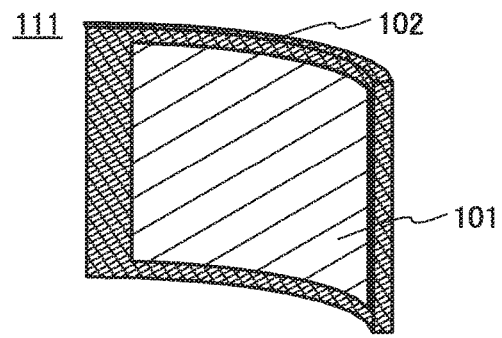
FIG. 1A2
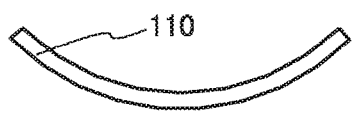
FIG. 1B2
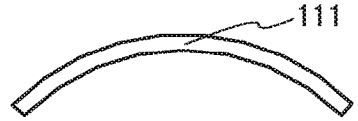
FIG. 1C1
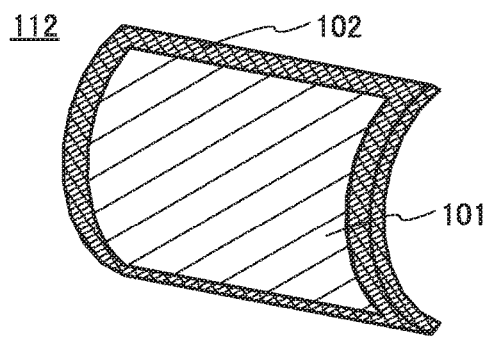
FIG. 1D1
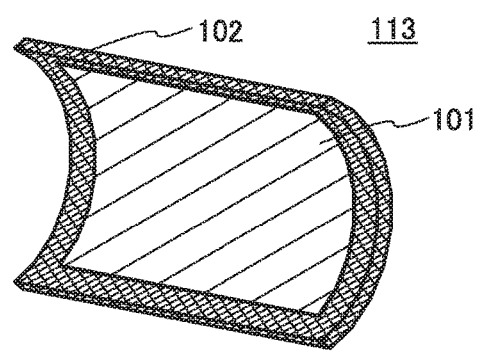
FIG. 1C2
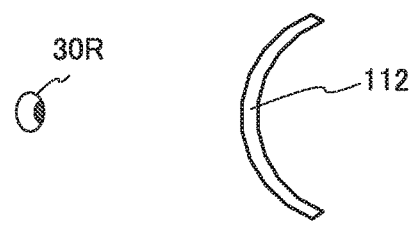
FIG. 1D2
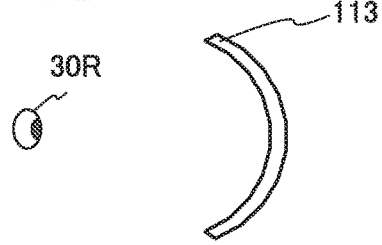

FIG. 2A1
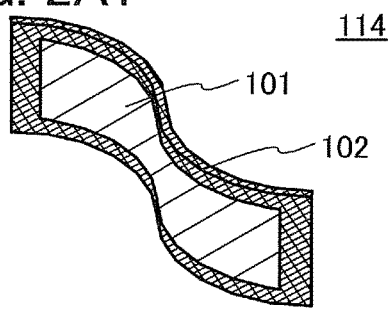
FIG. 2A2
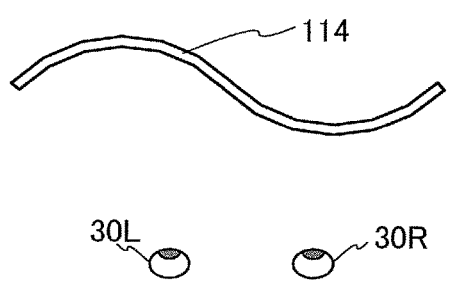
FIG. 2B
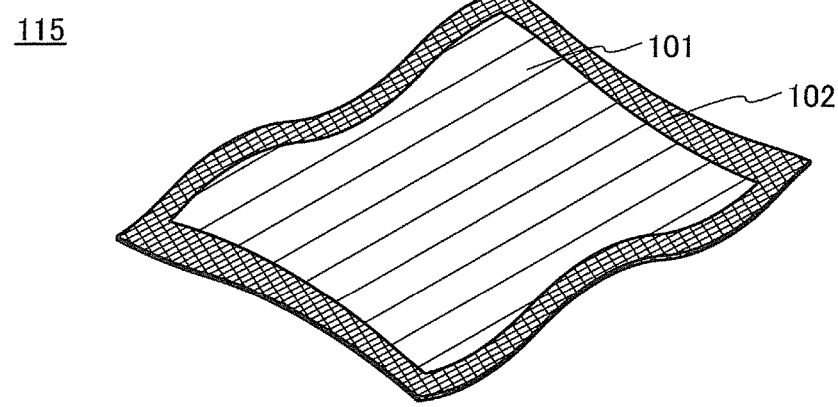

FIG. 3A
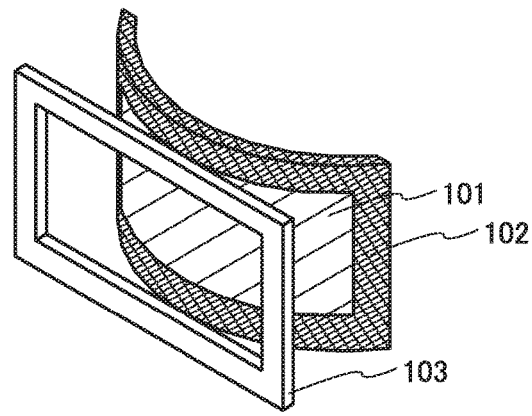
FIG. 3B
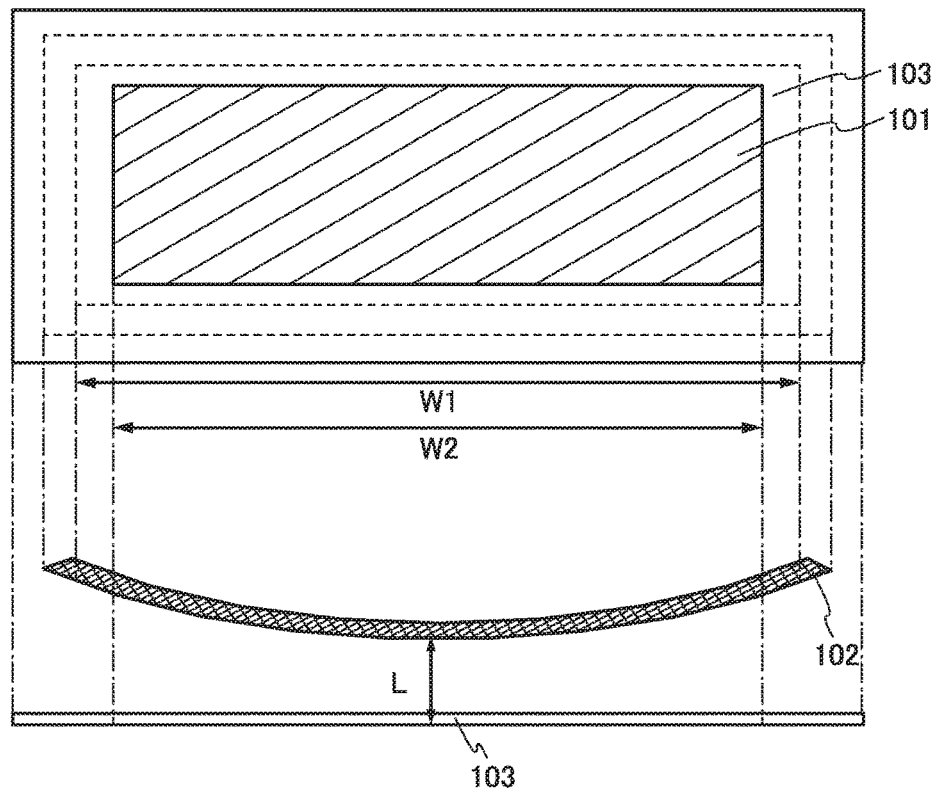

DISPLAY DEVICE

BACKGROUND OF THE INVENTION

1. Field of the Invention

One embodiment of the present invention relates to a display device, a semiconductor device, and a light-emitting device.

Note that one embodiment of the present invention is not limited to the above technical field. One embodiment of the invention disclosed in this specification and the like relates to an object, a method, and a manufacturing method. In addition, one embodiment of the present invention relates to a process, a machine, manufacture, or a composition of matter. Specifically, examples of the technical field of one embodiment of the present invention disclosed in this specification include a display device, a semiconductor device, a light-emitting device, a power storage device, a storage device, an electronic device, a lighting device, an input device (e.g., a touch sensor), an output device, an input/output device (e.g., a touch panel), a driving method thereof, and a manufacturing method thereof.

2. Description of the Related Art

A variety of display devices ranging from large display devices such as television receivers to small display devices such as cellular phones are put on the market. As higher value added products, display devices capable of displaying stereoscopic images have been actively developed to provide more realistic images.

Physiological factors in recognition of objects as stereoscopic objects by humans are binocular parallax, convergence, focus slide, motion parallax, object size, spatial layout, contrast, shading, and the like.

For example, a display device that displays a stereoscopic image using binocular disparity is known. Such a display device is configured to display, on one screen, an image to be seen from the position of the left eye of a viewer (an image for left eye) and an image to be seen from the position of the right eye of the viewer (an image for right eye). The viewer sees the image for left eye with the left eye and the image for right eye with the right eye and is thus allowed to see a stereoscopic image.

As one example of display devices using eyeglasses, there is a display device which displays an image for left eye and an image for right eye alternately on a screen in synchronization with a shutter provided in eyeglasses, whereby the left eye of a viewer is allowed to see only the image for left eye and the right eye of the viewer is allowed to see only the image for right eye. Thus, the viewer can see a stereoscopic image.

Furthermore, in a display device using a parallax barrier which allows a viewer to see a stereoscopic image with naked eyes, a screen is divided into a plurality of regions for left eye and a plurality of regions for right eye (e.g., strip-like regions) arranged side by side. A parallax barrier is provided to overlap with the boundaries of the regions. On the divided screen, an image for left eye and an image for right eye are displayed at the same time. With the parallax barrier, the regions for displaying the image for right eye are hidden from the left eye of a viewer and the regions for displaying the image for left eye are hidden from the right eye of the viewer; consequently, the left eye is allowed to see only the image for left eye and the right eye is allowed to see only the image for right eye. Thus, the viewer can see a stereoscopic image.

Note that a display device including a switchable parallax barrier for achieving switching between a two-dimensional image display mode and a stereoscopic image display mode is known (Patent Document 1).

In addition, a light-emitting element using an electroluminescence (hereinafter also referred to as EL) phenomenon is also known. This light-emitting element is a self-luminous type; therefore, high contrast and high speed of response to an input signal are achieved. Furthermore, a display device to which this light-emitting element is applied and which consumes low power, is manufactured in a simple process, and is easily adapted to the increase in definition and the size of a substrate is known (Patent Document 2).

REFERENCE

Patent Document

[Patent Document 1] PCT International Publication No. WO2004/003630

[Patent Document 2] Japanese Published Patent Application No. 2011-238908

SUMMARY OF THE INVENTION

A display device utilizing eyeglasses with shutters displays images for left eye and images for right eye alternately on a screen, which results in an increase in the frequency of image writing to a pixel portion in one frame period as compared with the case of displaying a two-dimensional image. This requires a driver circuit which can be driven at high frequency and also increases the power consumption of the display device.

In a display device with a parallax barrier, the number of pixels that contribute to image display for left eye and the number of pixels that contribute to image display for right eye in the horizontal direction of a pixel portion are reduced to half of the actual number, which prevents high-definition images from being displayed.

Accordingly, it is demanded that a display device can display a two-dimensional image that gives a viewer a strong sense of depth or stereoscopic effect instead of images with binocular disparity such as images for left eye and images for right eye.

It is an object of one embodiment of the present invention to give a viewer a strong stereoscopic effect or sense of depth in a two-dimensional image. Another object of one embodiment of the present invention is to give a viewer a natural stereoscopic effect or sense of depth in a two-dimensional image.

Another object of one embodiment of the present invention is to provide a novel display device. Another object of one embodiment of the present invention is to provide a display device that gives a viewer a strong stereoscopic effect or sense of depth in a two-dimensional image. Another object of one embodiment of the present invention is to provide a display device that gives a viewer a natural stereoscopic effect or sense of depth in a two-dimensional image. Another object of one embodiment of the present invention is to provide a display device that gives a viewer less fatigue, and a strong stereoscopic effect or sense of depth in a two-dimensional image. Another object of one embodiment of the present invention is to provide a display device that gives a viewer less fatigue, and a natural stereoscopic effect or sense of depth in a two-dimensional image.

Note that the description of these objects does not disturb the existence of other objects. In one embodiment of the present invention, there is no need to achieve all the objects.

Other objects will be apparent from and can be derived from the description of the specification, the drawings, the claims, and the like.

One embodiment of the present invention is a display device including a display portion having a curved surface.

In the above display device, the display portion may be bent in a horizontal direction. In addition, in the display device, the display portion may be bendable in a horizontal direction.

In the above display device, the display portion may be bent in a vertical direction. In addition, in the display device, the display portion may be bendable in a vertical direction.

In the above display device, the display portion may have a convex surface (a convex curved surface) on the display surface side. In addition, in the display device, the display portion may be able to have a convex surface on the display surface side.

In the above display device, the display portion may have a concave surface (a concave curved surface) on the display surface side. In addition, in the display device, the display portion may be able to have a concave surface on the display surface side.

According to one embodiment of the present invention, a display device includes a frame portion, and a display portion which has a display surface on a frame portion side, which is located so as to be apart from the frame portion with a distance therebetween, and which has a curved surface. The display portion overlaps with an opening of the frame portion, and an end portion of the display portion overlaps with the frame portion.

In this specification, the distance between the frame portion and the display portion corresponds to a distance between the display surface of the display portion and the surface of the frame portion on a viewer side. That is, the distance between the frame portion and the display portion is the sum of the distance between the display surface of the display portion and the surface of the frame portion facing the display surface and the thickness of the frame portion itself (a distance between a surface of the frame portion facing the display surface and a surface of the frame portion on the viewer side). Even when the frame portion and the display portion are in contact with each other, the frame portion and the display portion are located so as to be apart from each other with a distance therebetween by the thickness of the frame portion.

In the above display device, it is preferable that a corner of an inner frame of the frame portion have curvature.

In the above display device, it is preferable that the corner of the inner frame of the frame portion have larger curvature than a corner of the display portion.

In the above display device, it is preferable that the curvature of the corner of the inner frame of the frame portion be variable.

In the above display device, it is preferable that the size of the inner frame of the frame portion be variable.

In the above display device, it is preferable that the frame portion be attachable and detachable freely.

In the above display device, it is preferable that the frame portion be curved.

According to another embodiment of the present invention, a display device includes a display portion that can be curved, an arithmetic processing portion which is supplied with image data and which can supply a control signal, and a drive control portion which is supplied with the control signal and which can change the degree or the direction of a curvature of the display portion. The arithmetic processing portion generates the control signal by analyzing the image data.

According to another embodiment of the present invention, a display device includes a frame portion that can be curved, a display portion that can be curved, an arithmetic processing portion which is supplied with image data and which can supply a control signal, and a drive control portion which is supplied with the control signal and which can change the degrees or the directions of curvatures of the display portion and the frame portion. The arithmetic processing portion generates the control signal by analyzing the image data.

Note that the drive control portion may be able to change the degree of an inclination of the frame portion, the shape of the inner frame of the frame portion, or the like instead of or in addition to the degree or the direction of a curvature of the frame portion.

According to another embodiment of the present invention, a display device includes a frame portion, a light-transmitting layer, and a display portion. The light-transmitting layer includes a viewing surface and a convex surface opposite to each other. The refractive index of the light-transmitting layer is higher than the refractive index of the air. The display portion includes an end portion overlapping with the frame portion with the light-transmitting layer therebetween. The display portion includes a portion overlapping with an opening of the frame portion and the light-transmitting layer. A plurality of display elements capable of displaying an image toward the viewing surface are provided along the convex surface in the display portion. In the above structure, the viewing surface may be a plane that intersects the convex surface at at least three points.

According to one embodiment of the present invention, a viewer can have a strong stereoscopic effect or sense of depth in a two-dimensional image. According to one embodiment of the present invention, a viewer can have a natural stereoscopic effect or sense of depth in a two-dimensional image.

According to one embodiment of the present invention, a novel display device can be provided. According to one embodiment of the present invention, a display device that gives a viewer a strong stereoscopic effect or sense of depth in a two-dimensional image can be provided. According to one embodiment of the present invention, a display device that gives a viewer a natural stereoscopic effect or sense of depth in a two-dimensional image can be provided. According to one embodiment of the present invention, a display device that gives a viewer less fatigue, and a strong stereoscopic effect or sense of depth in a two-dimensional image can be provided. According to one embodiment of the present invention, a display device that gives a viewer less fatigue, and a natural stereoscopic effect or sense of depth in a two-dimensional image can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 1A1, 1A2, 1B1, 1B2, 1C1, 1C2, 1D1, and 1D2 illustrate examples of a display device.

FIGS. 2A1, 2A2, and 2B illustrate examples of a display device.

FIGS. 3A and 3B illustrate an example of a display device.

DETAILED DESCRIPTION OF THE INVENTION

Figure 4A:
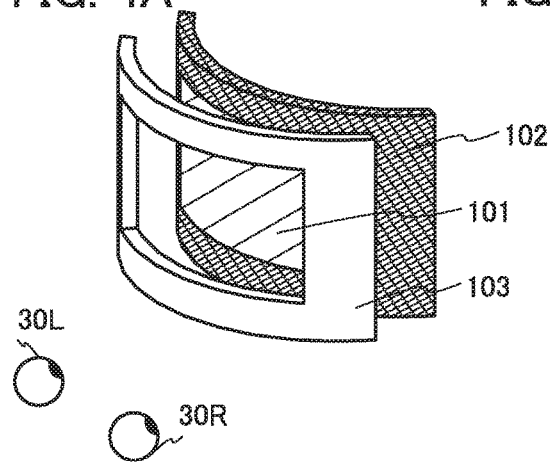
FIGS. 4A to 4F illustrate examples of a display device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

[Embodiment 1]

In this embodiment, a display device of one embodiment of the present invention will be described with reference to FIGS. 1A1 to 1D2, FIGS. 2A1 to 2B, FIGS. 3A and 3B, FIGS. 4A to 4F, FIGS. 5A to 5C, FIGS. 6A to 6G, FIGS. 7A to 7D, FIG. 8, FIGS. 25A to 25D, and FIGS. 26A to 26E.

One embodiment of the present invention is a display device including a display portion having a curved surface.

A viewer can have a strong stereoscopic effect or sense of depth in a displayed two-dimensional image of a bent display portion (a curved display portion) as compared with a smooth display portion.

The display portion may be bent in a horizontal direction or a vertical direction. Alternatively, the display portion may have a convex surface (a convex curved surface) or a concave surface (a concave curved surface) on a display surface side (or on a viewer side).

The display portion may be flexible; for example, the display portion may be bendable in a horizontal direction or a vertical direction. Alternatively, the display portion may be able to have a convex surface or a concave surface on the display surface side.

Note that the display portion may be controlled by a viewer himself/herself or may be automatically controlled by the display device or the display portion. The display portion may be curved while reproducing an image. Alternatively, the shape of the display portion may be constant while reproducing an image and bendable while not operating.

FIGS. 1A1 to 1D2 illustrate examples of the display device of one embodiment of the present invention. Note that in each display device in FIGS. 1A2, 1B2, 1C2, and 1D2, the display surface of the display device is located on a viewer side (a right eye 30R and a left eye 30L).

A display device 110 illustrated in FIGS. 1A1 and 1A2 includes a display portion 101 and a non-display portion 102. The display portion 101 is bent in a horizontal direction (here, in a major-axis direction of the display portion 101) and includes a convex surface (a convex curved surface) on a display surface side (a viewer side).

A display device 111 illustrated in FIGS. 1B1 and 1B2 includes a display portion 101 and a non-display portion 102. The display portion 101 is bent in a horizontal direction and includes a concave surface (a concave curved surface) on a display surface side (a viewer side).

A display device 112 illustrated in FIGS. 1C1 and 1C2 includes a display portion 101 and a non-display portion 102. The display portion 101 is bent in a vertical direction (here, in a minor-axis direction of the display portion 101) and includes a convex surface on a display surface side (a viewer side).

A display device 113 illustrated in FIGS. 1D1 and 1D2 includes a display portion 101 and a non-display portion 102. The display portion 101 is bent in a vertical direction and includes a concave surface on a display surface side (a viewer side).

In any of the structures in FIGS. 1A1, 1B1, 1C1, and 1D1, a viewer can feel a strong stereoscopic effect or sense of depth in a two-dimensional image. A stereoscopic effect or a sense of depth in a horizontal direction is stronger than that in a vertical direction (see Example 3 described later). In addition, a stereoscopic effect or a sense of depth of a display device including a convex surface on a viewer side is stronger than that of a display device including a concave surface (see Example 3 described later).

Like a display device 114 illustrated in FIGS. 2A1 and 2A2, the display device of one embodiment of the present invention may include the display portion 101 having a plurality of curved surfaces. The display portion 101 is bent in a horizontal direction and includes a convex surface and a concave surface on a display surface side.

Like a display device 115 illustrated in FIG. 2B, the display device of one embodiment of the present invention does not necessarily have a bend line which is parallel or perpendicular to a side of the display device or the display portion and may be bent in a diagonal direction.

According to one embodiment of the present invention, a display device includes a frame portion, and a display portion which has a display surface on a frame portion side, which is located so as to be apart from the frame portion with a distance therebetween, and which has a curved surface. The display portion overlaps with an opening of the frame portion, and an end portion of the display portion overlaps with the frame portion.

The display device of one embodiment of the present invention includes the frame portion between a viewer and the display portion, whereby the viewer has an optical illusion that the position of the display portion is different from actual one, stereoscopic information is corrected by brain, and thus the viewer can feel a stereoscopic effect or a sense of depth in a two-dimensional image.

When the degree of a curvature or an inclination of the frame portion, the shape or the size of the opening of the frame portion, or the like is constant in the display device, a problem might be caused. For example, the way a viewer feels a stereoscopic effect or a sense of depth differs depending on a viewer, and an appropriate range of conditions such as the degree of a curvature or an inclination of the frame portion, the shape or the size of the opening of the frame portion, and the like might vary among individuals. In the case where these conditions are not suitable for a viewer, the viewer cannot feel a stereoscopic effect or a sense of depth in a two-dimensional image easily in some cases even by viewing the display portion through the opening of the frame portion. In contrast, when the stereoscopic effect or sense of depth is too strong, loads of the brain or eyes become high and accordingly the viewer might have severe strain. Furthermore, depending on an image displayed on the display portion, the intensity of a stereoscopic effect or a sense of depth might be changed without intent or might not be changed though intended to be changed.

Thus, in the display device of one embodiment of the present invention, at least any one of a curvature of the frame portion, an inclination of the frame portion, the shape of the opening of the frame portion, the size of the frame portion, and the like is variable. Accordingly, the frame can be adjusted so that a viewer can feel a natural stereoscopic effect and can feel less fatigue. In addition, by adjusting the frame portion depending on an image displayed on the display portion, a change of the intensity of a stereoscopic effect or a sense of depth without intent can be suppressed or the intensity of a stereoscopic effect or a sense of depth can be changed intentionally. Accordingly, in the display device of one embodiment of the present invention, a viewer can feel a strong stereoscopic effect or sense of depth in a two-dimensional image and can feel less fatigue.

Note that the frame portion may be controlled by a viewer himself/herself or may be automatically controlled by the display device or the frame portion. In addition, a curvature of the frame portion, an inclination of the frame portion, the shape of the opening of the frame portion, or the size of the frame portion may be changed while an image is reproduced. Alternatively, the shape of the frame portion may be constant while reproducing an image and can be changed while not operating.

A positional relation between the display portion and the frame portion of the display device of one embodiment of the present invention is described with a perspective view of a display device illustrated in FIG. 3A and a front view (a view viewed from the display surface side) and a top view of the display device illustrated in FIG. 3B.

The display device in FIGS. 3A and 3B includes a display portion 101, a non-display portion 102, and a frame portion 103. The display portion 101 includes a display surface on the frame portion 103 side. The display portion 101 and the frame portion 103 are located so as to be apart from each other with a distance L therebetween. The display portion 101 overlaps with an opening of the frame portion 103, and an end portion of the display portion 101 overlaps with the frame portion 103. Moreover, the display portion 101 has a curved surface. Although an example in which the display portion 101 is bent in a horizontal direction and has a convex surface on the display surface side is illustrated here, one embodiment of the present invention is not limited thereto.

In this specification, the distance between the frame portion 103 and the display portion 101 corresponds to a distance between the display surface of the display portion 101 and the surface of the frame portion 103 on a viewer side. That is, the distance between the frame portion 103 and the display portion 101 is the sum of the distance between the display surface of the display portion 101 and the surface of the frame portion 103 facing the display surface and the thickness of the frame portion 103 itself (a distance between a surface of the frame portion 103 facing the display surface and a surface of the frame portion 103 on the viewer side). Even when the frame portion 103 and the display portion 101 are in contact with each other, the frame portion 103 and the display portion 101 are located so as to be apart from each other with a distance therebetween by the thickness of the frame portion 103.

For example, the distance L between the frame portion 103 and the display portion 101 is 1 mm or more, preferably 1 cm or more, further preferably 5 cm or more, in which case a viewer can feel a strong stereoscopic effect or sense of depth in a two-dimensional image.

Although the distance between the frame portion 103 and the display portion 101 differs depending on the position of the display portion 101, such as the end portion or the center portion, the distance is at least greater than 0, preferably 1 mm or more in part of the display portion 101. In particular, the minimum distance between the display surface of the display portion 101 and the surface of the frame portion 103 on the viewer side is 1 cm or more, preferably 5 cm or more, in which case the viewer can feel a strong stereoscopic effect or sense of depth in a two-dimensional image which is displayed on the entire surface of the display portion.

FIG. 3B illustrates the case where four sides of the display portion 101 overlap with the frame portion 103. According to one embodiment of the present invention, without limitation to such a structure, at least part of the display portion 101 may overlap with the frame portion 103. For example, only two opposite sides of the display portion 101 may overlap with the frame portion 103.

In addition, FIG. 3B illustrates the case where a long side W1 of the display portion 101 is longer than a long side W2 of the opening of the frame portion 103, and a short side of the display portion 101 is longer than a short side of the opening of the frame portion 103. According to one embodiment of the present invention, without limitation to such a structure, either a long side or a short side of the display portion 101 may be longer than that of the opening of the frame portion 103, for example.

Moreover, even when the proportion of display in the display portion that is visible for a viewer is less than 50%, the viewer can feel a stereoscopic effect or a sense of depth. However, the viewer grasps the entire display with difficulty, views the display unnaturally, or feels strong fatigue. Thus, it is preferable that a viewer who faces the display surface of the display device can view 50% or more, preferably 70% or more, further preferably 90% or more of display in the display portion through the opening of the frame portion.

A viewer of the display device (see a right eye 30R and a left eye 30L in FIG. 3B) views a two-dimensional image (a still image or a moving image) displayed on the display portion 101 through the opening of the frame portion 103. The viewer can feel a strong stereoscopic effect or sense of depth in the two-dimensional image by viewing display in the display portion 101 through the opening of the frame portion 103 as compared with the case of viewing display in the display portion 101 without through the opening of the frame portion 103.

The viewer can feel a strong stereoscopic effect or sense of depth in a two-dimensional image even when viewing the display portion 101 with one eye. The viewer can feel a stronger stereoscopic effect or sense of depth in a two-dimensional image by viewing the display portion 101 with both eyes and feeling a difference between information that comes into the right eye and information that comes into the left eye.

Note that the frame portion 103 may be attachable and detachable freely. The display device can be used without the frame portion 103 when display which does not require a stereoscopic effect or a sense of depth is made on the display portion 101. In addition, a plurality of attachable and detachable frame portions 103 whose openings differ in size, shape, or the like may be prepared and the frame portions 103 may be replaced with each other. Note that the frame portion may be attached to a display panel (the display portion), may store the display panel, or may be worn on the head of a viewer.

FIGS. 4A to 4F illustrate examples of the display device of one embodiment of the present invention.

According to one embodiment of the present invention, the frame portion may be curved.

The frame portion may be bent in a horizontal direction or a vertical direction. Alternatively, the frame portion may have a convex surface (a convex curved surface) or a concave surface (a concave curved surface) on a display surface side (or on a viewer side).

The frame portion may be flexible; for example, the frame portion may be bendable in a horizontal direction or a vertical direction. Alternatively, the frame portion may be able to have a convex surface or a concave surface on the display surface side.

Figure 4B:
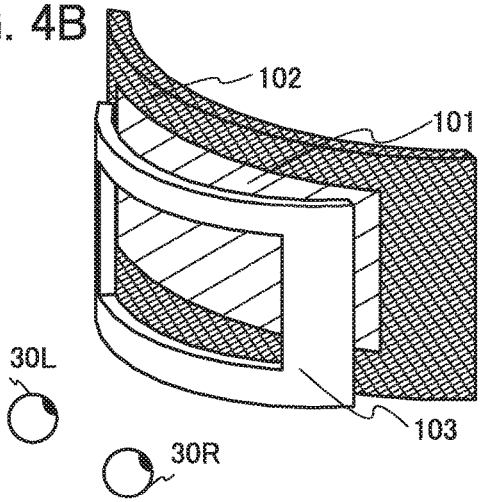

A frame portion 103 illustrated in each of FIGS. 4A and 4B is bent in a horizontal direction (here, in a major-axis direction of the display portion 101) in a manner similar to that of a display portion 101 and includes a convex surface (a convex curved surface) on a viewer side.

The degree of a curvature of the display portion 101 may be the same as or different from that of a curvature of the frame portion 103. For example, the display portion 101 and the frame portion 103 may be bent with the same curvature as illustrated in FIG. 4A, or the display portion 101 and the frame portion 103 may be bent with different curvatures as illustrated in FIG. 4B. The bend line of the display portion 101 and the bend line of the frame portion 103 may overlap with each other or may not overlap with each other.

Figure 4C:
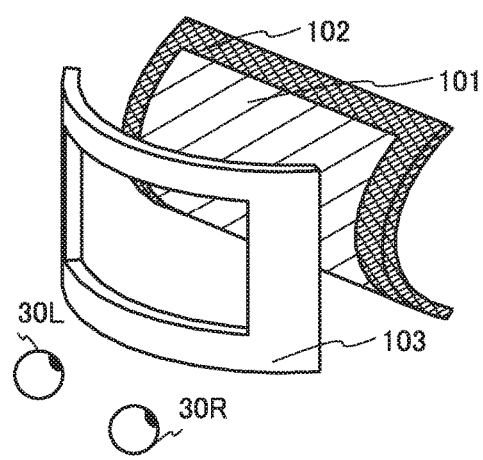

In FIG. 4C, a frame portion 103 is bent in a horizontal direction, and a display portion 101 is bent in a vertical direction. Each of the frame portion 103 and the display portion 101 has a convex surface on a viewer side.

Figure 4D:
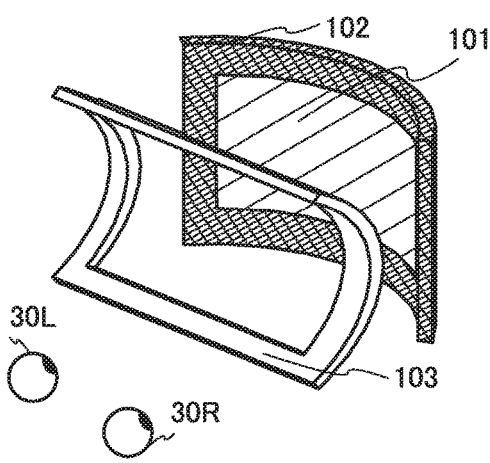

In FIG. 4D, a frame portion 103 is bent in a vertical direction, and a display portion 101 is bent in a horizontal direction. Each of the frame portion 103 and the display portion 101 has a concave surface on a viewer side.

Figure 4E:
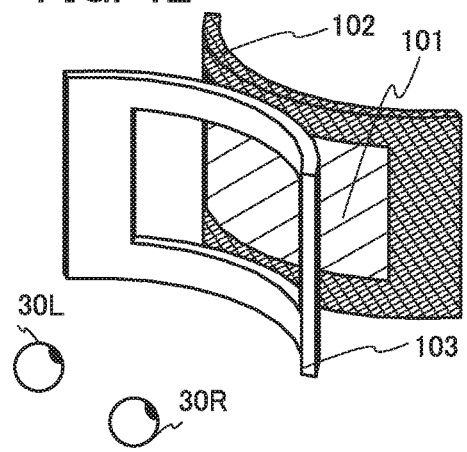
Figure 4F:
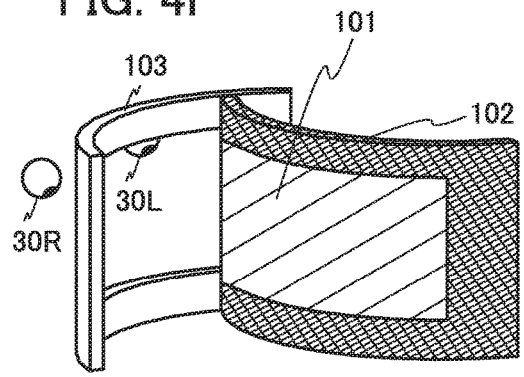

In FIG. 4E, a frame portion 103 includes a concave surface on a viewer side, and a display portion 101 includes a convex surface on the viewer side. Each of the frame portion 103 and the display portion 101 is bent in a horizontal direction.

Although FIGS. 4A to 4E illustrate examples in each of which the display portion 101, the frame portion 103, and a viewer (a right eye 30R and a left eye 30L) face one another, one embodiment of the present invention is not limited thereto. For example, in a display device illustrated in FIG. 4F, a viewer (a right eye 30R and a left eye 30L) does not face a display portion 101 when seeing display in the display portion 101 through an opening of a frame portion 103.

Figure 5A:
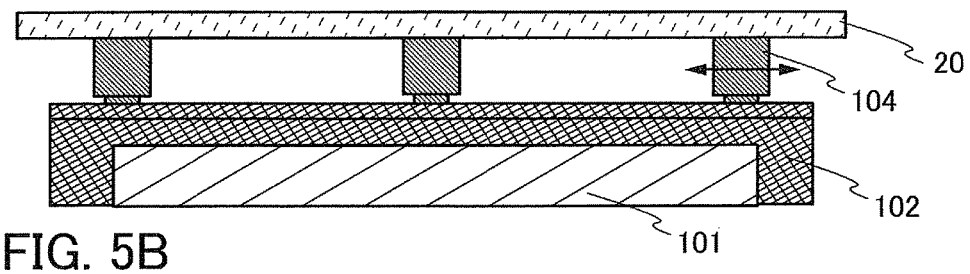
FIGS. 5A to 5C illustrate an example of a display device.
Figure 5B:
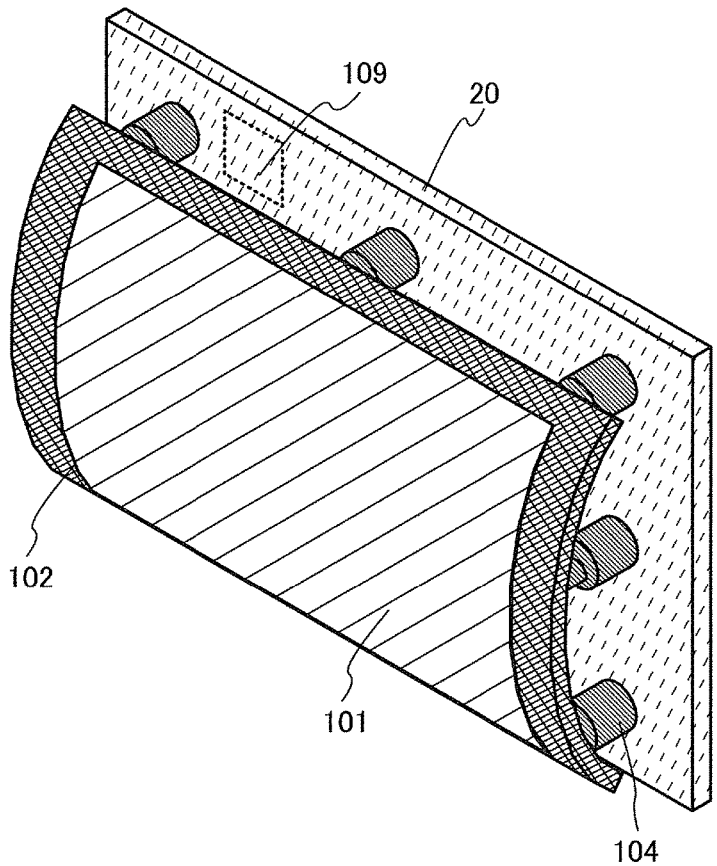
Figure 5C:
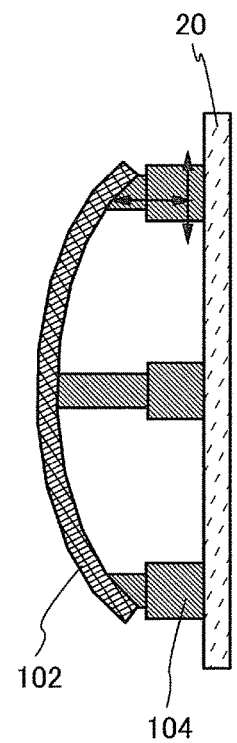

FIGS. 5A to 5C illustrate an example of the display device of one embodiment of the present invention.

FIG. 5A is a top view of a display device, FIG. 5B is a perspective view of the display device, and FIG. 5C is a side view of the display device.

The display device in FIGS. 5A to 5C includes a display portion 101 having flexibility, a non-display portion 102, and a plurality of driver portions 104. The driver portions 104 can be driven independently. The degree, the direction, or the like of a curvature of the display portion 101 can be adjusted in accordance with the lengths or the positions of the driver portions 104 attached to a structure body 20. The driver portions 104 may be movable in a vertical direction and a horizontal direction on the surface of the structure body 20 as indicated by arrows. Alternatively, the length of the driver portion 104 in a direction perpendicular to the surface of the structure body 20 may be variable. A contact between the driver portion 104, and the display portion 101 or the non-display portion 102 may be moved.

The number of driver portions is not limited. In the case where there is a plurality of driver portions, the plurality of driver portions may be driven independently or at least part of the driver portions may be driven in synchronization with each other.

Note that the driver portions 104 may be attached to a member of the display device, or may be attached to a wall surface or a floor on which the display device is disposed. That is, the structure body 20 may be included or may not be included in the display device.

The display device in FIGS. 5A to 5C includes a processing portion 109. For example, the degree, the direction, or the like of a curvature of the display portion 101 can be changed in accordance with the content of a moving image by having the processing portion 109. Accordingly, such a case is preferable because a viewer can feel a strong stereoscopic effect or sense of depth in a two-dimensional image.

Specifically, for example, when a moving image in which a moving object approaches toward a viewer is displayed, the display portion 101 may be transformed so as to have a convex surface on a viewer side.

Figure 8:
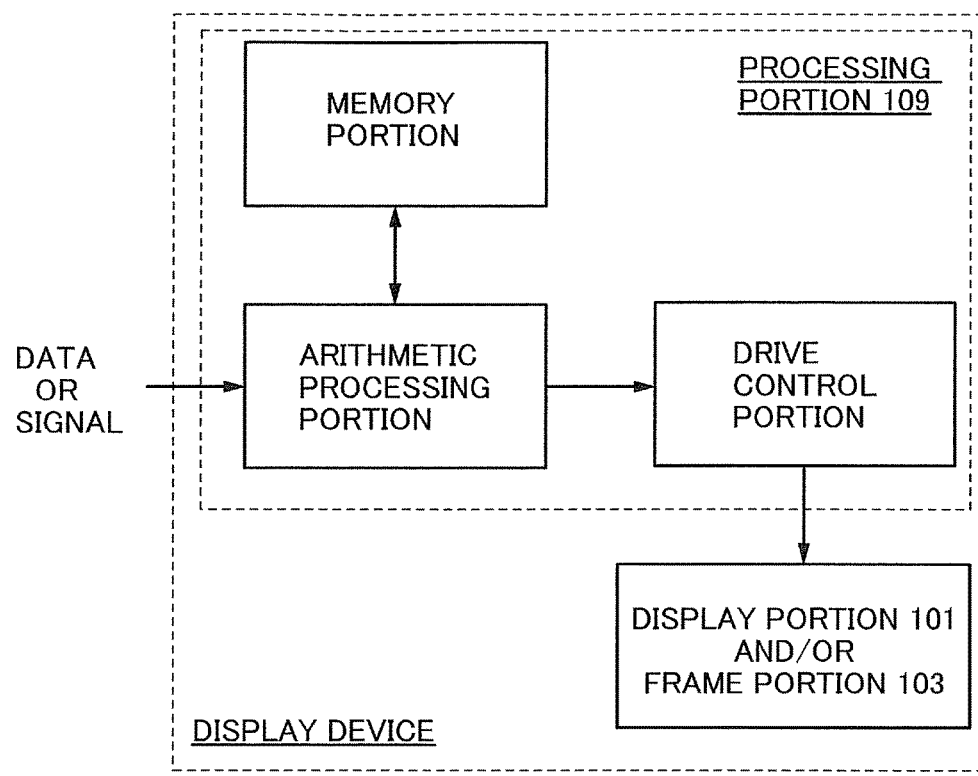
FIG. 8 illustrates an example of a display device.

A structure example of the display device having the processing portion 109 is shown in FIG. 8.

The processing portion 109 includes an arithmetic processing portion, a memory portion, and a drive control portion shown in FIG. 8.

An image data displayed on the display portion 101 is supplied to the arithmetic processing portion. The arithmetic processing portion generates a control signal by analyzing the supplied image data.

As the analysis of the image data, spectrum analysis (content analysis) and detection of expansion or movement (zoom-in/zoom-out, pan tilt (panning), the speed of movement, the direction of movement, or the like) can be given.

In the case where an audio data is supplied to the arithmetic processing portion, a control signal may be generated by analyzing the supplied audio data. Alternatively, a control signal may be generated on the basis of the analysis results of both the image data and the audio data.

As the analysis of the audio data, spectrum analysis (content analysis), sound source analysis, and separate extraction of music, human voice, or the like can be given.

Furthermore, as a result of detecting a focal length or a sight line of a viewer or evaluating sensitivity of a stereoscopic effect, fatigue, or the like of the viewer when the viewer views the display portion, data of the results are supplied to the arithmetic portion, in which case a control signal may be generated by analyzing the data.

For example, in sensitivity evaluation carried out in advance, which curved surface of the display portion a plurality of viewers of the display device can feel a strong stereoscopic effect is examined. Each viewer selects own data obtained in the sensitivity evaluation when using the display device. As a result, a control signal generated by analyzing the data in the arithmetic processing portion is supplied from the arithmetic processing portion to the drive control portion. Then, the drive control portion transforms the display portion to have a curved surface suitable for a viewer on the basis of the control signal.

In addition, the viewer can select the intensity and existence of a stereoscopic effect, the degree of a curvature of the display portion, the degree of a curvature or an inclination of the frame portion, or the shape, the size, or the like of an inner frame of the frame portion, and a signal based on the selection may be supplied to the arithmetic processing portion. In the arithmetic processing portion, a control signal based on the signal may be generated.

In the memory portion, data used for an arithmetic operation in the arithmetic processing portion, arithmetic results, or the like is stored.

A control signal generated in the arithmetic processing portion is supplied to the drive control portion, and the frame portion can be controlled on the basis of the control signal. The frame portion may be moved directly or may be moved indirectly by moving the driver portion.

FIGS. 6A to 6G illustrate examples of the shape of the inner frame of the frame portion in one embodiment of the present invention. The shape of the inner frame of the frame portion 103 may be similar to or different from that of the display portion 101. For example, when the display portion 101 is in the shape of a rectangle, the inner frame of the frame portion 103 may be in the shape of a rectangle, a polygon other than a rectangle, such as a trapezoid (FIG. 6A) or a hexagon (FIG. 6B), a circle, an ellipse (FIG. 6C), or the like. Note that although not illustrated, the display portion 101 may be in the shape of a circle, an ellipse, a polygon other than a rectangle, or the like.

Figure 6A:
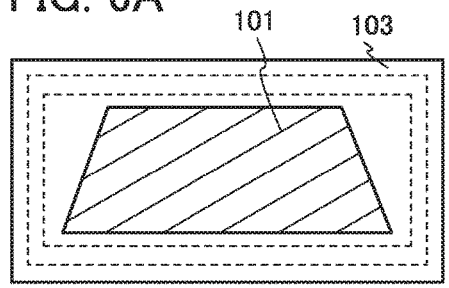
FIGS. 6A to 6G illustrate examples of a display device.
Figure 6B:
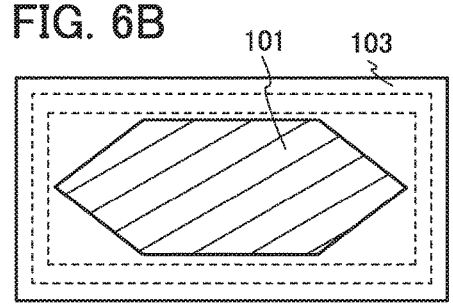
Figure 6C:
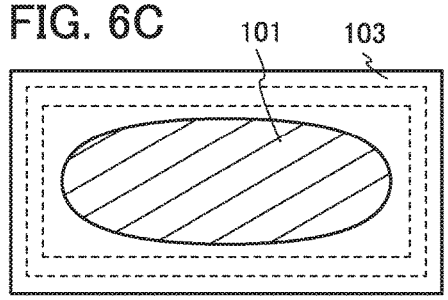
Figure 6D:
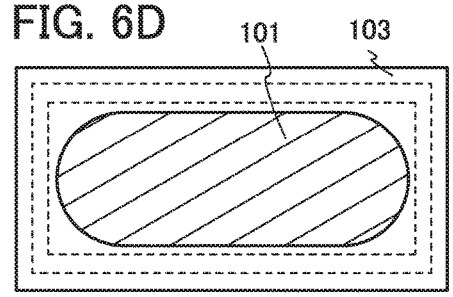
Figure 6E:
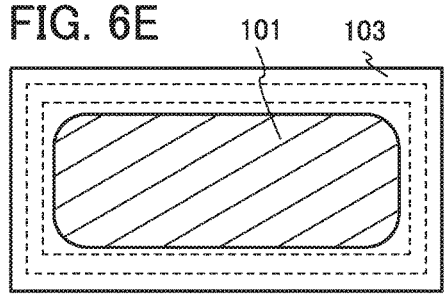

Moreover, corners of the inner frame of the frame portion 103 preferably have curvature as illustrated in FIGS. 6C to 6E because a viewer can feel a strong stereoscopic effect or sense of depth in a two-dimensional image. In addition, the corners of the inner frame of the frame portion 103 preferably have curvature because naturalness of a two-dimensional image is enhanced for the viewer in some cases. In particular, the corners of the inner frame of the frame portion 103 preferably have larger curvature than the corners of the display portion 101.

When the curvature of the corners is large, a region of the display portion 101 that is visible for the viewer gets narrower; accordingly, the curvature is preferably set such that a straight portion is included in a side of the inner frame of the frame portion 103 as illustrated in FIG. 6D and further preferably the curvature is set such that a straight portion is included in each side of the inner frame of the frame portion 103 as illustrated in FIG. 6E.

For example, a frame portion in which the curvature of the corner of the inner frame is variable can be achieved with the use of an elastic material such as rubber. For example, by adjusting the inner frame of the frame portion to any of the shapes illustrated in FIGS. 6C to 6E depending on an image displayed on the display portion, a change of the intensity of a stereoscopic effect or a sense of depth without intent can be suppressed or the intensity of a stereoscopic effect or a sense of depth can be changed intentionally.

Figure 6F:
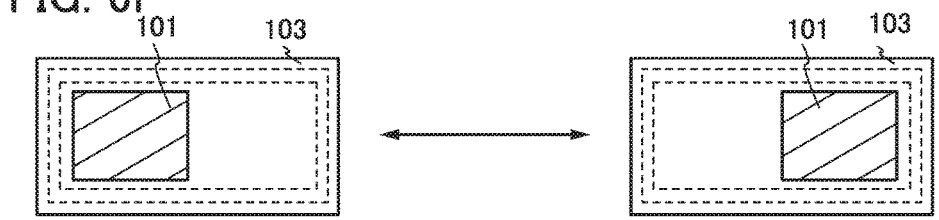
Figure 6G:
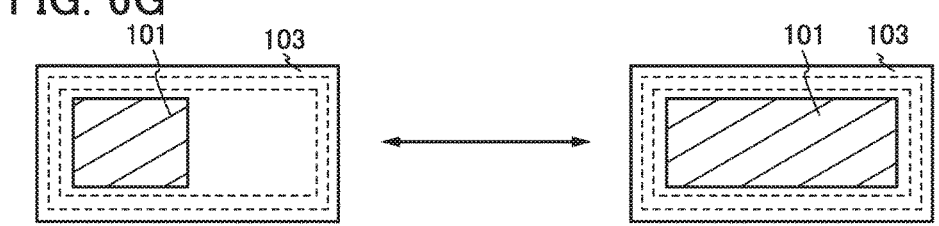

The position of the opening of the frame portion 103 may be moved as illustrated in FIG. 6F. The size of the opening of the frame portion 103 may be variable as illustrated in FIG. 6G. For example, by adjusting the size or the position of the opening of the frame portion depending on an image displayed on the display portion, a change of the intensity of a stereoscopic effect or a sense of depth without intent can be suppressed or the intensity of a stereoscopic effect or a sense of depth can be changed intentionally.

Figure 7A:
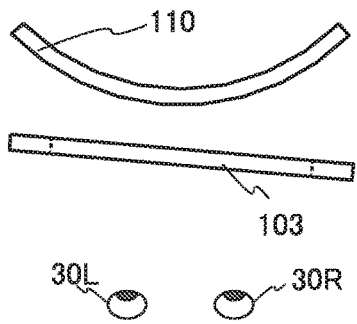
FIGS. 7A to 7D illustrate examples of a display device.
Figure 7B:
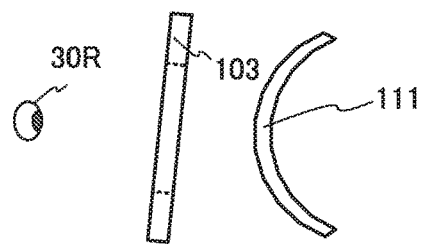

According to one embodiment of the present invention, the frame portion is not necessarily parallel to the display surface. For example, FIG. 7A illustrates the case where a distance between the frame portion 103 and the display portion 101 is wider at the right end than at the left end of the display portion, and FIG. 7B illustrates the case where the distance between the frame portion 103 and the display portion 101 is wider at the lower end than at the upper end of the display portion. In some favorable cases, a viewer can feel a stronger stereoscopic effect or sense of depth in a two-dimensional image when the frame portion 103 has an inclination with respect to the display surface.

Furthermore, the display device of one embodiment of the present invention has a frame portion, whereby glare of external light to the display portion can be suppressed. By suppressing glare of external light, not only color reproducibility of display is enhanced but also the viewer can feel a strong stereoscopic effect or sense of depth in a two-dimensional image.

Figure 7C:
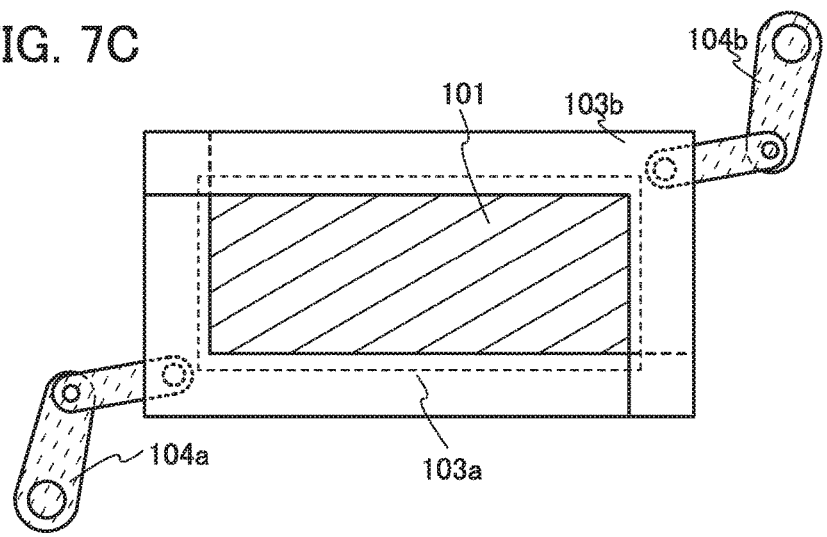
Figure 7D:
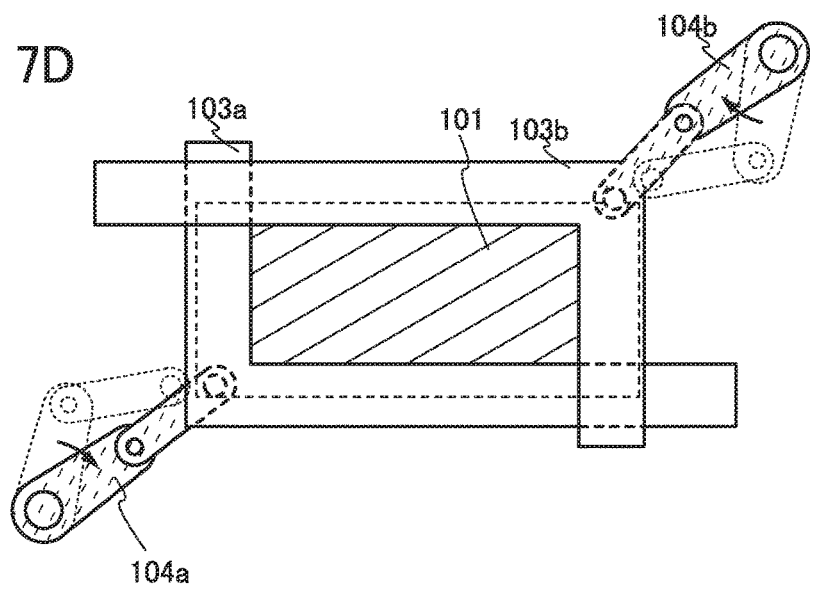

FIGS. 7C and 7D illustrate a display device of one embodiment of the present invention.

A display device illustrated in FIGS. 7C and 7D includes a frame portion and the display portion 101 having a curved surface. The frame portion includes a first frame portion 103a and a second frame portion 103b. The display portion 101 overlaps with an opening surrounded by the first frame portion 103a and the second frame portion 103b and end portions of the display portion 101 overlap with the first frame portion 103a and the second frame portion 103b.

The first frame portion 103a and the second frame portion 103b are moved by driver portions 104a and 104b so that the size of the inner frame of the frame portion can be changed.

Display devices of another embodiment of the present invention will be described with reference to FIGS. 25A to 25D and FIGS. 26A to 26E. A display device according to the embodiment of the present invention includes a frame portion, a light-transmitting layer, and a display portion. The light-transmitting layer includes a viewing surface and a convex surface opposite to each other. The refractive index of the light-transmitting layer is higher than that of the air. The display portion includes an end portion overlapping with the frame portion with the light-transmitting layer provided therebetween and includes a portion overlapping with an opening of the frame portion and the light-transmitting layer. In the display portion, a plurality of display elements capable of displaying an image toward the viewing surface are provided along the convex surface.

A display surface of the display portion is in contact with the convex surface of the light-transmitting layer in the display device according to the embodiment of the present invention. As an example of a shape of the light-transmitting layer, a column with a bottom surface whose boundary consists of a curved line (a cylinder with a perfect circle-shaped bottom surface, an elliptic cylinder with an ellipse-shaped bottom surface, or the like), or a column with a bottom surface whose boundary consists of a curved line and a straight line (a column with a semi cylindrical-shaped bottom surface, a semi elliptical cylindrical-shaped bottom surface, or the like) can be given. If a shape of the light-transmitting layer is any of such columns, the convex surface corresponds to a curved surface of the column, and the viewing surface corresponds to a surface opposite to the curved surface of the column. The viewing surface may be a flat surface or a curved surface (a concave surface or a convex surface) or may partly have a curved surface (a convex portion or a concave portion).

The frame portion may be partly in contact with the display portion. Alternatively, the frame portion may be partly in contact with the light-transmitting layer.

In the display device of any of the above structures, when a viewer sees a display portion from a viewing surface side, a virtual image is formed neither on the viewing surface of the display device nor on the display surface of the display portion but is formed in the light-transmitting layer because the refractive index of the light-transmitting layer is higher than that of the air. Accordingly, a misinterpretation by viewer's brain is caused and a stereoscopic effect or sense of depth to an image is increased. In addition, since the display elements are provided along the convex surface, the position of a virtual image formed in the display device in the thickness direction differs between an edge portion and a central portion of the viewing surface of the display device. This gives a further increased stereoscopic effect or sense of depth to an image. That is, the display device of the embodiment of the present invention includes both the light-transmitting layer and the frame portion, whereby the viewer has an optical illusion that the position of the display portion is different from actual one, stereoscopic information is corrected by brain, and thus the viewer can feel a strong stereoscopic effect or sense of depth in a two-dimensional image.

Figure 25A:
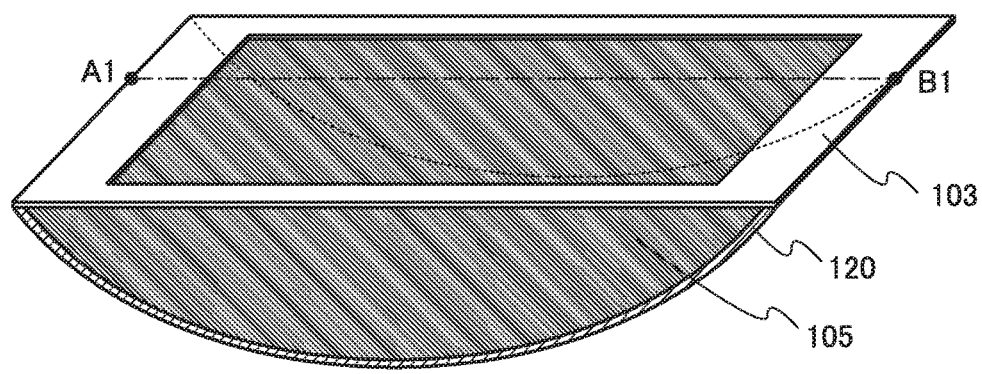
FIGS. 25A to 25D illustrate an example of a display device.
Figure 25B:
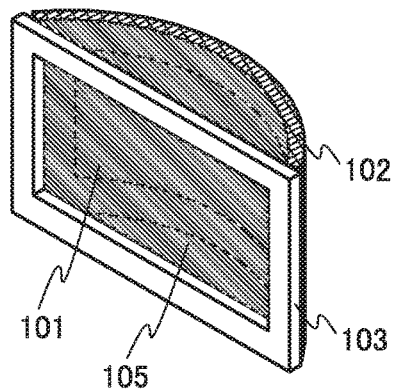
Figure 25C:
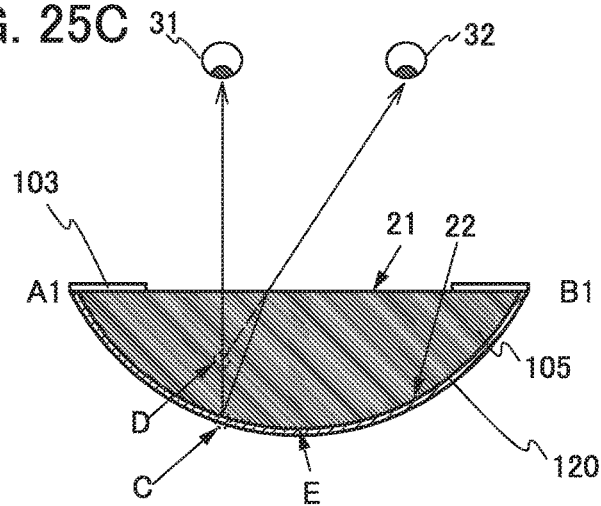
Figure 25D:
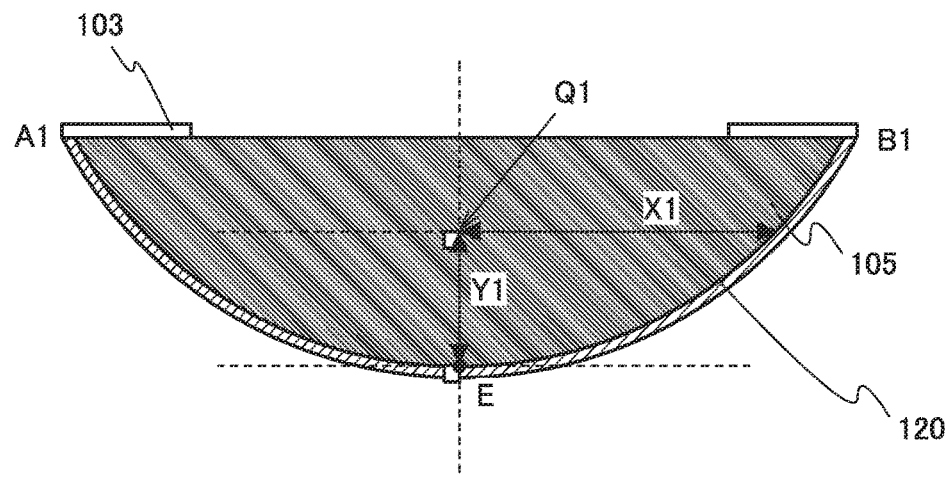

FIGS. 25A and 25B are perspective views of a display device 116, and FIGS. 25C and 25D are cross-sectional views taken along dashed-dotted line A1-B1 in FIG. 25A. The display device 116 in FIGS. 25A to 25D includes the frame portion 103, the light-transmitting layer 105, and a display panel 120. The display panel 120 includes a display portion 101 and a non-display portion 102 as illustrated in FIG. 25B.

In the display device 116, a viewing surface 21 of the light-transmitting layer 105 is a flat surface. Specifically, the viewing surface 21 is a plane that intersects the display panel 120 or the display portion 101 at at least three points. Furthermore, the viewing surface 21 is a plane that intersects a convex surface 22 at at least three points.

Light delivered from a point C on the display surface of the display panel 120 to viewer's eye 31 enters the interface between the light-transmitting layer 105 and the atmosphere perpendicularly and therefore travels straight. In contrast, light delivered from the point C to viewer's eye 32 enters the interface between the light-transmitting layer 105 and the atmosphere at an angle and therefore refracts at the interface. This refraction of light causes a virtual image to be formed at a position D that is neither on the display surface of the display panel 120 (here, a surface in contact with the convex surface 22) nor on a viewing surface of the display device 116 (here corresponding to the viewing surface 21 of the light-transmitting layer 105). The viewer sees this virtual image; thus, the display device 116 gives a sense of depth or a stereoscopic effect to an image.

In the display portion 101, a plurality of display elements capable of displaying an image toward the viewing surface 21 are provided along the convex surface 22.

Therefore, the position of a virtual image formed in the display device 116 in the thickness direction differs between an edge portion and a central portion of the viewing surface of the display device. This gives a further increased sense of depth or stereoscopic effect to an image.

In the display device 116, the display portion 101 preferably includes a first display element which satisfies the following conditions. Specifically, Y/X is greater than or equal to 0.1 and less than or equal to 1, preferably greater than or equal to 0.15 and less than or equal to 0.6, further preferably greater than or equal to 0.2 and less than or equal to 0.4, where X is a distance between the first display element and an intersection Q of a perpendicular line drawn to an outermost point E on the convex surface 22 with a plane intersecting the perpendicular line orthogonally and passing through the first display element, and Y is a distance between the intersection Q and the outermost point E.

In the display device including the first display element, a larger difference in the position of a virtual image formed in the display device 116 in the thickness direction is made between the edge portion and the central portion of the viewing surface of the display device. Thus, the display device including the first display element is preferable because it is effective in increasing the sense of depth or stereoscopic effect in an image.

In one example of a structure, as illustrated in FIG. 25D, Y1/X1 is greater than or equal to 0.1 and less than or equal to 1, preferably greater than or equal to 0.15 and less than or equal to 0.6, further preferably greater than or equal to 0.2 and less than or equal to 0.4, where X1 is a distance between a given display element and an intersection Q1 of a perpendicular line drawn to an outermost point E on the convex surface 22 with a plane intersecting the perpendicular line orthogonally and passing through the display element, and Y1 is a distance between the intersection Q1 and the outermost point E. For example, the display element may be located in an edge portion of the display portion.

It is preferable that the display device do not include a display element that makes the above value of Y/X greater than 1. If a display element of the display device makes the value of Y/X greater than 1, the thickness of the display device increases, which makes it difficult to reduce the thickness of the display device or an electronic device including the display device. In addition, the durability of the display element (a display unit or a display region including the display element) might be lowered.

Although the viewing surface of the display device 116 is quadrangular, the viewing surface may be in the shape of a polygon, a circle, an ellipse, or the like and is not particularly limited.

Figure 26A:
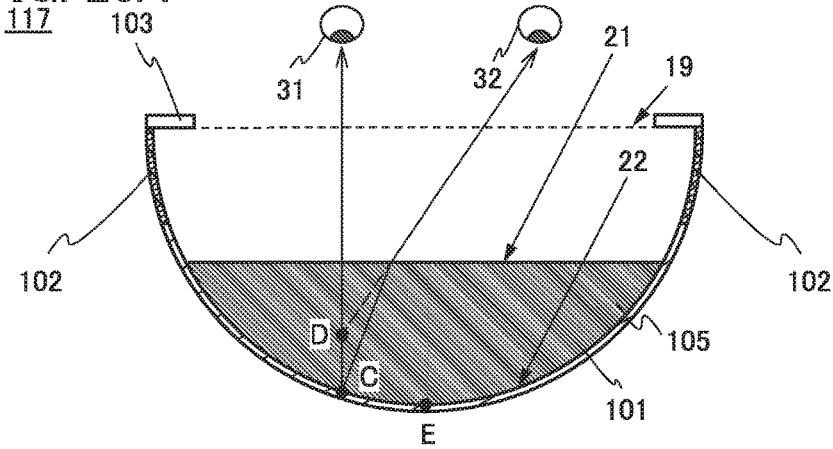
FIGS. 26A to 26E illustrate an example of a display device.

In the display device, it is preferable that at least part of the display surface of the display portion 101 be in contact with the convex surface of the light-transmitting layer 105. For example, as in the display device 116 in FIG. 25B or the like, the whole display surface of the display portion 101 may be in contact with the convex surface of the light-transmitting layer 105. As another example, a display device 117 is illustrated in FIG. 26A. In the display device 117, part of the display surface of the display portion 101 is not in contact with the light-transmitting layer 105. Note that the embodiment of the present invention is not limited to these structures and the viewing surface of the light-transmitting layer 105 does not necessarily intersect the display portion 101 at three points. For example, the viewing surface of the light-transmitting layer 105 may be a plane 19 that intersects the non-display portion 102 at at least three points as illustrated in FIG. 26A. Furthermore, the viewing surface is not necessarily a flat surface.

Note that a hard coat film, an anti-reflection film, a touch panel, or the like may be provided on the viewing surface 21 of the light-transmitting layer 105. The hard coat film has hardness higher than that of at least the light-transmitting layer 105, and an inorganic insulating film such as a silicon nitride film can be used, for example. As the anti-reflection film, a film having surface irregularities at a regular pitch of approximately several hundred nanometers, such as a moth-eye structure, can be used, for example. As the touch panel, any of various types such as a capacitive type, a resistive type, a surface acoustic wave type, an infrared ray type, and an optical type can be used.

Figure 26B:
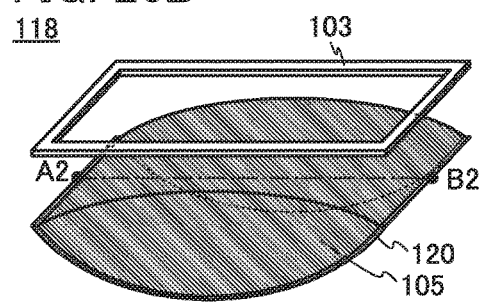
Figure 26C:
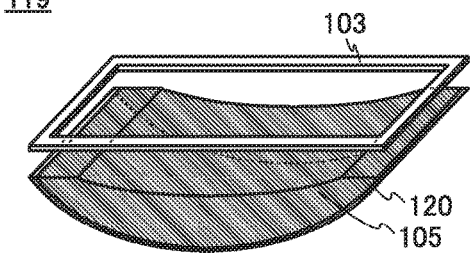
Figure 26D:
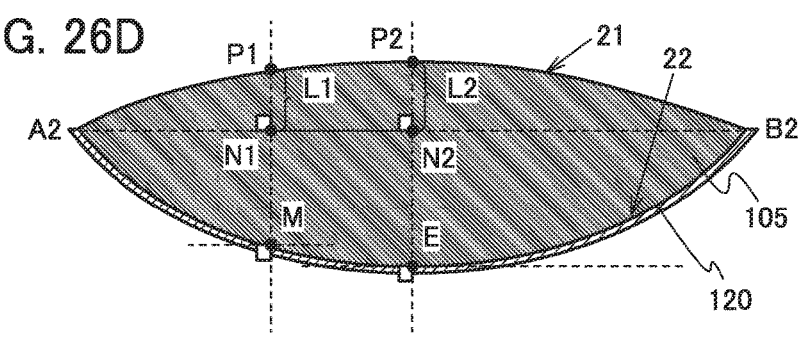
Figure 26E:
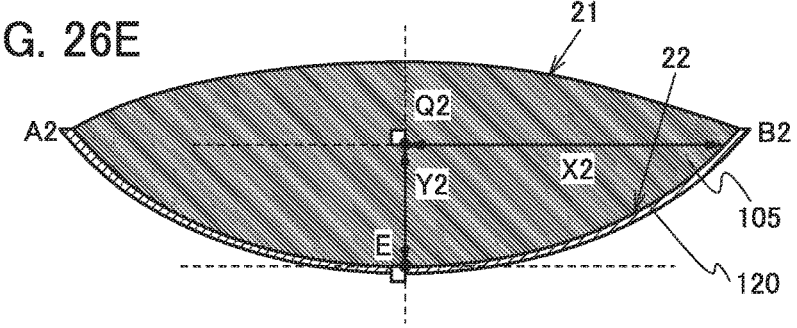
Figure 27A:
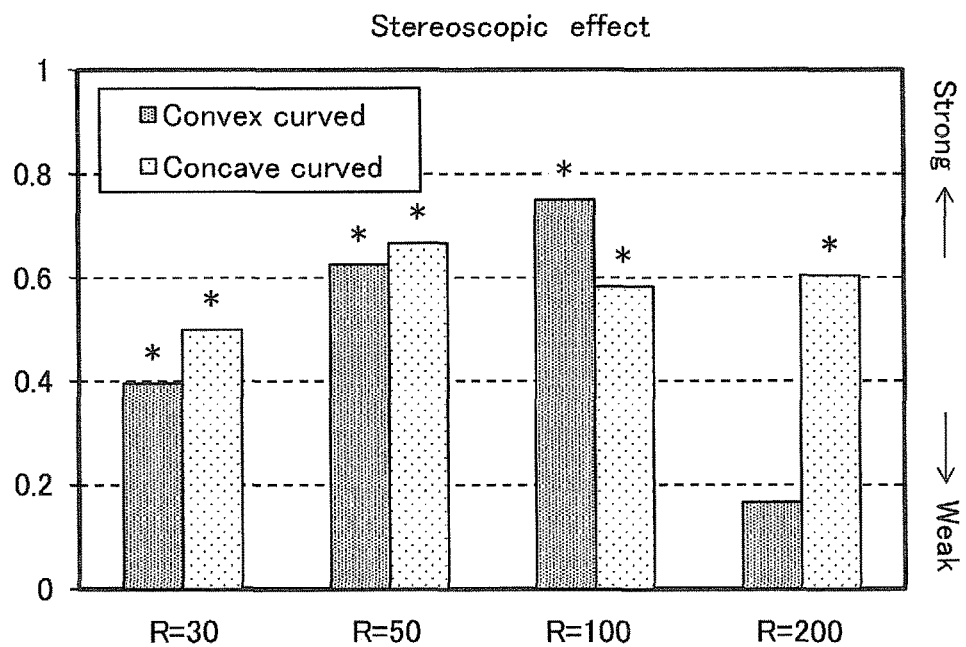
FIGS. 27A and 27B show results in Example 3.
Figure 27B:
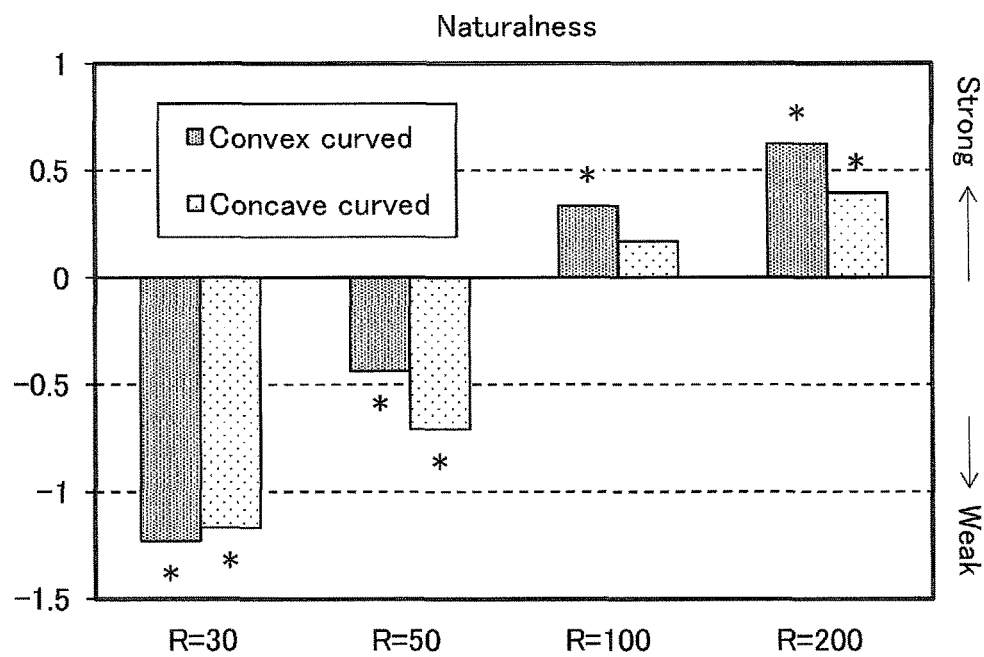
Figure 28A:
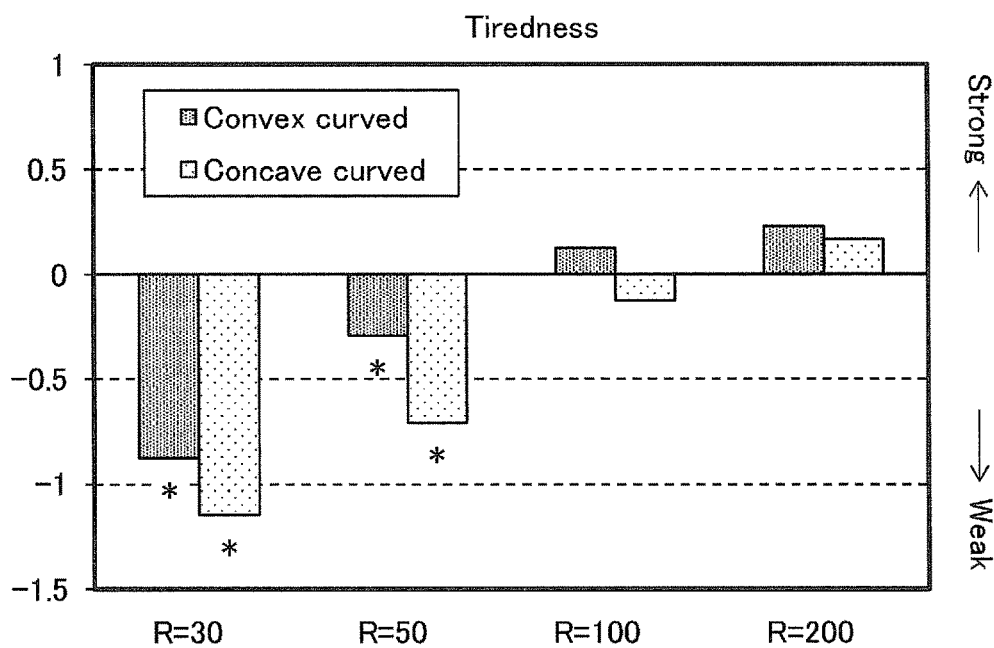
FIGS. 28A and 28B show results in Example 3.
Figure 28B:
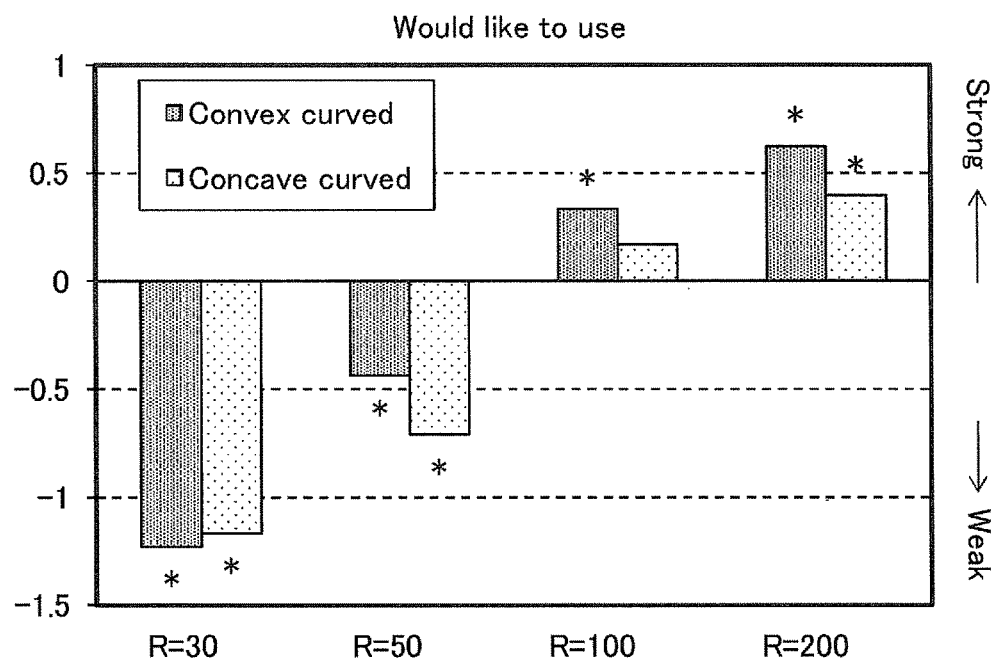

FIG. 26B is a perspective view of a display device 118. FIG. 26C is a perspective view of a display device 119. FIGS. 26D and 26E are cross-sectional views taken along dashed-dotted line A2-B2 in FIG. 26B. The display device 118 and the display device 119 each include the frame portion 103, the light-transmitting layer 105, and the display panel 120.

In the display device 118, the viewing surface 21 of the light-transmitting layer 105 is a curved surface. In the display device 119, part of the viewing surface 21 of the light-transmitting layer 105 is a curved surface.

Specifically, the viewing surface 21 of the display device 118 or 119 satisfies the following conditions. That is, a distance between a point N and a point P where the point N is a foot of a perpendicular line drawn from a point M on the convex surface 22 to a plane intersecting the display portion 101 (or the convex surface 22) at at least three points (or passing through a boundary line between the convex surface 22 and the viewing surface 21), and the point P is an intersection of the perpendicular line with the viewing surface 21 is largest when the point M is at the outermost point E. FIG. 26D illustrates an example in which a distance L2 between a foot N2 of a perpendicular line drawn from an outermost point E and an intersection P2 of the perpendicular line with the viewing surface 21 is larger than a distance L1 between a foot N1 of a perpendicular line drawn from a point M on the convex surface 22 and an intersection P1 of the perpendicular line with the viewing surface 21.

Also in a display device having such a structure, a virtual image can be formed at a position that is neither on a display surface of the display portion 101 nor on a viewing surface of the display device. A viewer sees this virtual image; thus, the display device gives a sense of depth or a stereoscopic effect to an image.

In the display portion 101, a plurality of display elements capable of displaying an image toward the viewing surface 21 are provided along the convex surface 22. Therefore, the position of a virtual image formed in the display device in the thickness direction differs between an edge portion and a central portion of the viewing surface of the display device. This gives a further increased sense of depth or stereoscopic effect to an image.

In the display device 118 or 119, the display portion 101 preferably includes a first display element which satisfies the conditions given above.

In one example of a structure, as illustrated in FIG. 26E, Y2/X2 is greater than or equal to 0.1 and less than or equal to 1, preferably greater than or equal to 0.15 and less than or equal to 0.6, further preferably greater than or equal to 0.2 and less than or equal to 0.4, where X2 is a distance between a given display element and an intersection Q2 of a perpendicular line drawn to an outermost point E on the convex surface 22 with a plane intersecting the perpendicular line orthogonally and passing through the display element, and Y2 is a distance between the intersection Q2 and the outermost point E.

The light-transmitting layer is formed using a material having a light-transmitting property and having a refractive index higher than that of the atmosphere. For example, an organic resin such as a resin which is curable at room temperature (e.g., a two-component type resin), a light-curable resin, or a heat-curable resin can be used.

For example, an organic resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin can be used. Furthermore, a drying agent may be contained in the organic resin.

For the light-transmitting layer, a material having a light-transmitting property and a high refractive index is preferably used. For example, a material having a refractive index higher than or equal to 1.6, preferably higher than or equal to 1.7 and less than or equal to 2.1 is used. Examples of the material having a high refractive index include a resin containing bromine, a resin containing sulfur, and the like. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used.

Note that the state of the light-transmitting layer is not particularly limited and may be solid (including a gel or the like) or liquid (including a sol or the like).

Note that the light-transmitting layer may be detachable in the display device of the embodiment of the present invention. In the case where the display panel is flexible, the display panel can be transformed to fit the light-transmitting layer used. Thus, by selecting and using one of a plurality of light-transmitting layers having different shapes, for example, the degree of the sense of depth or stereoscopic effect provided by one display device can be adjusted for every use.

<Display Portion>

The display device of one embodiment of the present invention may include at least a display portion capable of displaying an image in a plane. Note that an image in this specification may be either a still image or a moving image.

The display portion is not particularly limited as long as having a curved surface. The display portion is preferably flexible, in which case the shape, curvature, or the like of the curved surface can be made variable.

For example, as the display portion, sheet-like or plate-like members of paper, cloth, a resin film, wood, and the like on which various images such as a picture, a painting, and an illustration are displayed can be given.

The display portion may include a display element. As an example of the display portion or a display element of the display portion, an EL element (e.g., an EL element including organic and inorganic materials, an organic EL element, or an inorganic EL element), an LED (e.g., a white LED, a red LED, a green LED, or a blue LED), a transistor (a transistor which emits light in accordance with current), an electron emitter, a liquid crystal element, electronic ink, an electrophoretic element, or the like can be given . As an example of a display portion having an EL element, an EL display or the like can be given. As an example of a display portion including a liquid crystal element, a liquid crystal display (e.g., a transmissive liquid crystal display, a semi-transmissive liquid crystal display, a reflective liquid crystal display, a direct-view liquid crystal display, a projection liquid crystal display), or the like can be given. As an example of a display portion including electronic ink or electrophoretic element, electronic paper or the like can be given.

Note that when the display portion is an organic EL display, a viewer tends to feel a strong stereoscopic effect or sense of depth in a two-dimensional image as compared with a liquid crystal display. Therefore, in one embodiment of the present invention, an organic EL display, in particular, a flexible organic EL display is preferably used for the display portion.

Alternatively, the display portion may be a screen on which an image is projected by a projection device.

Note that the non-display portion included in the display device of one embodiment of the present invention may include a driver circuit of a display element or a light-emitting element, or a sealing region, for example.

<Frame Portion>

The opening of the frame portion may have at least a light-transmitting property that allows a viewer to see display in the display portion, or the opening may also be a space. Alternatively, a plate, a film, or the like made of a material transmitting visible light, such as glass or resin, may overlap with the display portion.

Display that can be viewed through a frame portion is unclear as compared with display that can be viewed through an opening of the frame portion. The frame portion may be formed using a light-transmitting material such as ground glass or frosted glass. The frame portion may have a light-blocking property that makes a viewer difficult to see the display portion through the frame portion or may be formed using a material that does not transmit visible light.

There is no particular limitation on the material used for the frame portion. For example, a material such as glass, quartz, ceramics, sapphire, metal, an organic resin, paper, or wood can be used. The frame portion is preferably formed using a flexible material, in which case the frame portion can be bent.

There is no particular limitation on the color of the frame portion. For example, the frame portion may be black, white, blue, green, red, or the like. Black is preferable to enhance a viewer's sense of immersion in display content.

The display portion of the display device of one embodiment of the present invention or the display device of one embodiment of the present invention may be an electronic device such as television sets (also called TV or television receivers); monitors for computers or the like; digital photo frames; mobile phones (also called cellular phones or portable telephones); portable game machines; portable information terminals; audio playback devices; or large game machines such as pachinko machines. That is, according to one embodiment of the present invention, a frame portion may be added to an electronic device (corresponding to the display portion), or the frame portion may be included in an electronic device (corresponding to the display device).

Alternatively, the above electronic device may include the display device of one embodiment of the present invention.

The display device of one embodiment of the present invention can be used in an amusement park (e.g., a game center, a theme park, or the like), a theater, a cinema, or the like. For example, in accordance with the content of attraction, a viewer can feel a strong stereoscopic effect or sense of depth in a two-dimensional image in such a manner that the frame portion is transformed, or the degree of a curvature or an inclination of the frame portion or the shape or the size of the opening of the frame portion is changed.

As described above, in the display device of one embodiment of the present invention, a viewer can feel a strong stereoscopic effect or sense of depth in a two-dimensional image with a display portion having a curved surface. In addition, in the display device of one embodiment of the present invention, a viewer can feel a strong stereoscopic effect or sense of depth in a two-dimensional image with a frame portion between the viewer and the display portion. Moreover, in the display device of one embodiment of the present invention, a viewer can feel a strong stereoscopic effect or sense of depth in a two-dimensional image without variation among individuals or regardless of display content because the degree of a curvature of the display portion, the degree of a curvature or an inclination of the frame portion, or the shape or the size of an opening of the frame portion can be changed. Fatigue that a viewer feels can be reduced as compared with the case where a display portion which is not suitable for a viewer is used because the degree of a curvature can be adjusted by the viewer or the display device so that curvature suitable for the viewer can be obtained. Furthermore, as compared with the case where a frame portion which is not suitable for the viewer is provided between the viewer and a display portion, fatigue that the viewer feels can be reduced in such a manner that a frame portion in which the degree of a curvature or an inclination or the shape or the size of an opening is suitable for the viewer is provided between the viewer and the display portion.

Note that the display device of one embodiment of the present invention is one mode of an eye-friendly display device which is less likely to strain eyes. For the display device of one embodiment of the present invention, technologies of displaying images with less eyestrain (also referred to as a reducing eyestrain technology (REST)) are employed.

This embodiment can be combined with any of the other embodiments as appropriate.

[Embodiment 2]

In this embodiment, an example of a display panel that can be used for a display portion of the display device of the above embodiment of the present invention will be described. Although a flexible light-emitting device including an organic EL element will be shown as an example of a display panel in this embodiment, one embodiment of the present invention is not limited thereto.

<Structure Example 1-1>

Figure 9A:
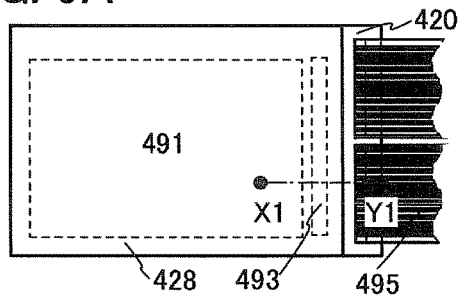
FIGS. 9A to 9C illustrate examples of a display panel.
Figure 9B:
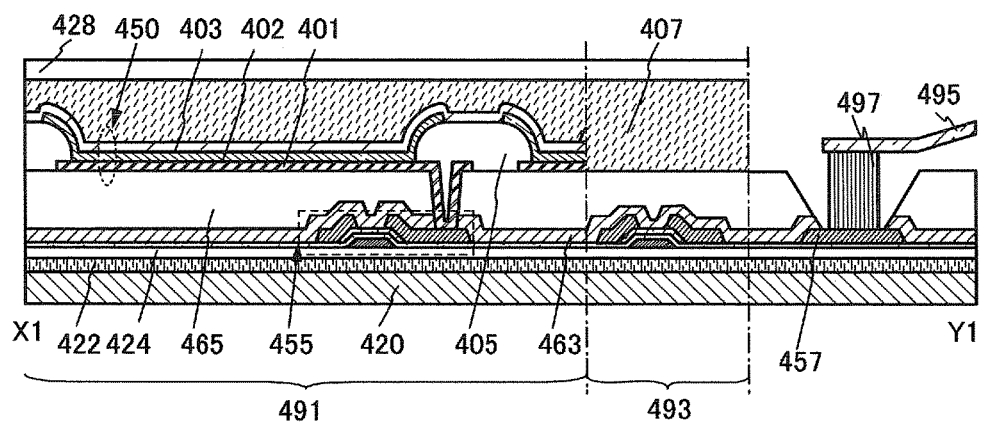

FIG. 9A is a plan view of the light-emitting device, and FIG. 9B is a cross-sectional view taken along dashed-dotted line X1-Y1 in FIG. 9A. The light-emitting device illustrated in FIG. 9B is a top-emission light-emitting device using a separate coloring method.

The light-emitting device in FIG. 9A includes a light-emitting portion 491, a driver circuit portion 493, and a flexible printed circuit (FPC) 495. An organic EL element and transistors included in the light-emitting portion 491 and the driver circuit portion 493 are sealed with a flexible substrate 420, a flexible substrate 428, and a bonding layer 407.

The light-emitting device in FIG. 9B includes the flexible substrate 420, a bonding layer 422, an insulating layer 424, a transistor 455, an insulating layer 463, an insulating layer 465, an insulating layer 405, an organic EL element 450 (a lower electrode 401, an EL layer 402, and an upper electrode 403), the bonding layer 407, the flexible substrate 428, and a conductive layer 457. The flexible substrate 428, the bonding layer 407, and the upper electrode 403 transmit visible light.

In the light-emitting portion 491 of the light-emitting device in FIG. 9B, the transistor 455 and the organic EL element 450 are provided over the flexible substrate 420 with the bonding layer 422 and the insulating layer 424 provided therebetween.

The organic EL element 450 includes the lower electrode 401 over the insulating layer 465, the EL layer 402 over the lower electrode 401, and the upper electrode 403 over the EL layer 402. The lower electrode 401 is electrically connected to a source electrode or a drain electrode of the transistor 455. It is preferable that the lower electrode 401 reflect visible light. The end portion of the lower electrode 401 is covered with the insulating layer 405.

The driver circuit portion 493 includes a plurality of transistors. In FIG. 9B, one of the transistors included in the driver circuit portion 493 is illustrated.

The conductive layer 457 is electrically connected to an external input terminal through which a signal (e.g., a video signal, a clock signal, a start signal, a reset signal, or the like) or a potential from the outside is transmitted to the driver circuit portion 493. Here, an example in which the FPC 495 is provided as the external input terminal is described.

To prevent an increase in the number of manufacturing steps, the conductive layer 457 is preferably formed using the same material and the same step(s) as those of the electrode or the wiring in the light-emitting portion or the driver circuit portion. Here, an example is described in which the conductive layer 457 is formed using the same material and the same step(s) as those of the source electrode and the drain electrode of the transistor.

The insulating layer 463 has an effect of suppressing diffusion of impurities into a semiconductor included in the transistor. As the insulating layer 465, an insulating film having a planarization function is preferably selected in order to reduce surface unevenness due to the transistor.
<Structure Example 1-2>

Figure 9C:
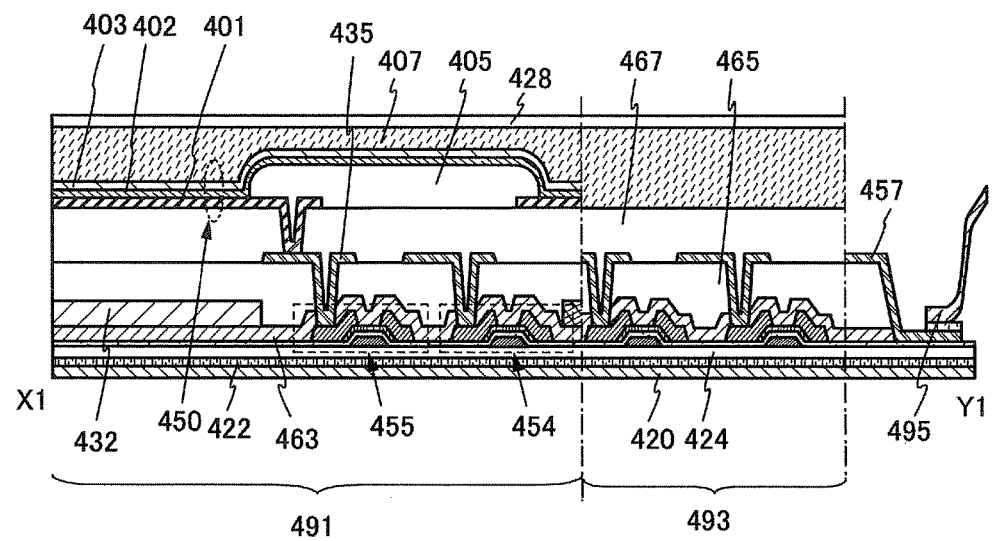

FIG. 9A is a plan view of the light-emitting device, and FIG. 9C is a cross-sectional view taken along dashed-dotted line X1-Y1 in FIG. 9A. The light-emitting device illustrated in FIG. 9C is a bottom-emission light-emitting device using a color filter method.

The light-emitting device in FIG. 9C includes the flexible substrate 420, the bonding layer 422, the insulating layer 424, a transistor 454, the transistor 455, the insulating layer 463, a coloring layer 432, the insulating layer 465, a conductive layer 435, an insulating layer 467, the insulating layer 405, the organic EL element 450 (the lower electrode 401, the EL layer 402, and the upper electrode 403), the bonding layer 407, the flexible substrate 428, and the conductive layer 457. The flexible substrate 420, the bonding layer 422, the insulating layer 424, the insulating layer 463, the insulating layer 465, the insulating layer 467, and the lower electrode 401 transmit visible light.

In the light-emitting portion 491 of the light-emitting device in FIG. 9C, the switching transistor 454, the current control transistor 455, and the organic EL element 450 are provided over the flexible substrate 420 with the bonding layer 422 and the insulating layer 424 provided therebetween. The organic EL element 450 includes the lower electrode 401 over the insulating layer 467, the EL layer 402 over the lower electrode 401, and the upper electrode 403 over the EL layer 402. The lower electrode 401 is electrically connected to the source electrode or the drain electrode of the transistor 455 with the conductive layer 435 provided therebetween. The end portion of the lower electrode 401 is covered with the insulating layer 405. It is preferable that the upper electrode 403 reflect visible light. Moreover, the light-emitting device includes the coloring layer 432 over the insulating layer 463, with which the organic EL element 450 overlaps.

The driver circuit portion 493 includes a plurality of transistors. In FIG. 9C, two of the transistors included in the driver circuit portion 493 are illustrated.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the conductive layer 435 is described.

The insulating layer 463 has an effect of suppressing diffusion of impurities into a semiconductor included in the transistor. As the insulating layer 465 and the insulating layer 467, an insulating film having a planarization function is preferably selected in order to reduce surface unevenness due to the transistors and the wirings.
<Structure Example 1-3>

Figure 10A:
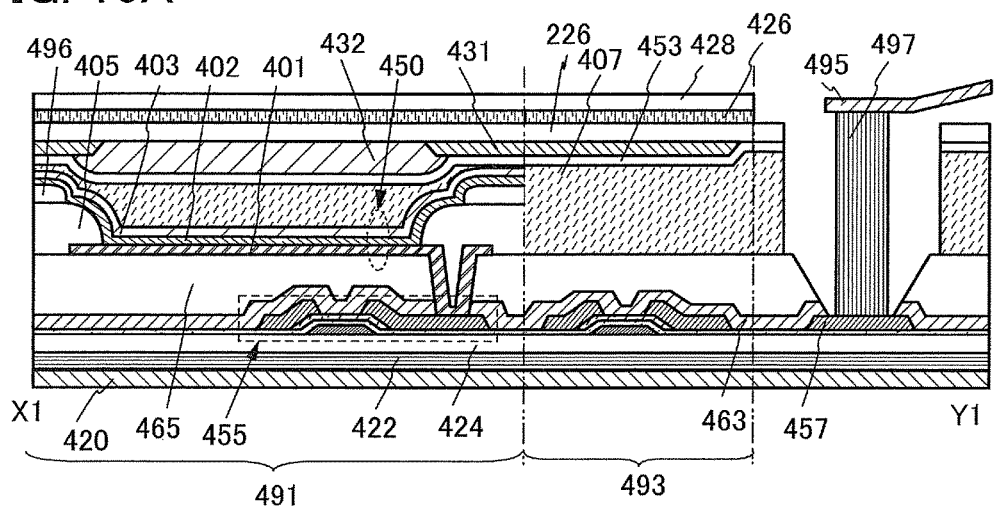
FIGS. 10A and 10B illustrate examples of a display panel.

FIG. 9A is a plan view of the light-emitting device, and FIG. 10A is a cross-sectional view taken along dashed-dotted line X1-Y1 in FIG. 9A. The light-emitting device illustrated in FIG. 10A is a top-emission light-emitting device using a color filter method.

The light-emitting device in FIG. 10A includes the flexible substrate 420, the bonding layer 422, the insulating layer 424, the transistor 455, the insulating layer 463, the insulating layer 465, the insulating layer 405, an insulating layer 496, the organic EL element 450 (the lower electrode 401, the EL layer 402, and the upper electrode 403), the bonding layer 407, a light-blocking layer 431, the coloring layer 432, an overcoat 453, an insulating layer 226, a bonding layer 426, the flexible substrate 428, and the conductive layer 457. The flexible substrate 428, the bonding layer 426, the insulating layer 226, the bonding layer 407, and the upper electrode 403 transmit visible light.

In the light-emitting portion 491 of the light-emitting device in FIG. 10A, the transistor 455 and the organic EL element 450 are provided over the flexible substrate 420 with the bonding layer 422 and the insulating layer 424 provided therebetween. The organic EL element 450 includes the lower electrode 401 over the insulating layer 465, the EL layer 402 over the lower electrode 401, and the upper electrode 403 over the EL layer 402. The lower electrode 401 is electrically connected to the source electrode or the drain electrode of the transistor 455. The end portion of the lower electrode 401 is covered with the insulating layer 405. The insulating layer 496 is provided over the insulating layer 405. The space between the flexible substrate 420 and the flexible substrate 428 can be adjusted with the insulating layer 496. It is preferable that the lower electrode 401 reflect visible light. Moreover, the light-emitting device includes the coloring layer 432 overlapping with the organic EL element 450 with the bonding layer 407 provided therebetween, and the light-blocking layer 431 overlapping with the insulating layer 405 with the bonding layer 407 provided therebetween.

The driver circuit portion 493 includes a plurality of transistors. In FIG. 10A, one of the transistors included in the driver circuit portion 493 is illustrated.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the source electrode and the drain electrode of the transistor 455 is described. A connector 497 over the insulating layer 226 is connected to the conductive layer 457 through an opening provided in the insulating layer 226, the overcoat 453, the bonding layer 407, the insulating layer 465, and the insulating layer 463. Moreover, the connector 497 is connected to the FPC 495. The FPC 495 and the conductive layer 457 are electrically connected to each other with the connector 497 provided therebetween.

<Structure Example 1-4>

Figure 10B:
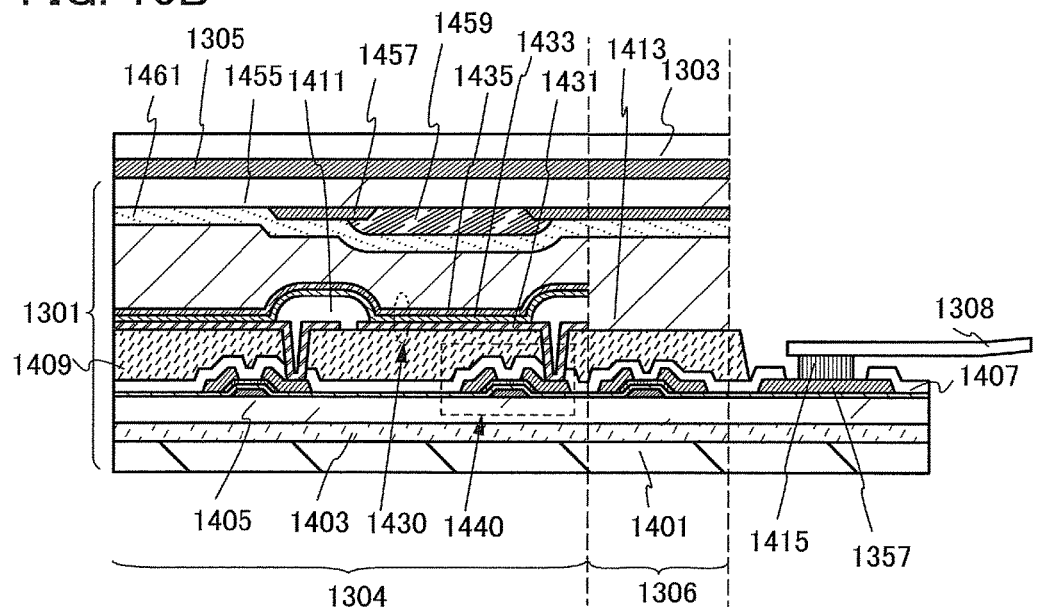
Figure 11A:
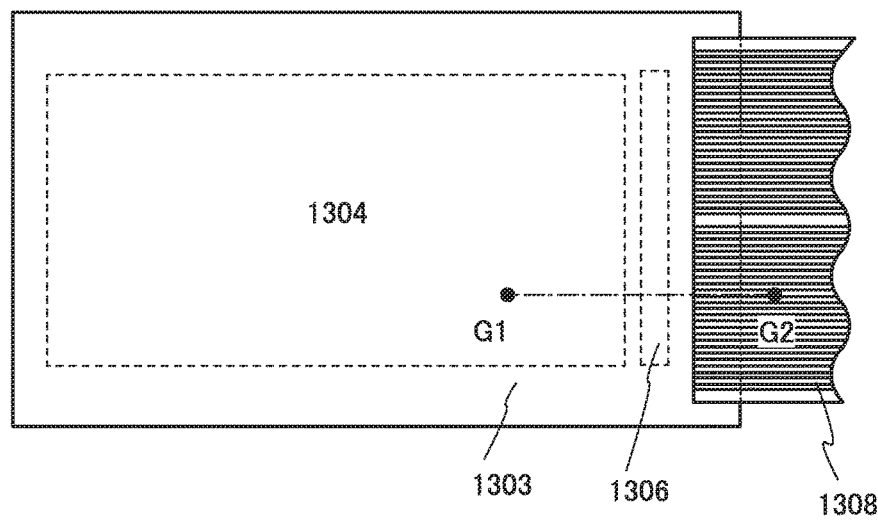
FIGS. 11A and 11B illustrate an example of a display panel.
Figure 11B:
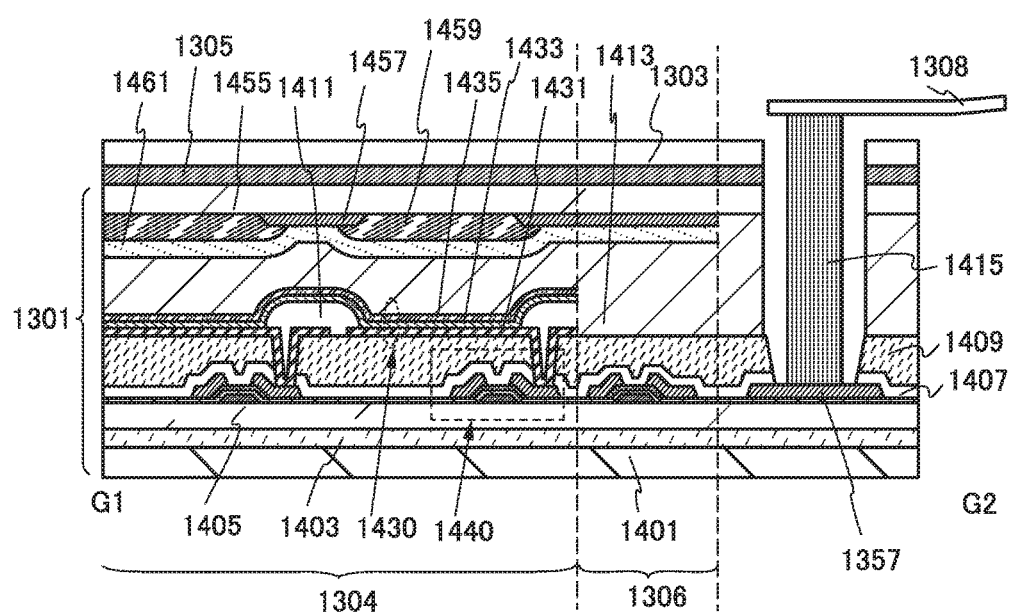

FIG. 11A is a plan view of the light-emitting device, and FIG. 11B is a cross-sectional view taken along dashed-dotted line G1-G2 in FIG. 11A. FIG. 10B illustrates a cross-sectional view of a modification example of the light-emitting device.

The light-emitting devices illustrated in FIG. 10B and 11B each include an element layer 1301, a bonding layer 1305, and a flexible substrate 1303. The element layer 1301 includes a flexible substrate 1401, a bonding layer 1403, an insulating layer 1405, a plurality of transistors, a conductive layer 1357, an insulating layer 1407, an insulating layer 1409, a plurality of light-emitting elements, an insulating layer 1411, a bonding layer 1413, an overcoat 1461, a light-blocking layer 1457, and an insulating layer 1455.

FIG. 11B illustrates an example in which each light-emitting element overlaps with a coloring layer 1459. The coloring layer 1459 is provided to overlap with a light-emitting element 1430, and the light-blocking layer 1457 is provided to overlap with the insulating layer 1411. The coloring layer 1459 and the light-blocking layer 1457 are covered with the overcoat 1461. The space between the light-emitting element 1430 and the overcoat 1461 is filled with the bonding layer 1413. Note that the coloring layers may be provided so as to overlap with all light-emitting elements, or the coloring layer may be provided so as to overlap with part of the light-emitting elements as illustrated in FIG. 10B. For example, in the case where one pixel includes four sub-pixels which are red, blue, green, and white sub-pixels, the coloring layer is not necessarily provided in the white sub-pixel. Accordingly, the amount of light absorbed by the coloring layer can be reduced, and thus, the power consumption of the light-emitting device can be reduced.

The conductive layer 1357 is electrically connected to an FPC 1308 via a connector 1415. As illustrated in FIG. 11B, in the case where the conductive layer 1357 is provided between the flexible substrates 1401 and 1303, the connector 1415 may be disposed in an opening provided in the flexible substrate 1303, the bonding layer 1305, and the like. As illustrated in FIG. 10B, in the case where the conductive layer 1357 does not overlap with the flexible substrate 1303, the connector 1415 may be disposed in an opening provided in the insulating film 1407 and the insulating layer 1409 over the flexible substrate 1401.

The light-emitting element 1430 includes a lower electrode 1431, an EL layer 1433, and an upper electrode 1435. The lower electrode 1431 is electrically connected to a source electrode or a drain electrode of a transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

The light-emitting device includes a plurality of transistors in a light extraction portion 1304 and a driver circuit portion 1306. The transistor 1440 is provided over the insulating layer 1405. The insulating layer 1405 and the flexible substrate 1401 are attached to each other with the bonding layer 1403. The insulating layer 1455 and the flexible substrate 1303 are attached to each other with the bonding layer 1305. It is preferable to use insulating films with a high gas barrier property as the insulating layer 1405 and the insulating layer 1455, in which case an impurity such as moisture or oxygen can be prevented from entering the light-emitting element 1430 or the transistor 1440, leading to improved reliability of the light-emitting device.

The light-emitting device in Structure Example 1-4 can be manufactured in the following manner: the insulating layer 1405, the transistor 1440, and the light-emitting element 1430 are formed over a formation substrate with high heat resistance; the formation substrate is peeled; and the insulating layer 1405, the transistor 1440, and the light-emitting element 1430 are transferred to the flexible substrate 1401 and bonded thereto with the bonding layer 1403. The light-emitting device in Structure Example 1-4 can be manufactured in the following manner: the insulating layer 1455, the coloring layer 1459, and the light-blocking layer 1457 are formed over a formation substrate with high heat resistance; the formation substrate is peeled; and the insulating layer 1455, the coloring layer 1459, and the light-blocking layer 1457 are transferred to the flexible substrate 1303 and bonded thereto with the bonding layer 1305.

In the case where a material with high moisture permeability and low heat resistance (e.g., resin) is used for a substrate, it is not allowed to expose the substrate to high temperature in the manufacturing process. Thus, there is a limitation on conditions for forming a transistor and an insulating film over the substrate. In the manufacturing method of the light-emitting device of one embodiment of the present invention, a transistor and the like can be formed over a formation substrate with high heat resistance; thus, a highly reliable transistor and an insulating film with a sufficiently high gas barrier property can be formed. Then, these are transferred to a flexible substrate and thus a highly reliable light-emitting device can be manufactured. Thus, with one embodiment of the present invention, a thin and/or lightweight light-emitting device with high reliability can be provided. Details of the manufacturing method will be described later.

The flexible substrate 1303 and the flexible substrate 1401 are each preferably formed using a material with high toughness. In that case, a display device with high impact resistance that is less likely to be broken can be provided. For example, when the flexible substrate 1303 is an organic resin substrate and the flexible substrate 1401 is a substrate of a thin metal material or a thin alloy material, the light-emitting device can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the flexible substrate 1401, the surface temperature of the light-emitting device can be prevented from rising, leading to prevention of breakage or a decrease in reliability of the light-emitting device. For example, the flexible substrate 1401 may have a stacked-layer structure of a metal substrate and a layer with high thermal emissivity (e.g., the layer can be formed using a metal oxide or a ceramic material).

<Examples of Materials>

Next, materials and the like that can be used for a light-emitting device are described. Note that description on the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

The structure of the transistors in the light-emitting device is not particularly limited. For example, a forward staggered transistor or an inverted staggered transistor may be used. A top-gate transistor or a bottom-gate transistor may be used. A semiconductor material used for the transistors is not particularly limited; for example, silicon, germanium, an oxide semiconductor, or the like may be used.

There is no particular limitation on the state of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be particularly used, in which case deterioration of the transistor characteristics can be suppressed.

Here, a polycrystalline semiconductor is preferably used for the transistors. For example, it is preferable to use polycrystalline silicon or the like. Polycrystalline silicon can be formed at a low temperature as compared with single crystal silicon and has a high field-effect mobility and high reliability as compared with amorphous silicon. When such a polycrystalline semiconductor is used for a pixel, the aperture ratio of the pixel can be improved. In addition, even when a light-emitting device includes pixels with extremely high definition, a gate driver circuit and a source diver circuit can be formed over the same substrate as a pixel and thus the number of components constituting an electronic device can be reduced.

Alternatively, an oxide semiconductor is preferably used for the transistors. It is preferable to use, for example, an oxide semiconductor having a wider band gap than silicon. A semiconductor material having a wider band gap and a lower carrier density than silicon is preferably used because off-state leakage current of the transistor can be reduced.

The oxide semiconductor preferably contains at least indium (In) or zinc (Zn), for example. Further preferably, the transistor contains an oxide represented by an In-M-Zn-based oxide (M is a metal such as Al, Ti, Ga, Ge, Y, Zr, Sn, La, Ce, or Hf).

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, an "In—Ga—Zn-based oxide" means an oxide containing In, Ga, and Zn as its main components and there is no particular limitation on the ratio of In, Ga, and Zn. The In—Ga-Z-based oxide may contain another metal element in addition to In, Ga, and Zn.

An oxide semiconductor film is classified into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. Note that the CAAC-OS film is one of oxide semiconductor films having a plurality of c-axis aligned crystal parts. A CAAC-OS film can be referred to as an oxide semiconductor film including c-axis aligned nanocrystals (CANC).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary. Since such an oxide semiconductor does not have a grain boundary, stress that is caused by curving a flexible device which is formed by employing one embodiment of the present invention does not generate a crack in an oxide semiconductor film. Therefore, such an oxide semiconductor can be preferably used for a device which has flexibility and used in a curved state.

Moreover, the use of such a material for the semiconductor layer makes it possible to provide a highly reliable transistor in which a change in the electrical characteristics is suppressed.

Furthermore, with a low off-state current of the transistor, electric charges accumulated in a capacitor through the transistor can be held for a long period. With such a transistor employed in a pixel, a driver circuit can be stopped while luminance of an image displayed in each display region is maintained. Thus, an electronic device with extremely low power consumption can be achieved.

The light-emitting element included in the light-emitting device includes a pair of electrodes (the lower electrode 1431 and the upper electrode 1435), and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium, titanium oxide, and the like. Alternatively, the conductive film that transmits visible light and a film containing any of the above metal materials may be stacked. For example, a stacked film of silver and ITO or a stacked film of an alloy of silver and magnesium and ITO can be used.

Each of the electrodes may be formed by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode and the upper electrode, holes are injected to the EL layer from the anode side and electrons are injected to the EL layer from the cathode side. The injected electrons and holes are recombined in the EL layer, so that a light-emitting substance contained in the EL layer emits light.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be used. Each of the layers included in the EL layer 1433 can be formed by any of the following methods: an evaporation method (including a vacuum evaporation method), a transfer method, a printing method, an ink-jet method, a coating method, and the like.

The light-emitting element is preferably provided between a pair of insulating films with high gas barrier properties. Thus, an impurity such as water can be prevented from entering the light-emitting element, leading to prevention of a decrease in the reliability of the light-emitting device.

As an insulating film with a high gas barrier property, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like can be used.

For example, the permeation amount of water vapor of the insulating film with a high gas barrier property is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

A flexible material is used for the flexible substrate. For example, an organic resin or a glass material that is thin enough to have flexibility can be used. Furthermore, a material which transmits visible light is used for the substrate of the light-emitting device from which light is extracted. A metal substrate or the like may be used in the case where the flexible substrate does not necessarily transmit visible light.

An organic resin, which has a specific gravity smaller than that of glass, is preferably used for the flexible substrate, in which case the light-emitting device can be more lightweight as compared to the case where glass is used.

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferable, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

In the case where a fibrous body is contained in the material having flexibility and a light-transmitting property, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure in which this fibrous body is impregnated with a resin and the resin is cured may be used as the flexible substrate. The structure including the fibrous body and the resin is preferably used as the flexible substrate, in which case reliability against bending or breaking due to local pressure can be increased.

To improve the light extraction efficiency, the refractive index of the material having flexibility and a light-transmitting property is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferable, in which case such a filler can maintain optical transparency.

To obtain flexibility and bendability, the thickness of a metal substrate is preferably greater than or equal to 10 μm and less than or equal to 200 μm, further preferably greater than or equal to 20 μm and less than or equal to 50 μm. Since a metal substrate has a high thermal conductivity, heat generated due to light emission of a light-emitting element can be efficiently released.

Although there is no particular limitation on a material of the metal substrate, it is preferable to use, for example, aluminum, copper, nickel, a metal alloy such as an aluminum alloy or stainless steel.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the functional element (in particular, the organic EL element) due to moisture and the like, an insulating film with low water permeability described later may be included.

The flexible substrate may be formed by stacking a plurality of layers. When a glass layer is used, a barrier property against water and oxygen can be improved and thus a highly reliable light-emitting device can be provided.

For example, a flexible substrate in which a glass layer, a bonding layer, and an organic resin layer are stacked from the side closer to an organic EL element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, preferably greater than or equal to 20 μm and less than or equal to 50 μm. Providing such an organic resin layer outside the glass layer, occurrence of a crack or a break in the glass layer can be suppressed and mechanical strength can be improved. With the substrate that includes such a composite material of a glass material and an organic resin, a highly reliable and flexible light-emitting device can be provided.

As the bonding layer, various curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the functional element and can improve the reliability of the light-emitting device.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

The insulating layer 424, the insulating layer 226, the insulating layer 1405, and the insulating layer 1455 can each be formed using an inorganic insulating material. It is particularly preferable to use the insulating film with a high gas barrier property, in which case a highly reliable light-emitting device can be provided. In addition, the insulating film with a high gas barrier property may be formed between the bonding layer and the upper electrode.

The insulating layer 463 and the insulating layer 1407 each have an effect of suppressing diffusion of impurities into a semiconductor included in the transistor. As each of the insulating layer 463 and the insulating layer 1407, for example, an inorganic insulating film such as a silicon oxide film, a silicon oxynitride film, or an aluminum oxide film can be used.

As each of the insulating layer 465, the insulating layer 467, and the insulating layer 1409, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of insulating films formed of these materials or inorganic insulating films may be stacked.

The insulating layer 405 and the insulating layer 1411 are provided to cover an end portion of the lower electrode. As a material for each of the insulating layer 405, the insulating layer 496, and the insulating layer 1411, a resin or an inorganic insulating material can be used. As the resin, for example, a polyimide resin, a polyamide resin, an acrylic resin, a siloxane resin, an epoxy resin, a phenol resin, or the like can be used. In particular, either a negative photosensitive resin or a positive photosensitive resin is preferably used for easy formation of the insulating layer 405, the insulating layer 496, and the insulating layer 1411.

There is no particular limitation to the method for forming the insulating layer 405, the insulating layer 496, and the insulating layer 1411; a photolithography method, a sputtering method, an evaporation method, a droplet discharging method (e.g., an ink-jet method), a printing method (e.g., a screen printing method or an off-set printing method), or the like may be used.

The conductive layers serving as an electrode, a wiring, and the like of the transistor can be each formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$-ZnO), or any of these metal oxide materials in which silicon oxide is contained can be used.

For the connector, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light emitted from an adjacent organic EL element to prevent color mixture between adjacent organic EL elements. Here, the coloring layer is provided such that its end portion overlaps with the light-blocking layer, whereby light leakage can be reduced. As the light-blocking layer, a material that can block light from the organic EL element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. With the overcoat, impurities and the like contained in the coloring layer can be prevented from being diffused into an organic EL element. The overcoat is formed with a material that transmits light emitted from the organic EL element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material that has high wettability with respect to the material of the bonding layer is preferably used as the material of the overcoat. For example, an oxide conductive film such as an ITO film or a metal film such as an Ag film which is thin enough to transmit light is preferably used as the overcoat 453 (see FIG. 10A).

<Manufacturing Method Example>

Next, an example of a manufacturing method of a light-emitting device is described with reference to FIGS. 12A to 12C and FIGS. 13A to 13C. Here, the manufacturing method is described using the light-emitting device of Structure Example 1-4 (FIG. 11B) as an example.

Figure 12A:
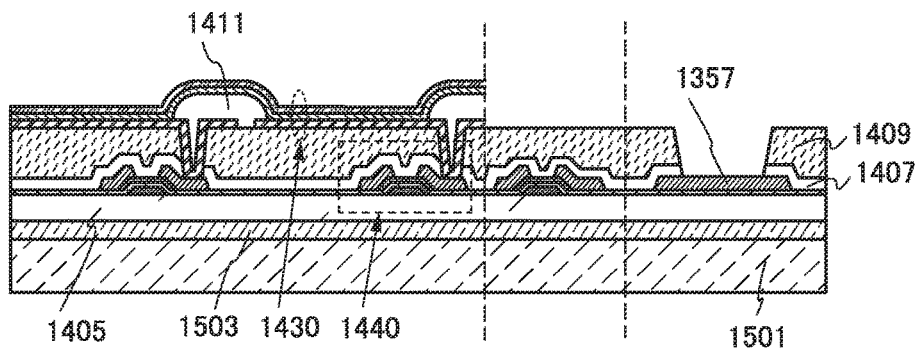
FIGS. 12A to 12C illustrate an example of a manufacturing method of a display panel.
Figure 12B:
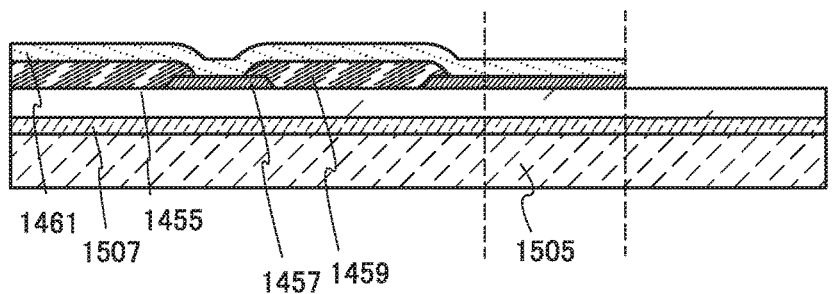

First, a peeling layer 1503 is formed over a formation substrate 1501, and the insulating layer 1405 is formed over the peeling layer 1503. Next, the plurality of transistors, the conductive layer 1357, the insulating layer 1407, the insulating layer 1409, the plurality of light-emitting elements, and the insulating layer 1411 are formed over the insulating layer 1405. An opening is formed in the insulating layer 1411, the insulating layer 1409, and the insulating layer 1407 to expose the conductive layer 1357 (FIG. 12A).

In addition, a peeling layer 1507 is formed over a formation substrate 1505, and the insulating layer 1455 is formed over the peeling layer 1507. Next, the light-blocking layer 1457, the coloring layer 1459, and the overcoat 1461 are formed over the insulating layer 1455 (see FIG. 12B).

The formation substrate 1501 and the formation substrate 1505 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the peeling layer, in which case contamination from the glass substrate can be prevented.

The peeling layer 1503 and the peeling layer 1507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The peeling layer can be formed by a sputtering method, a plasma CVD method, a coating method, a printing method, or the like. Note that a coating method includes a spin coating method, a droplet discharge method, and a dispensing method.

In the case where the peeling layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the peeling layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the peeling layer is changed by the plasma treatment or heat treatment, whereby adhesion between the peeling layer and the insulating film formed later can be controlled.

The insulating layer can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film having an extremely high gas barrier property.

Figure 12C:
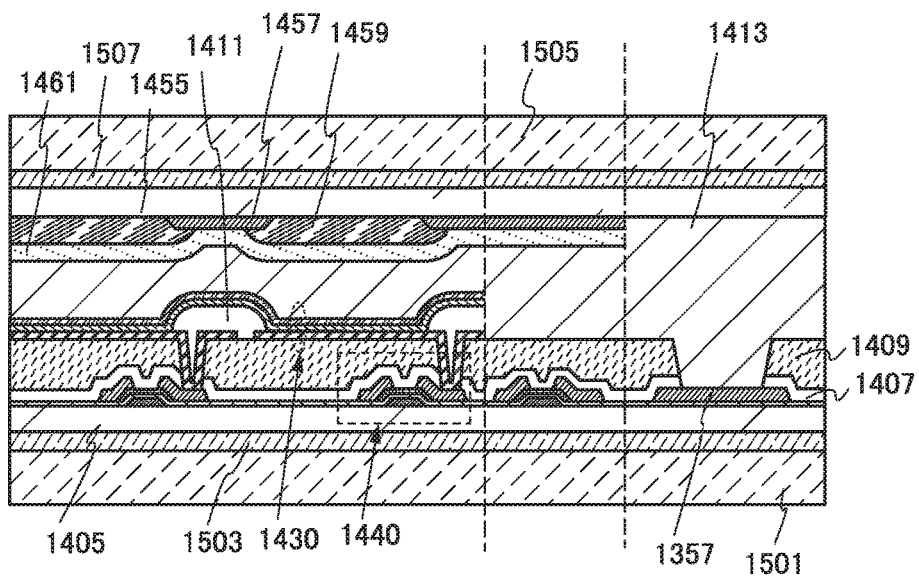

Then, a material for the bonding layer 1413 is applied to a surface of the formation substrate 1505 over which the coloring layer 1459 and the like are formed or a surface of the formation substrate 1501 over which the light-emitting element 1430 and the like are formed, and the surfaces are bonded to each other with the bonding layer 1413 provided therebetween (FIG. 12C).

Next, the formation substrate 1501 is peeled, and the exposed insulating layer 1405 and the flexible substrate 1401 are attached to each other with the bonding layer 1403. Furthermore, the formation substrate 1505 is peeled, and the exposed insulating layer 1455 and the flexible substrate 1303 are attached to each other with the bonding layer 1305. Although the flexible substrate 1303 does not overlap with the conductive layer 1357 in FIG. 13A, the flexible substrate 1303 may overlap with the conductive layer 1357.

Note that a variety of peeling methods can be used for peeling of the formation substrate in one embodiment of the present invention. For example, when a layer including a metal oxide film is formed as the peeling layer on the side in contact with the layer to be peeled, the metal oxide film is embrittled by crystallization, whereby the layer to be peeled can be peeled from the formation substrate. Alternatively, when an amorphous silicon film containing hydrogen is formed as the peeling layer between a formation substrate having high heat resistance and a layer to be peeled, the amorphous silicon film is removed by laser light irradiation or etching, whereby the layer to be peeled can be peeled from the formation substrate. Alternatively, after a layer including a metal oxide film is formed as the peeling layer on the side in contact with the layer to be peeled, the metal oxide film is embrittled by crystallization, and part of the peeling layer is removed by etching using a solution or a fluoride gas such as $NF_3$, $BrF_3$, or $ClF_3$, whereby the peeling can be performed at the embrittled metal oxide film. Further alternatively, a method performed as follows may be employed: a film containing nitrogen, oxygen, hydrogen, or the like (e.g., an amorphous silicon film containing hydrogen, an alloy film containing hydrogen, an alloy film containing oxygen, or the like) is used as the peeling layer, and the peeling layer is irradiated with laser light to release the nitrogen, oxygen, or hydrogen contained in the peeling layer as gas, thereby promoting peeling between the layer to be peeled and the formation substrate. Alternatively, it is possible to use a method in which the formation substrate provided with the layer to be peeled is removed mechanically or by etching using a solution or a fluoride gas such as $NF_3$, $BrF_3$, or $ClF_3$, or the like. In this case, the peeling layer is not necessarily provided.

When a plurality of the above-described peeling methods are combined, the peeling process can be performed easily. In other words, peeling can be performed with physical force (by a machine or the like) after performing laser light irradiation, etching on the peeling layer with a gas, a solution, or the like, or mechanical removal with a sharp knife, scalpel or the like so that the peeling layer and the layer to be peeled can be easily separated from each other.

Peeling of the layer to be peeled from the formation substrate may be performed by soaking the interface between the peeling layer and the layer to be peeled in a liquid. Further alternatively, the peeling may be performed while pouring a liquid during the peeling. Furthermore, an adverse effect on the functional element included in the layer to be peeled due to static electricity caused at peeling (e.g., a phenomenon in which a semiconductor element is damaged by static electricity) can be suppressed.

Note that a liquid may be sprayed in an atomized form or in a vaporized form. As the liquid, pure water, an organic solvent, a neutral, alkaline, or acid aqueous solution, an aqueous solution in which a salt is dissolved, or the like can be used.

As another peeling method, in the case where the peeling layer is formed using tungsten, it is preferable that the peeling be performed while etching the peeling layer using a mixed solution of ammonium water and a hydrogen peroxide solution.

Note that the peeling layer is not necessarily provided in the case where peeling at an interface between the formation substrate and the layer to be peeled is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is improved by laser light irradiation or heat treatment. Then, an insulating film, a transistor, and the like are formed over the organic resin. After that, peeling at the interface between the formation substrate and the organic resin can be performed by performing laser light irradiation with higher energy density higher than the above laser light irradiation or performing heat treatment at a higher temperature than the above heat treatment. Moreover, the interface between the formation substrate and the organic resin may be soaked in a liquid to be separated when peeled.

Since the insulating film, the transistor, and the like are formed over the organic resin having low heat resistance in the above method, it is impossible to expose the substrate to high temperatures in the manufacturing process. Here, a manufacturing process at high temperatures is dispensable for a transistor including an oxide semiconductor; therefore, the transistor can be favorably formed over the organic resin.

Note that the organic resin may be used as the substrate of the light-emitting device. Alternatively, the organic resin may be removed and another substrate may be attached to the exposed surface of the layer to be peeled using an adhesive.

Alternatively, peeling at the interface between a metal layer and the organic resin may be performed in the following manner: the metal layer is provided between the formation substrate and the organic resin and current is made to flow in the metal layer so that the metal layer is heated.

Figure 13A:
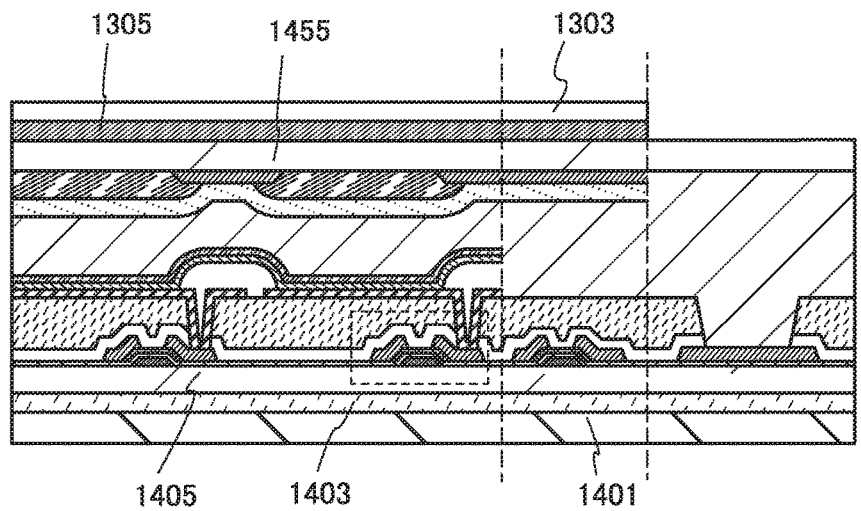
FIGS. 13A to 13C illustrate an example of a manufacturing method of a display panel.
Figure 13B:
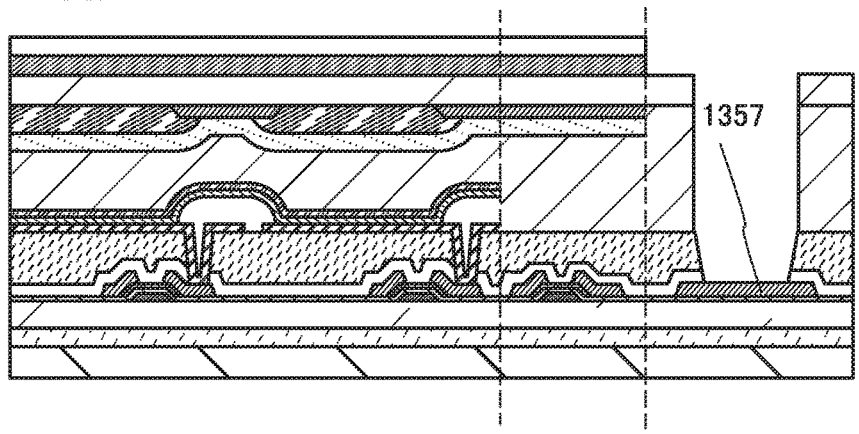
Figure 13C:
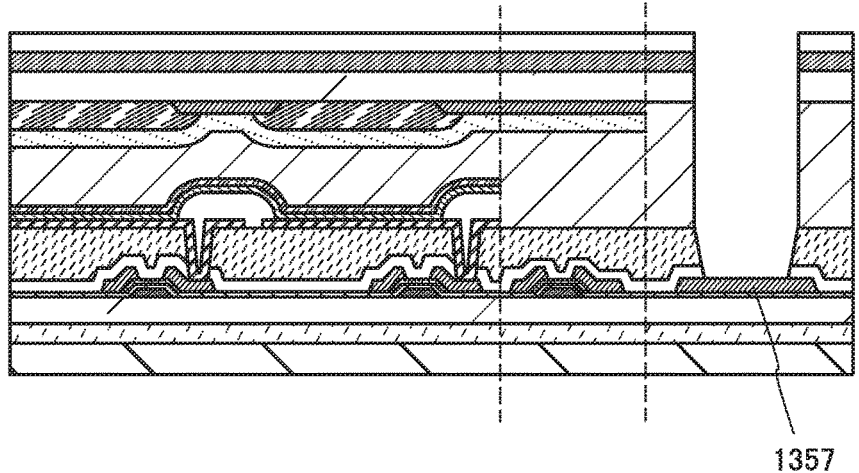

Lastly, an opening is formed in the insulating layer 1455 and the bonding layer 1413 to expose the conductive layer 1357 (FIG. 13B). In the case where the flexible substrate 1303 overlaps with the conductive layer 1357, the opening is formed also in the flexible substrate 1303 and the bonding layer 1305 (FIG. 13C). The method for forming the opening is not particularly limited and may be, for example, a laser ablation method, an etching method, an ion beam sputtering method, or the like. As another method, a slit may be made in a film over the conductive layer 1357 with a sharp knife or the like and part of the film may be peeled by physical force.

In the above-described manner, the light-emitting device can be manufactured.

Note that in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include a display medium whose contrast, luminance, reflectance, transmittance, or the like is changed by electromagnetic action, such as an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), interferometric modulator (IMOD) element, an electrowetting element, a piezoelectric ceramic display, or a carbon nanotube. Examples of display devices including electron emitters are a field emission display (FED) and an SED-type flat panel display (SED: surface-conduction electron-emitter display).

In this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, an MIM (metal insulator metal), a TFD (thin film diode), or the like can also be used. Since such an element has few numbers of manufacturing steps, manufacturing cost can be reduced or yield can be improved. Furthermore, since the size of these elements is small, the aperture ratio can be improved, so that power consumption can be reduced or higher luminance can be achieved.

Since an active element is not used in a passive matrix method, the number of manufacturing steps is small, so that the manufacturing cost can be reduced or the yield can be improved. Furthermore, since an active element is not used, the aperture ratio can be improved, so that power consumption can be reduced or higher luminance can be achieved.

This embodiment can be combined with any of the other embodiments as appropriate.

[Embodiment 3]

In this embodiment, a structure of a bendable touch panel will be described with reference to FIGS. 14A to 14C, FIGS. 15A and 15B, FIGS. 16A to 16C, and FIGS. 17A to 17C. Note that Embodiment 2 can be referred to for a material of each layer.

Although a touch panel including an organic EL element is described in this embodiment as an example, one embodiment of the present invention is not limited to this example. In one embodiment of the present invention, for example, a touch panel including another element described in Embodiment 2 as an example can be formed.

<Structure Example 2-1>

Figure 14A:
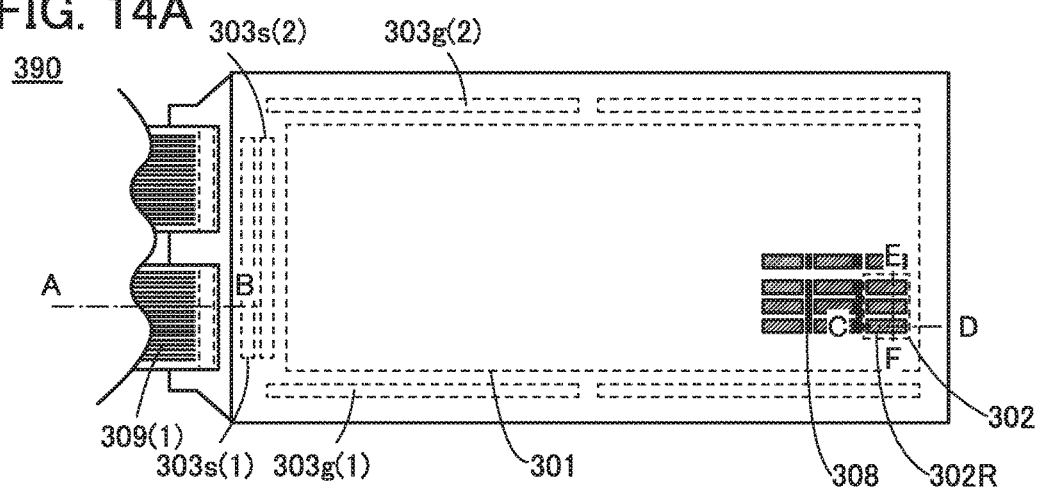
FIGS. 14A to 14C illustrate an example of a touch panel.
Figure 14B:
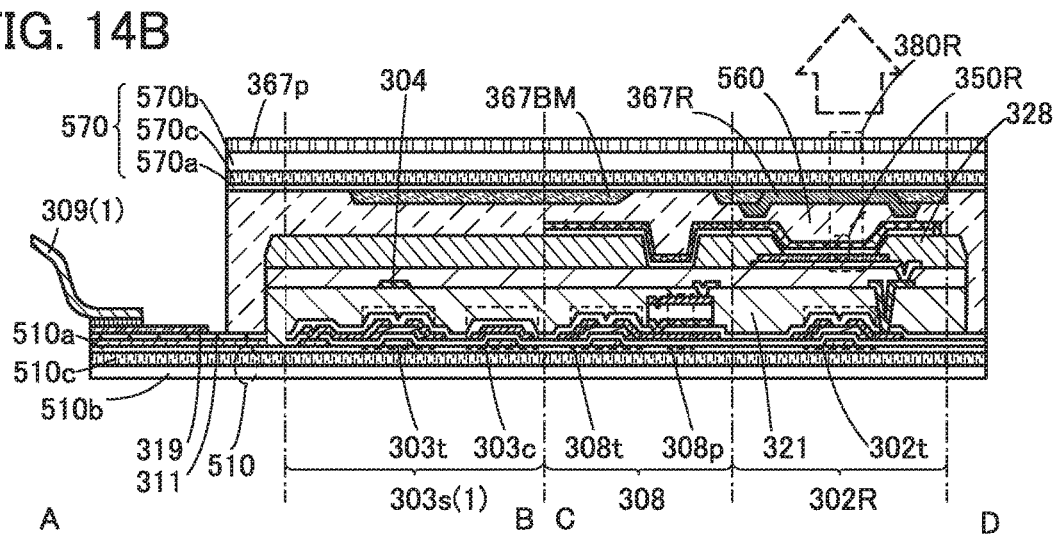
Figure 14C:
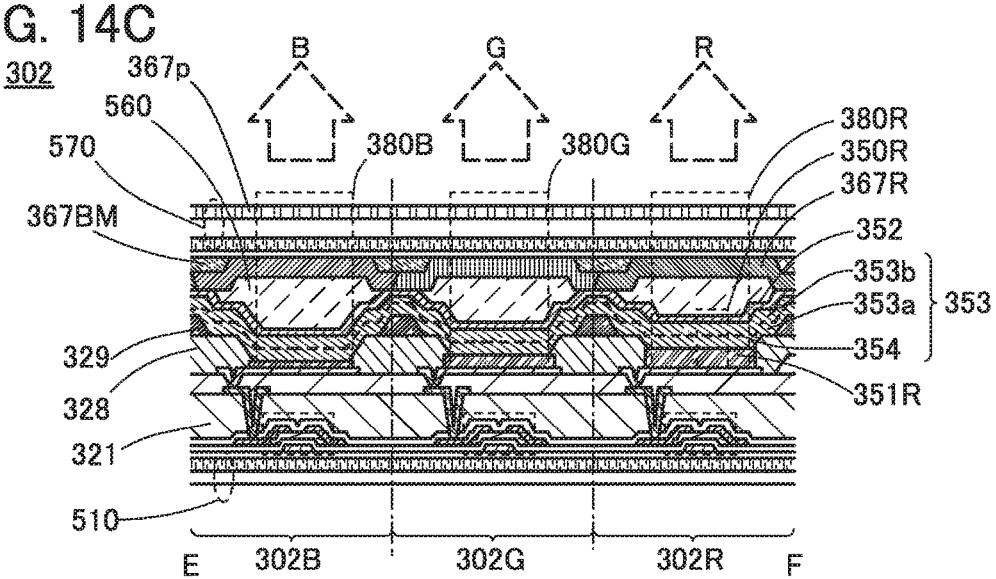

FIG. 14A is a top view of the touch panel. FIG. 14B is a cross-sectional view taken along dashed-dotted line A-B and dashed-dotted line C-D in FIG. 14A. FIG. 14C is a cross-sectional view taken along dashed-dotted line E-F in FIG. 14A.

A touch panel 390 includes a display portion 301 as illustrated in FIG. 14A.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signal include a signal for selecting an imaging pixel circuit from which a recorded imaging signal is read, a signal for initializing an imaging pixel circuit, a signal for determining the time it takes for an imaging pixel circuit to sense light, and the like.

The touch panel 390 is provided with an imaging pixel driver circuit 303g(2) that can supply control signals to the imaging pixels 308 and an imaging signal line driver circuit 303s(2) that reads out imaging signals.

The touch panel 390 includes a substrate 510 and a substrate 570 facing the substrate 510 as illustrated in FIG. 14B.

Flexible materials can be favorably used for the substrate 510 and the substrate 570.

Materials with which unintended passage of impurities is inhibited can be favorably used in the substrate 510 and the substrate 570. For example, materials with a vapor permeability lower than or equal to $10^{-5}$ g/m²·day, preferably lower than or equal to $10^{-6}$ g/m²·day can be favorably used.

The substrate 510 can be favorably formed using a material whose coefficient of linear expansion is substantially equal to that of the substrate 570. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

The substrate 510 is a stacked body including a flexible substrate 510b, an insulating layer 510a that prevents diffusion of unintentional impurities to light-emitting elements, and a bonding layer 510c that attaches the insulating layer 510a to the flexible substrate 510b.

The substrate 570 is a stacked body including a flexible substrate 570b, an insulating layer 570a that prevents diffusion of unintentional impurities to the light-emitting elements, and a bonding layer 570c that attaches the insulating layer 570a to the substrate 570b.

For example, materials that include polyester, polyolefin, polyamide (e.g., nylon, aramid), polyimide, polycarbonate, or a resin having an acrylic bond, an urethane bond, an epoxy bond, or a siloxane bond can be used for the bonding layer.

A sealing layer 560 attaches the substrate 570 to the substrate 510. The sealing layer 560 has a refractive index higher than that of the air. The pixel circuits and the light-emitting elements (e.g., a light-emitting element 350R) are provided between the substrate 510 and the substrate 570.

Each of the pixels 302 includes the sub-pixel 302R, a sub-pixel 302G, and a sub-pixel 302B (see FIG. 14C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit that can supply electric power to the light-emitting element 350R and includes a transistor 302t (see FIG. 14B). Furthermore, the light-emitting module 380R includes the light-emitting element 350R and an optical element (e.g., a coloring layer 367R).

The light-emitting element 350R includes a lower electrode 351R, an upper electrode 352, and an EL layer 353 between the lower electrode 351R and the upper electrode 352 (see FIG. 14C).

The EL layer 353 includes a light-emitting unit 353a, a light-emitting unit 353b, and an intermediate layer 354 between the light-emitting units 353a and 353b.

The light-emitting module 380R includes the coloring layer 367R on the substrate 570. The coloring layer transmits light of a particular wavelength and is, for example, a layer that selectively transmits light of red, green, or blue color. A region that transmits light emitted from the light-emitting element as it is may be provided as well.

The light-emitting module 380R, for example, includes the sealing layer 560 that is in contact with the light-emitting element 350R and the coloring layer 367R.

The coloring layer 367R is positioned in a region overlapping with the light-emitting element 350R. Accordingly, part of light emitted from the light-emitting element 350R passes through the sealing layer 560 and through the coloring layer 367R and is emitted to the outside of the light-emitting module 380R as indicated by arrows in FIGS. 14B and 14C.

The touch panel 390 includes a light-blocking layer 367BM on the substrate 570. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t. Note that the insulating layer 321 can be used as a layer for planarizing unevenness caused by the pixel circuits. An insulating layer on which a layer that can suppress diffusion of impurities to the transistor 302t and the like is stacked can be used as the insulating layer 321.

The touch panel 390 includes the light-emitting elements (e.g., the light-emitting element 350R) over the insulating layer 321.

The touch panel 390 includes, over the insulating layer 321, a partition 328 that overlaps with an end portion of the lower electrode 351R. In addition, a spacer 329 that controls the distance between the substrate 510 and the substrate 570 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 14B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for the transistor 308t, the transistor 302t, or the like.

The imaging pixels 308 each include a photoelectric conversion element 308p and an imaging pixel circuit for sensing light received by the photoelectric conversion element 308p. The imaging pixel circuit includes a transistor 308t.

For example, a PIN photodiode can be used as the photoelectric conversion element 308p.

The touch panel 390 includes a wiring 311 through which a signal can be supplied. The wiring 311 is provided with a terminal 319. Note that an FPC 309(1) through which a signal such as an image signal or a synchronization signal can be supplied is electrically connected to the terminal 319. Note that a printed wiring board (PWB) may be attached to the FPC 309(1).

Transistors formed in the same process can be used as the transistor 302t, the transistor 303t, the transistor 308t, and the like.

Gates, sources, and drains of the transistors, and various wirings and electrodes that form the touch panel can be formed to have a single-layer structure or a stacked-layer structure using, as a material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used, in which case the shape can be processed by etching with high controllability.

<Structure Example 2-2>

Figure 15A:
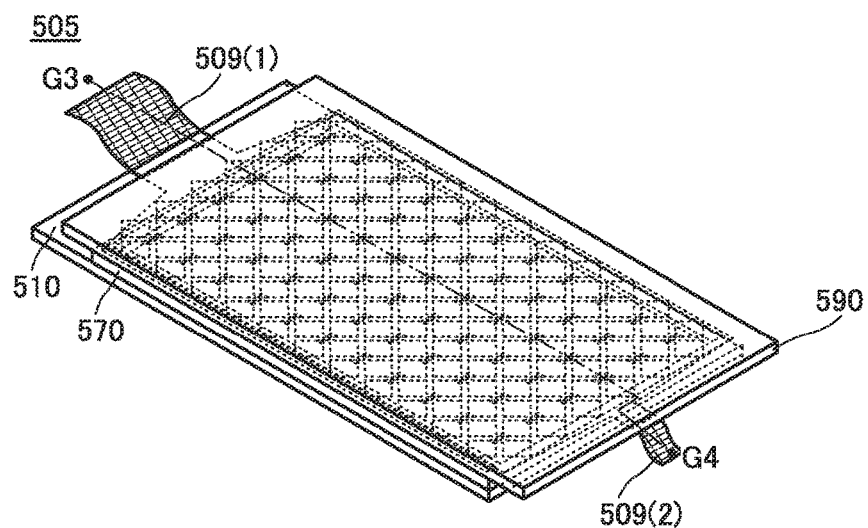
FIGS. 15A and 15B illustrate an example of a touch panel.
Figure 15B:
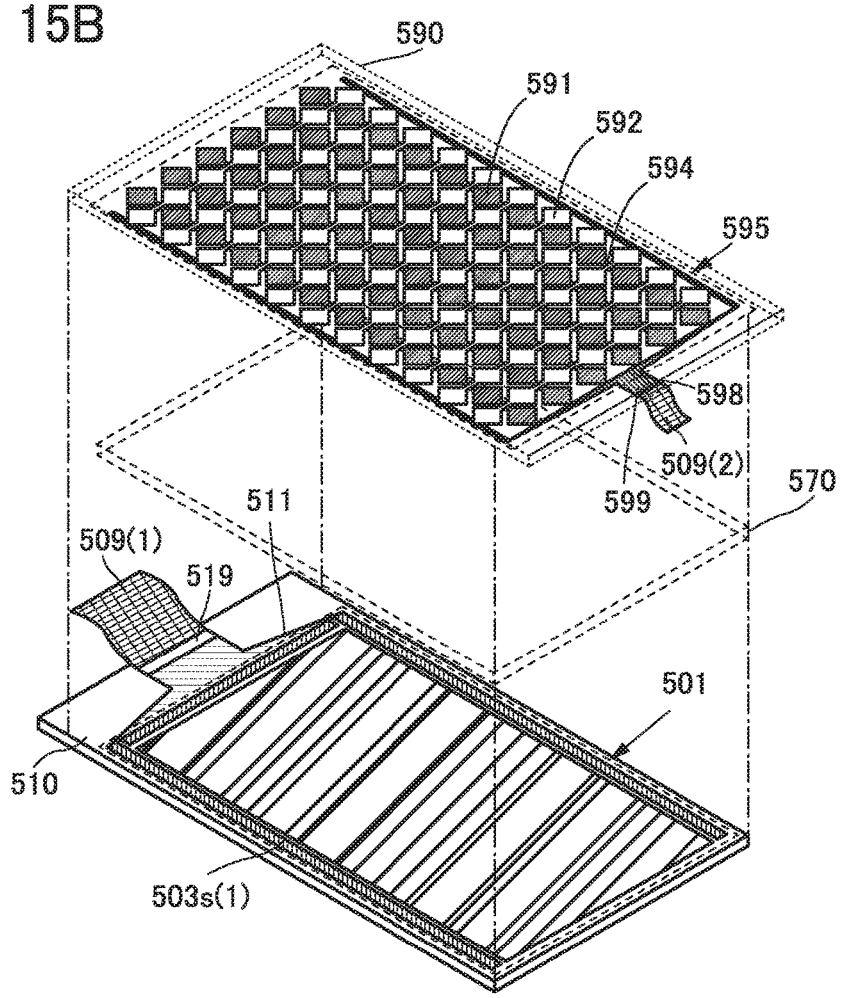
Figure 16A:
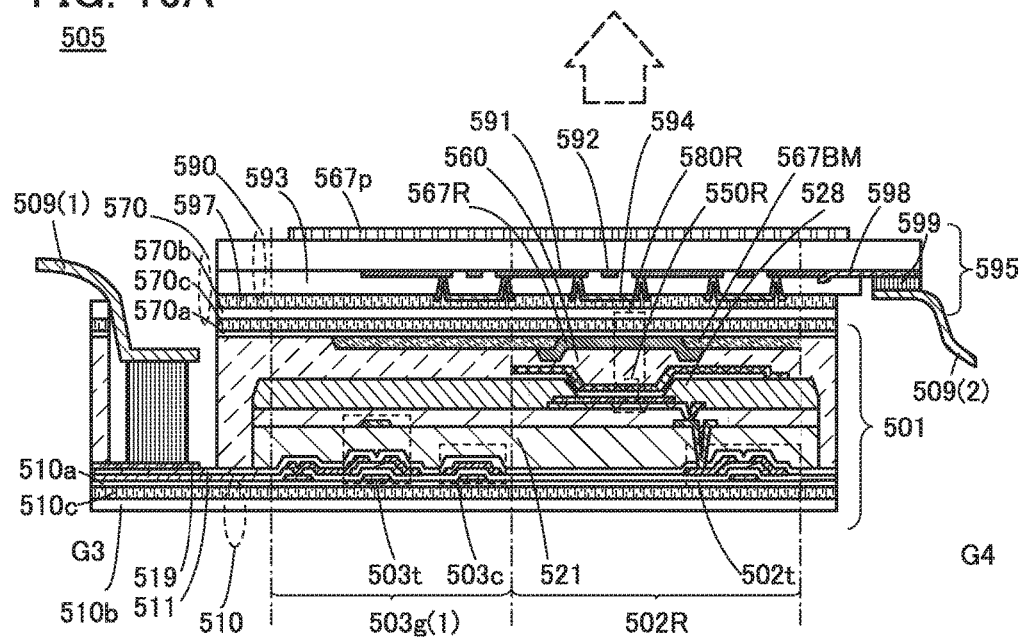
FIGS. 16A to 16C illustrate examples of a touch panel.

FIGS. 15A and 15B are perspective views of a touch panel 505. Note that FIGS. 15A and 15B illustrate only main components for simplicity. FIG. 16A is a cross-sectional view taken along dashed-dotted line G3-G4 in FIG. 15A.

The touch panel 505 includes a display portion 501 and a touch sensor 595 (see FIG. 15B). Furthermore, the touch panel 505 includes the substrate 510, the substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 are led to a peripheral portion of the substrate 510, and part of the plurality of wirings 511 form a terminal 519. The terminal 519 is electrically connected to an FPC 509(1).

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 15B, electrodes, wirings, and the like of the touch sensor 595 provided on the back side of the substrate 590 (the side facing the substrate 510) are indicated by solid lines for clarity.

As the touch sensor 595, for example, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

An example of using a projected capacitive touch sensor is described below with reference to FIG. 15B.

Note that a variety of sensors that can sense the closeness or the contact of a sensing target such as a finger can be used.

The projected capacitive touch sensor 595 includes first electrodes 591 and second electrodes 592. The first electrodes 591 are electrically connected to any of the plurality of wirings 598, and the second electrodes 592 are electrically connected to any of the other wirings 598.

The second electrodes 592 each have a shape of a plurality of quadrangles arranged in one direction with one corner of a quadrangle connected to one corner of another quadrangle as illustrated in FIGS. 15A and 15B.

The first electrodes 591 each have a quadrangular shape and are arranged in a direction intersecting with the direction in which the second electrodes 592 extend.

A wiring 594 electrically connects two first electrodes 591 between which one of the second electrodes 592 is positioned. The intersecting area of the one of the second electrodes 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the first electrodes 591 and the second electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect the first electrodes with an insulating layer sandwiched between the first electrodes and the second electrodes. In that case, two adjacent second electrodes may be spaced apart from each other. Moreover, between the two adjacent second electrodes, it is preferable to provide a dummy electrode which is electrically insulated from these electrodes, whereby the area of a region having a different transmittance can be reduced.

The touch sensor 595 includes the substrate 590, the first electrodes 591 and the second electrodes 592 provided in a staggered arrangement on the substrate 590, an insulating layer 593 covering the first electrodes 591 and the second electrodes 592, and the wiring 594 that electrically connects the adjacent first electrodes 591 to each other.

A bonding layer 597 attaches the substrate 590 to the substrate 570 so that the touch sensor 595 overlaps with the display portion 501 as illustrated in FIG. 15B.

The first electrodes 591 and the second electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The first electrodes 591 and the second electrodes 592 may be formed by depositing a light-transmitting conductive material on the substrate 590 by a sputtering method and then removing an unnecessary portion by a variety of patterning technique such as photolithography.

Examples of a material for the insulating layer 593 are a resin such as acrylic or an epoxy resin, a resin having a siloxane bond, and an inorganic insulating material such as silicon oxide, silicon oxynitride, or aluminum oxide.

Furthermore, openings reaching the first electrodes 591 are formed in the insulating layer 593, and the wiring 594 electrically connects the adjacent first electrodes 591. A light-transmitting conductive material can be favorably used as the wiring 594 because the aperture ratio of the touch panel can be increased. Moreover, a material with higher conductivity than the conductivities of the first electrode 591 and the second electrode 592 can be favorably used for the wiring 594 because electric resistance can be reduced.

Each of the second electrodes 592 extends in one direction, and the second electrodes 592 are provided in the form of stripes.

The wiring 594 intersects with one of the second electrodes 592.

Adjacent first electrodes 591 are provided with one of the second electrodes 592 provided therebetween and are electrically connected by the wiring 594.

Note that the first electrodes 591 are not necessarily arranged in the direction orthogonal to the one of the second electrodes 592.

The wirings 598 are electrically connected to the first electrodes 591 and the second electrodes 592. Part of the wirings 598 serves as a terminal. For the wirings 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer covering the insulating layer 593 and the wiring 594 may be provided to protect the touch sensor 595.

Furthermore, a connection layer 599 electrically connects the wirings 598 to the FPC 509(2).

As the connection layer 599, any of various anisotropic conductive films (ACF), anisotropic conductive pastes (ACP), or the like can be used.

The bonding layer 597 has a light-transmitting property. For example, a thermosetting resin or an ultraviolet curable resin can be used; specifically, a resin such as an acrylic resin, a urethane resin, an epoxy resin, or a resin having a siloxane bond can be used.

The display portion 501 includes a plurality of pixels arranged in a matrix. Each of the pixels includes a display element and a pixel circuit for driving the display element.

In this embodiment, an example of using an organic EL element that emits white light as a display element will be described; however, the display element is not limited to such an element.

For example, organic EL elements that emit light of different colors may be included in sub-pixels so that the light of different colors can be emitted from the respective sub-pixels.

Structures which are similar to those of the substrate 510, the substrate 570, and the sealing layer 560 in Structure Example 2-1 can be applied to the substrate 510, the substrate 570, and the sealing layer 560 in Structure Example 2-2.

A pixel includes a sub-pixel 502R, and the sub-pixel 502R includes a light-emitting module 580R.

The sub-pixel 502R includes a light-emitting element 550R and the pixel circuit that can supply electric power to the light-emitting element 550R and includes a transistor 502t. Furthermore, the light-emitting module 580R includes the light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the coloring layer 567R on the light extraction side.

In the case where the sealing layer 560 is provided on the light extraction side, the sealing layer 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by arrows in FIG. 16A.

The display portion 501 includes a light-blocking layer 567BM on the light extraction side. The light-blocking layer 567BM is provided so as to surround the coloring layer (e.g., the coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. A stacked film including a layer that can prevent diffusion of impurities can be used as the insulating film 521. This can prevent the reliability of the transistor 502t or the like from being lowered by diffusion of unintentional impurities.

The display portion 501 includes the light-emitting elements (e.g., the light-emitting element 550R) over the insulating film 521.

The display portion 501 includes, over the insulating film 521, a partition 528 that overlaps with an end portion of the lower electrode. In addition, a spacer that controls the distance between the substrate 510 and the substrate 570 is provided on the partition 528.

A scan line driver circuit 503g(1) includes a transistor 503t and a capacitor 503c. Note that the driver circuit can be formed in the same process and over the same substrate as those of the pixel circuits.

The display portion 501 includes a wiring 511 through which a signal can be supplied. The wiring 511 is provided with a terminal 519. Note that the FPC 509(1) through which a signal such as an image signal or a synchronization signal can be supplied is electrically connected to the terminal 519.

Note that a printed wiring board (PWB) may be attached to the FPC 509(1).

The display portion 501 includes wirings such as scan lines, signal lines, and power supply lines. Any of the various conductive films described above can be used as the wirings.

Any of various kinds of transistors can be used in the display portion 501. A structure in the case of using bottom-gate transistors in the display portion 501 is illustrated in FIGS. 16A and 16B.

For example, a semiconductor layer containing an oxide semiconductor, amorphous silicon, or the like can be used in the transistor 502t and the transistor 503t illustrated in FIG. 16A.

Figure 16B:
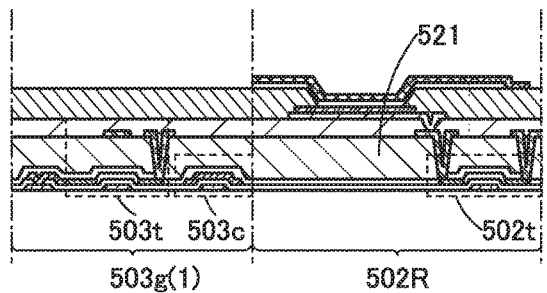

For example, a semiconductor layer containing polycrystalline silicon that is obtained by crystallization process such as laser annealing can be used in the transistor 502t and the transistor 503t illustrated in FIG. 16B.

Figure 16C:
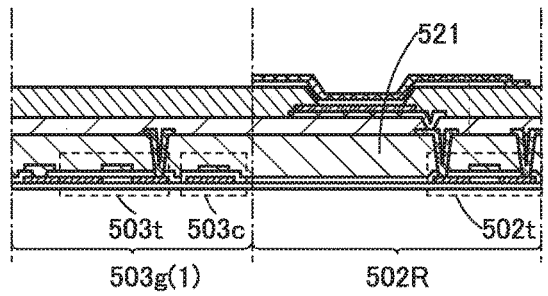

A structure in the case of using top-gate transistors in the display portion 501 is illustrated in FIG. 16C.

For example, a semiconductor layer including polycrystalline silicon, a single crystal silicon film that is transferred from a single crystal silicon substrate, or the like can be used in the transistor 502t and the transistor 503t illustrated in FIG. 16C.

This embodiment can be combined with any of the other embodiments as appropriate.

<Structure Example 2-3>

Figure 17A:
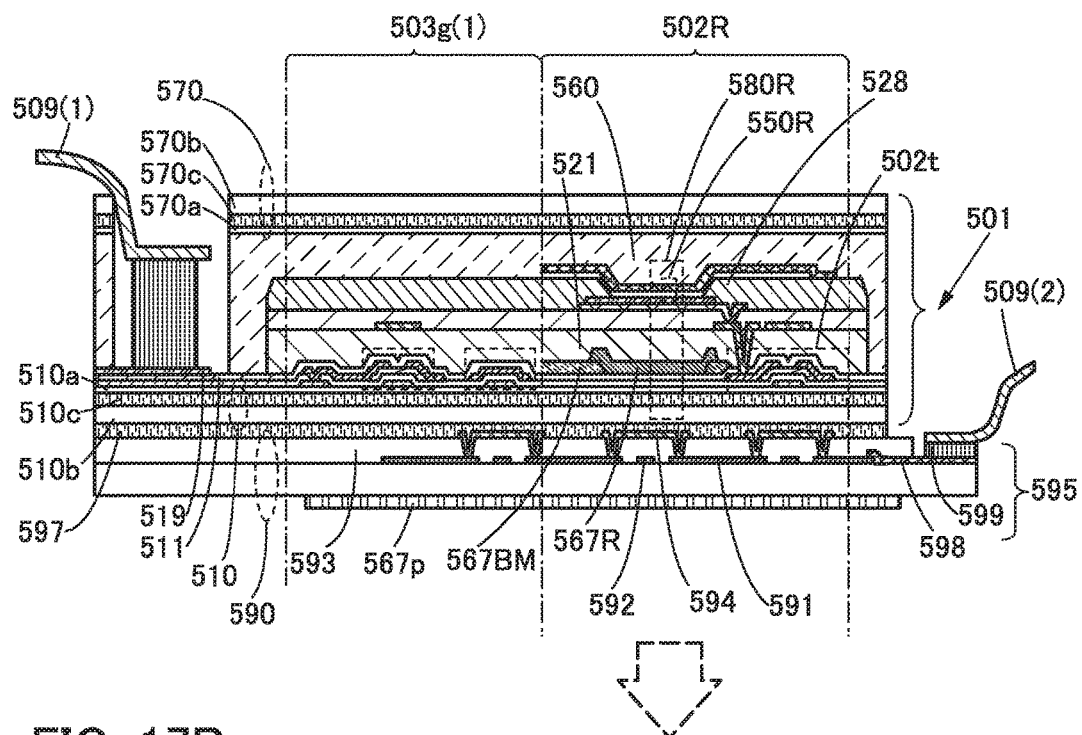
FIGS. 17A to 17C illustrate examples of a touch panel.
Figure 17B:
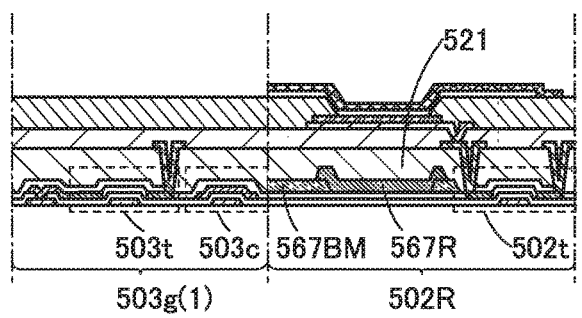
Figure 17C:
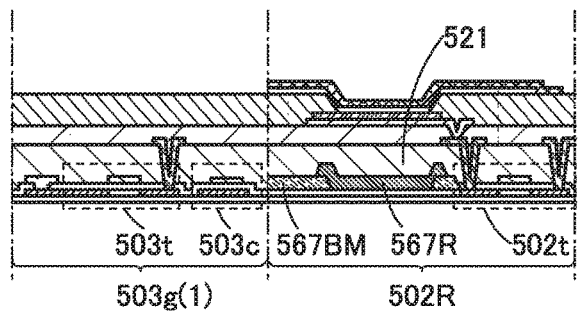

FIGS. 17A to 17C are cross-sectional views of a touch panel 505B. The touch panel 505B described in this embodiment is different from the touch panel 505 in Structure Example 2-2 in that the display portion 501 displays received image data on the side where the transistors are provided and that the touch sensor is provided on the substrate 510 side of the display portion. Different structures will be described in detail below, and the above description is referred to for the other similar structures.

The coloring layer 567R is positioned in a region overlapping with the light-emitting element 550R. The light-emitting element 550R illustrated in FIG. 17A emits light to the side where the transistor 502t is provided. Accordingly, part of light emitted from the light-emitting element 550R passes through the coloring layer 567R and is emitted to the outside of the light-emitting module 580R as indicated by arrows in FIG. 16A.

The display portion 501 includes the light-blocking layer 567BM on the light extraction side. The light-blocking layer 567BM is provided so as to surround the coloring layer (e.g., the coloring layer 567R).

The touch sensor 595 is provided on the substrate 510 side of the display portion 501 (see FIG. 17A).

The bonding layer 597 is provided between the substrate 510 and the substrate 590 and attaches the touch sensor 595 to the display portion 501.

Any of various kinds of transistors can be used in the display portion 501. A structure in the case of using bottom-gate transistors in the display portion 501 is illustrated in FIGS. 17A and 17B.

For example, a semiconductor layer containing an oxide semiconductor, amorphous silicon, or the like can be used in the transistor 502t and the transistor 503t illustrated in FIG. 17A.

For example, a semiconductor layer containing polycrystalline silicon or the like can be used in the transistor 502t and the transistor 503t illustrated in FIG. 17B.

A structure in the case of using top-gate transistors in the display portion 501 is illustrated in FIG. 17C.

For example, a semiconductor layer containing polycrystalline silicon, a transferred single crystal silicon film, or the like can be used in the transistor 502t and the transistor 503t illustrated in FIG. 17C.

This embodiment can be combined with any of the other embodiments as appropriate.

EXAMPLE 1

In this example, a subjective evaluation experiment was carried out to examine what conditions make viewers feel a stereoscopic effect in a two-dimensional image. Evaluation results are shown below. A 3.93-inch sized organic EL display having a resolution of 458 ppi was used as a display device. There were 10 or more examinees (viewers) in each experiment. The visual distance was 30 cm, and experiments were carried out in a dark place.

The definition of an image is one indicator of the stereoscopic effects in a two-dimensional image for the viewers. For example, a stereoscopic effect felt from an image in the case of viewing a moving image having a definition of 229 ppi was stronger than that felt from an image in the case of viewing a moving image having a definition of 114.5 ppi. Almost the same stereoscopic effects were felt from both an image in the case of viewing a moving image having a definition of 229 ppi and an image in the case of viewing a moving image having a definition of 458 ppi. Accordingly, it is possible for the viewers to feel stereoscopic effects in a two-dimensional image when the definition of the image is sufficiently high.

In addition, contrast of an image is another indicator of the stereoscopic effect in a two-dimensional image for the viewers. For example, stereoscopic effects that the viewers felt became weaker when the luminance of black displayed in the display device used for viewing was gradually changed from a minimum value to a higher value. Accordingly, it is possible for the viewers to feel stereoscopic effects in a two-dimensional image as the contrast of the image becomes higher.

Moreover, a viewer can feel a stereoscopic effect in a two-dimensional image either in the case of a still image or in the case of a moving image. In particular, the viewers can feel stereoscopic effects in a two-dimensional image more easily in the case of a moving image. Furthermore, the viewers can feel stereoscopic effects in a two-dimensional image either in the case of a monochrome image or a full-color image.

Recognition is another indicator of the stereoscopic effects in a two-dimensional image for the viewers. For example, stereoscopic effects that the viewers felt become weaker when treatment that disturbs recognition of the content of an image, such as making an image seen by the viewers upside down or inverting color of the image, is performed. Accordingly, the viewers need to recognize the content of an image to feel stereoscopic effects in a two-dimensional image.

EXAMPLE 2

In this example, a result of examining a relation between the stereoscopic effects that the viewers felt and the focal length will be described.

In this example, the focal length of eyes of the viewers when viewing a two-dimensional image displayed on a display device was measured.

As the display device, two kinds of display devices which were a flat-panel organic EL display (3.93 inch, 458 ppi, and a contrast ratio of 100000:1 or more) and a flat-panel liquid crystal display (3.5 inch, 326 ppi, and a contrast ratio of 800:1) were used. Note that each viewer responded in sensitivity evaluation carried out in advance that he/she felt a stronger stereoscopic effect in the displayed two-dimensional image when seeing the flat-panel organic EL display than the flat-panel liquid crystal display.

For the measurement of the focal length, Binocular Auto Reflex/Keratometer (WAM-5500, manufactured by REXXAM Co., Ltd.) was used.

The two-dimensional images displayed on the two kinds of display devices are the same moving images reproduced for 15 seconds. The moving images were each repeated three times. The viewers followed the images in similar ways; in the first half of the moving images for 15 seconds, the viewers saw an object they felt was located on the front side and in the second half of the moving images, the viewers saw the object they felt was located on the back side. The visual distance was 30 cm and the luminance of the display device was 300 cd/m$^2$.

Figure 18:
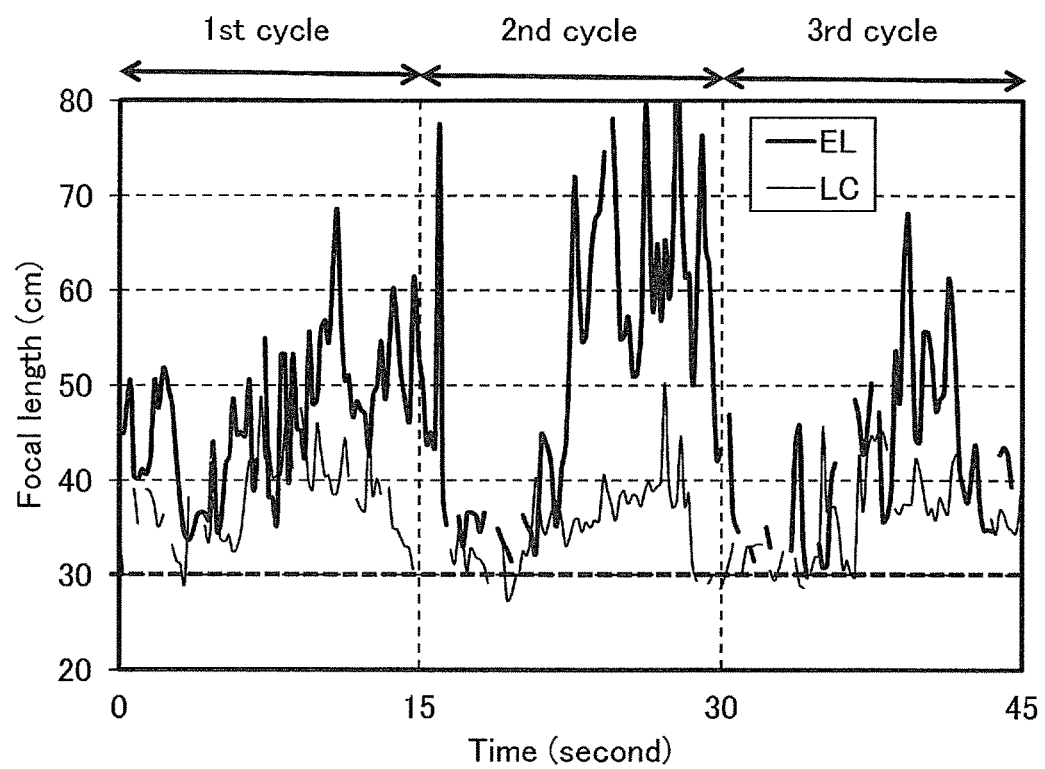
FIG. 18 shows results in Example 2.

FIG. 18 shows the measurement results of the focal length of one viewer. In FIG. 18, the vertical axis represents the focal length of eyes of the viewer, and the horizontal axis represents measurement time. According to FIG. 18, it is found that there is a change in focal length between when the viewer saw the object which was felt to be located on the front side and when the viewer saw the object which was felt to be located on the back side. In addition, it is found that there is a larger amount of change in focal length in the case where the viewer viewed the flat-panel organic EL display than in the case where the viewer viewed the flat-panel liquid crystal display. According to this result and the sensitivity evaluation result obtained in advance, it can be considered that a viewer can feel a strong stereoscopic effect in a two-dimensional image in the case where there is a large amount of change in the focal length of eyes of the viewer. The above results suggested that the intensity of the stereoscopic effect that the viewer felt in the two-dimensional image was able to be evaluated and analyzed quantitatively by measuring the amount of change in the focal length of the eyes of the viewer.

EXAMPLE 3

In this example, a result of sensitivity evaluation carried out to verify whether a viewer can feel a stereoscopic effect in a two-dimensional image displayed on a display device including a display portion having a curved surface will be described.

The display device used for the sensitivity evaluation was a 3.4-inch sized flexible organic EL display with a definition of 326 ppi. This organic EL display has the structure of Structure Example 1-3 described in Embodiment 2. An oxide semiconductor (CAAC-OS) was used for the transistor. The organic EL display was fabricated by using the manufacturing method described in Embodiment 2.

In four samples of this display device, one bent as illustrated in FIG. 1A1 is referred to as a sample A, one bent as illustrated in FIG. 1B1 is referred to as a sample B, one bent as illustrated in FIG. 1C1 is referred to as a sample C, and one bent as illustrated in FIG. 1D1 is referred to as a sample D. Each sample had the same curvature when bent with a curvature radius of 50 mm. In addition, a comparative sample formed by fixing the display device on a flat glass substrate was prepared. The comparative sample can be referred to as a display device including a display portion without a curved surface. A display device having a display portion 101 and a non-display portion 102 illustrated in FIG. 21D corresponds to the comparative sample (Ref) (without a frame portion 103).

The following cases were compared to evaluate whether there is a difference in a stereoscopic effect, an effect of making viewers feel an image pops out to the viewer side (a pop-out effect), and a sense of depth of the image: the case where a display portion of any of the samples A to D, which displayed the same moving images, was viewed; and the case where a display portion of the comparative sample, which displayed the same moving image, was viewed. The viewer compared and evaluated the display portion of any of the samples A to D and the display portion of the comparative sample that are laid side by side. There were 35 examinees.

For the evaluation, a semantic differential (SD) method was used. Specifically, the display portion of any of the samples A to D was viewed by comparing with the display portion of the comparative sample, and whether there was a stereoscopic effect, a pop-out effect, and a sense of depth in the moving image on a scale of +2 to −2 ("extremely strong (+2)", "strong (+1)", "not different (0)", "weak (−1)", and "extremely weak (−2)" was evaluated.

Figure 19A:
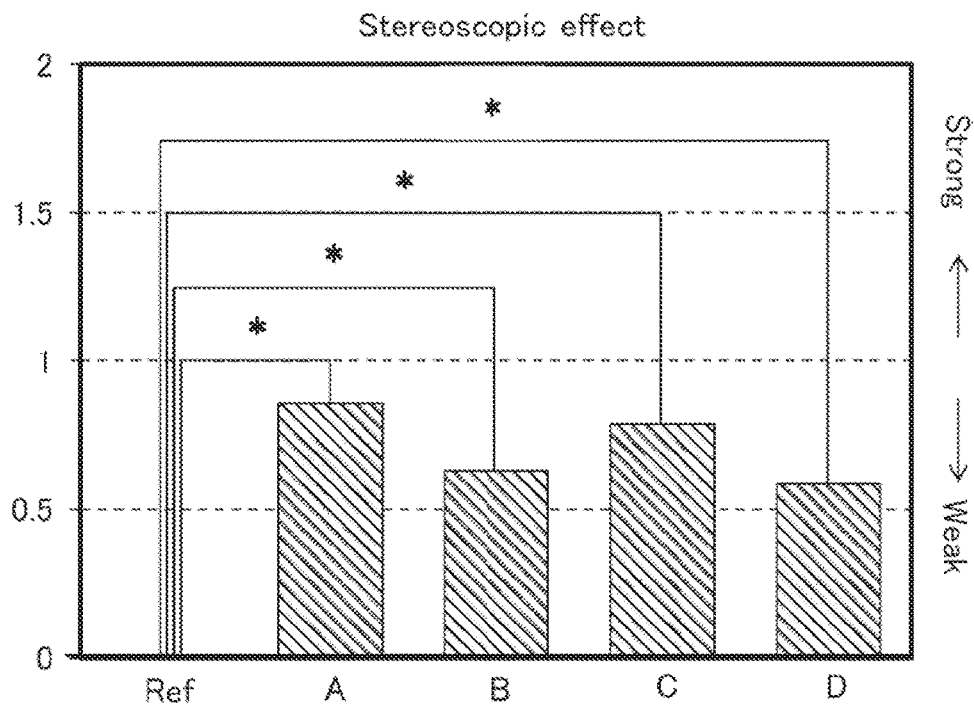
FIGS. 19A and 19B show results in Example 3.
Figure 19B:
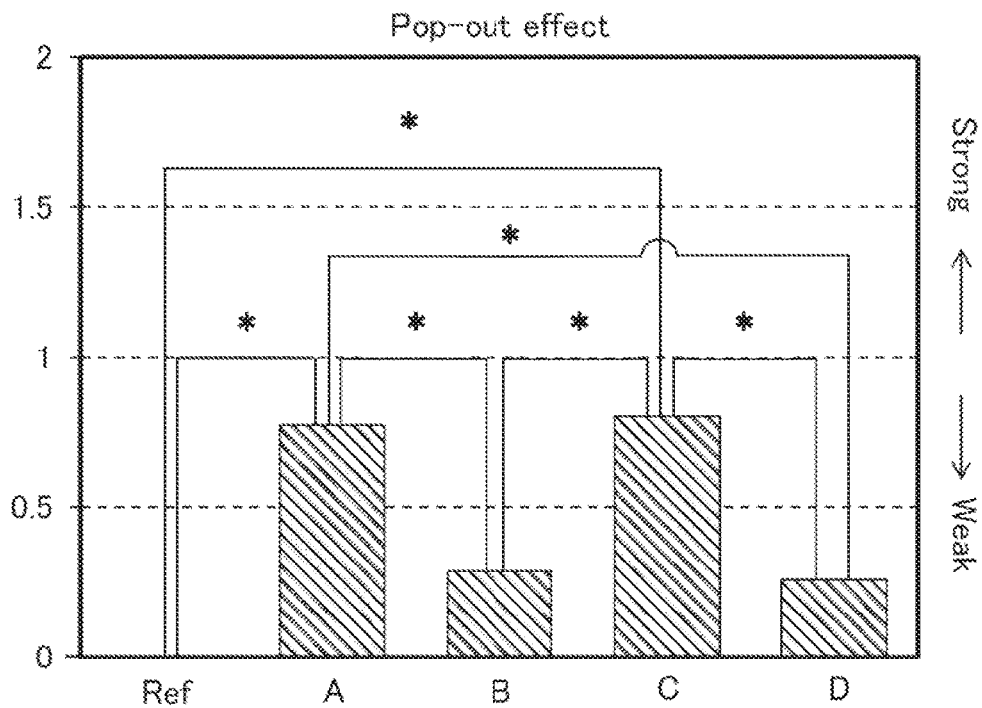
Figure 20A:
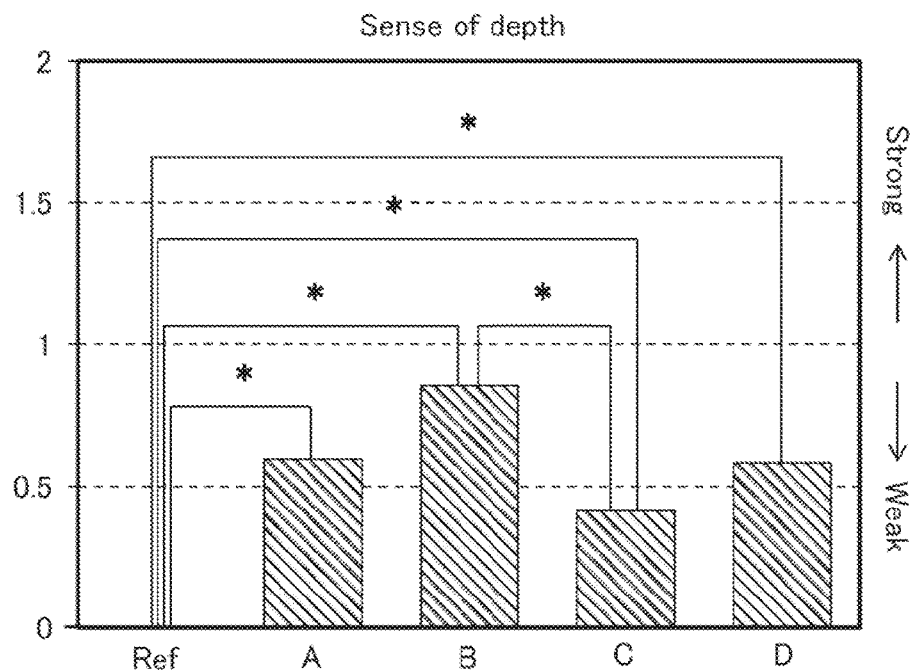
FIG. 20A shows results in Example 3.

FIGS. 19A and 19B and FIG. 20A show evaluation results. In the evaluation results, the average score of the 35 examinees is shown. A condition under which a significant difference is statistically observed at a probability of 95% or more is indicated by *.

According to FIGS. 19A and 19B and FIG. 20A, it is found that when the display portion having a curved surface is viewed, a stereoscopic effect, a pop-out effect, and a sense of depth in the image are strong as compared with the case of viewing the display portion without a curved surface regardless of the curved direction of the display portions.

In particular, in the sample A and the sample C having a convex surface on the viewer side, a strong pop-out effect was obtained as compared with the sample B and the sample D having a concave surface on the viewer side. In addition, in the sample B and the sample D having a concave surface on the viewer side, a strong sense of depth was obtained as compared with the sample A and the sample C having a convex surface on the viewer side.

When the sample A with a display portion bent on the viewer side in a horizontal direction so as to have a convex surface and the sample C with a display portion bent on the viewer side in a vertical direction so as to have a convex surface were compared with each other, there was statistically no significant difference in the intensity of a stereoscopic effect. In a similar manner, when the sample B with a display portion bent on the viewer side in a horizontal direction so as to have a concave surface and the sample D with a display portion bent on the viewer side in a vertical direction so as to have a concave surface were compared with each other, there was statistically no significant difference in the intensity of a stereoscopic effect.

Meanwhile, when examinees were each questioned in which sample they felt the strongest stereoscopic effect, those answered the sample A, those answered the sample B, those answered the sample C, and those answered the sample D were 43%, 26%, 17%, and 14% of the total, respectively. Accordingly, as a result of actual comparison, there was a tendency to obtain a strong stereoscopic effect in the case of bending the display portion in a horizontal direction as compared with the case of bending the display portion in a vertical direction. This is probably because a difference between information that enters a right eye and information that enters a left eye of a viewer can be made large. Since eyes of humans are arranged in a horizontal direction, the sample A and the sample B which was curved in a horizontal direction and in which distortion was caused in a horizontal direction gave a viewer a higher effect obtained by the curvature than the sample C and the sample D which was curved in a vertical direction and in which distortion was not caused in a horizontal direction.

Furthermore, according to FIG. 19A, it was found that, between the sample A and the sample B curved in a horizontal direction, a stronger stereoscopic effect was obtained in the sample A having a convex surface on the viewer side than in the sample B. This is considered to be due to the difference in the distance between a viewer and a display portion.

Figure 20B:
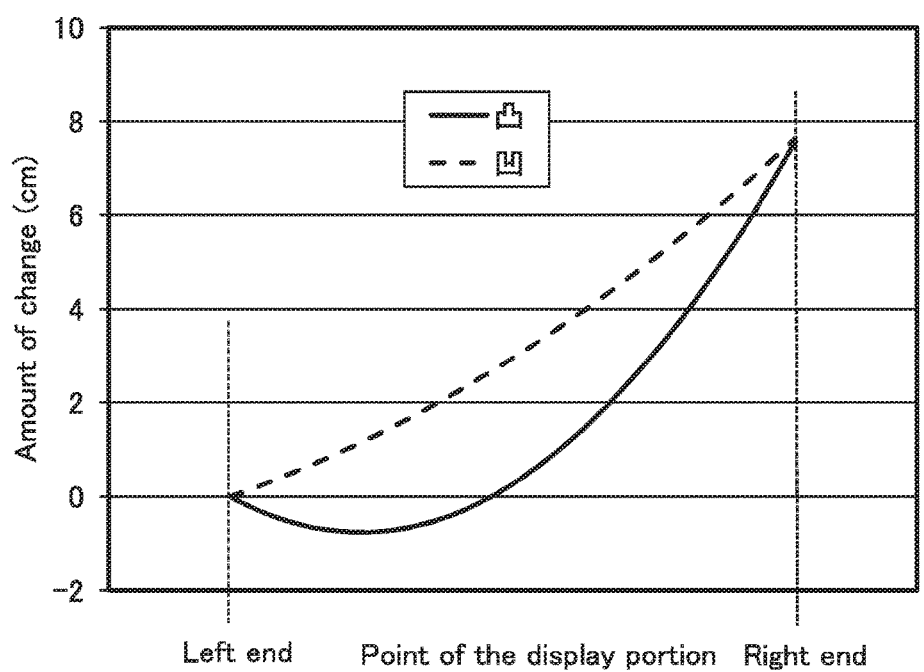
FIG. 20B shows the amount of change in distance between a viewer and a display portion.

FIG. 20B shows the amount of change in the distance between the left eye of a viewer and a display portion when the display portions of the sample A and the sample B are each viewed from the left end to the right end. The visual distance was 30 cm. In FIG. 20B, the visual distance at the left end of the display portion was the reference. When having a concave surface on the viewer side, the left eye of a viewer and a display portion are the closest to each other at the left end of the display portion, and the distance becomes longer as the eye is closer to the right end. When having a convex surface on the viewer side, the left eye of a viewer and a display portion are the closest to each other in a region of the display portion between a slight right side of the left end and a slight left side of the center, and the distance becomes longer as the eye are closer to the right end. Thus, the distance between the left eye of the viewer and the display portion is larger at the right end than the left end of the display portion.

When having a convex surface on the viewer side, the amount of change in the distance between the left eye of a viewer and a display portion is large and much information travel to the brain of the viewer as compared with the case of having a concave surface on the viewer side; therefore, the viewer easily has an optical illusion and senses as if a stereoscopic effect is increased.

As described above, it was found that a display device including a display portion having a curved surface of one embodiment of the present invention can have a strong stereoscopic effect, pop-out effect, and sense of depth in a two-dimensional image as compared with the display device including the display portion without a curved surface.

Next, results of sensitivity evaluation carried out to verify a difference in a stereoscopic effect that a viewer feels, which was made by a curvature radius of the curved surface in the display portion, are described.

The display device used for the sensitivity evaluation was a 3.4-inch sized flexible organic EL display with a definition of 326 ppi. The structure and the manufacturing method are similar to those of the display device used for the above sensitivity evaluation.

In two samples of this display device, one bent as illustrated in FIG. 1A1 is referred to as a sample a, and one bent as illustrated in FIG. 1B1 is referred to as a sample b. In addition, a comparative sample formed by fixing the display device on a flat glass substrate was prepared. Curvature radiuses of the sample a and the sample b were each four kinds, 30 mm, 50 mm, 100 mm, and 200 mm. Note that the samples bent at R=30 mm are in the state where the curvature is increased to the degree close to a limit within the range in which the entire display fits in a visual field of a viewer.

The following cases were compared to evaluate whether there is a difference in a stereoscopic effect, naturalness (here, whether there is uncomfortable feeling), fatigue, and desirousness of actually using the sample as a device: the case where a display portion of the sample a or the sample b, which both displayed the same moving image and was bent at any of four kinds of curvature radiuses, was viewed; and the case where a display portion of the comparative sample which displayed the same moving image, was viewed. The viewer compared and evaluated the display portion of the sample a or the sample b and the display portion of the comparative sample that are laid side by side. There were 24 examinees.

For the evaluation, an SD method was used. The display portion of the sample a or the sample b was viewed by comparing with the display portion of the comparative sample, and whether there was a stereoscopic effect, naturalness, fatigue, and desirousness of actually using the sample as a device in the moving image on the above scale was evaluated in a manner similar to that of the above sensitivity evaluation.

FIGS. 27A and 27B and FIGS. 28A and 28B show evaluation results. In the evaluation results, the average score of the 24 examinees is shown. A condition under which a significant difference is statistically observed at a probability of 95% or more is indicated by *.

As shown in FIGS. 27A and 27B and FIGS. 28A and 28B, it is found that the convex surface with a stronger pop-out effect than the flat surface and the concave surface with a stronger sense of depth than the flat surface in the above sensitivity evaluation each have a condition of a curvature radius which effectively increases the stereoscopic effect.

By comprehensively judging this experiment, the sample a having a convex surface and the sample b having a concave surface can effectively obtain strong stereoscopic effects with curvature radiuses R of 100 mm and 200 mm, respectively.

Meanwhile, it was also observed that the optimum condition differs depending on the viewer. The display device of one embodiment of the present invention described as an example in Embodiment 1 is effective in that a viewer can feel a strong stereoscopic effect or sense of depth in a two-dimensional image because the degree of a curvature can be adjusted by the viewer or the display device so that curvature suitable for the viewer can be obtained.

EXAMPLE 4

In this example, a result of sensitivity evaluation carried out to verify whether a viewer can feel a stereoscopic effect in a two-dimensional image displayed on a display device will be described.

The display device used for the sensitivity evaluation was a 13.5-inch sized flexible organic EL display with a definition of 326 ppi. This organic EL display has the structure of Structure Example 1-3 described in Embodiment 2. An oxide semiconductor (CAAC-OS) was used for the transistor. The organic EL display was fabricated by using the manufacturing method described in Embodiment 2.

Figure 21A:
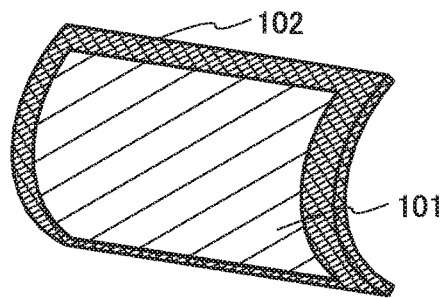
FIGS. 21A to 21D illustrate a display device in Example 4.
Figure 21B:
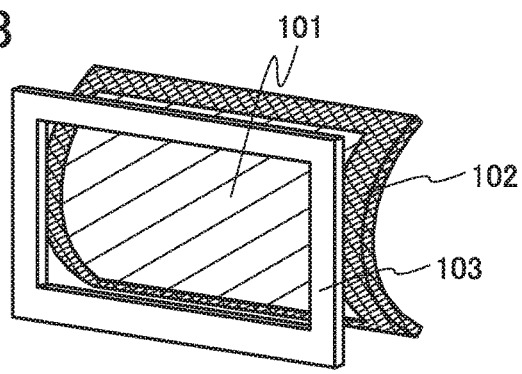
Figure 21C:
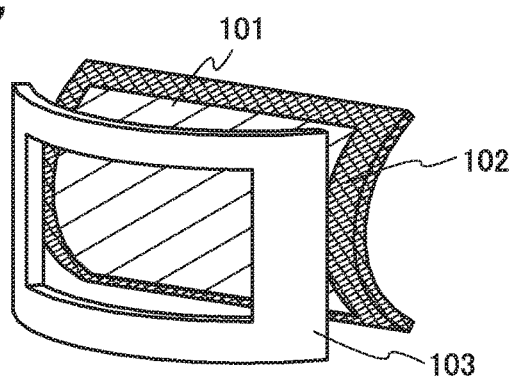
Figure 21D:
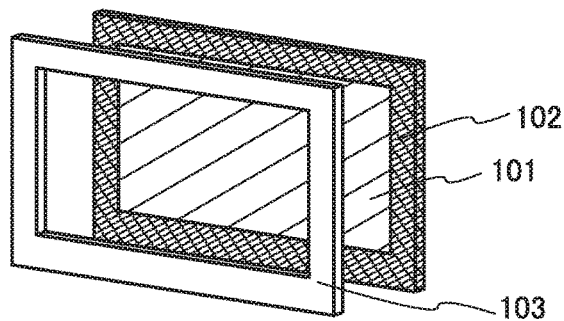

A sample of this display device, which is bent in a vertical direction as illustrated in FIG. 21A so as to have a convex surface on the viewer side, is referred to as a sample E. Another sample, in which the sample E is viewed through an opening of a light-blocking flat frame portion as illustrated in FIG. 21B, is referred to as a sample F. Another sample, in which the sample E is viewed through an opening of a frame portion which is bent in a horizontal direction as illustrated in FIG. 21C so as to have a convex surface on the viewer side, is referred to as a sample G. In addition, a comparative sample formed by fixing the display device on a flat glass substrate and was viewed through an opening of a light-blocking flat frame portion was prepared as illustrated in FIG. 21D.

The viewer sees a moving image displayed on the display portion from the front unless otherwise described. The distance between the viewer and the display portion was 50 cm or more and 60 cm or less. Evaluation was performed in a lighted room. The distance between the frame portion and the display portion was 10 cm. A sheet of black drawing paper was used for the light-blocking frame portion.

When the distance between a viewer and the display portion is 60 cm, the size of an opening of the light-blocking frame portion and the size of the display portion appear to be substantially the same from the viewer side (an inner frame (the periphery of the opening) of the frame portion appears to substantially align with an end portion of the display portion) when the distance between the frame portion and the display portion is 10 cm. Therefore, when the distance between the frame portion and the display portion exceeds 10 cm, the viewer can see the end portion of the display portion through the opening of the frame portion.

In this example, the sample E and the sample F were compared, the comparative sample and the sample F were compared, and the sample F and the sample G were compared.

The following cases were compared to evaluate whether there is a difference in a stereoscopic effect, a pop-out effect, a sense of depth, and naturalness (here, whether there is uncomfortable feeling): the case where a display portion of one of the samples was viewed, and the case where a display portion of the other sample was viewed, which both displayed the same moving image. There were 7 examinees.

For the evaluation, an SD method was used. Specifically, a stereoscopic effect, a pop-out effect, a sense of depth, and naturalness in the moving image of the display portion of the other sample were evaluated by comparing with the case of viewing the display portion of the one sample on a scale of +2 to −2 ("extremely strong (+2)", "strong (+1)", "not different (0)", "weak (−1)", and "extremely weak (−2)".

Figure 22A:
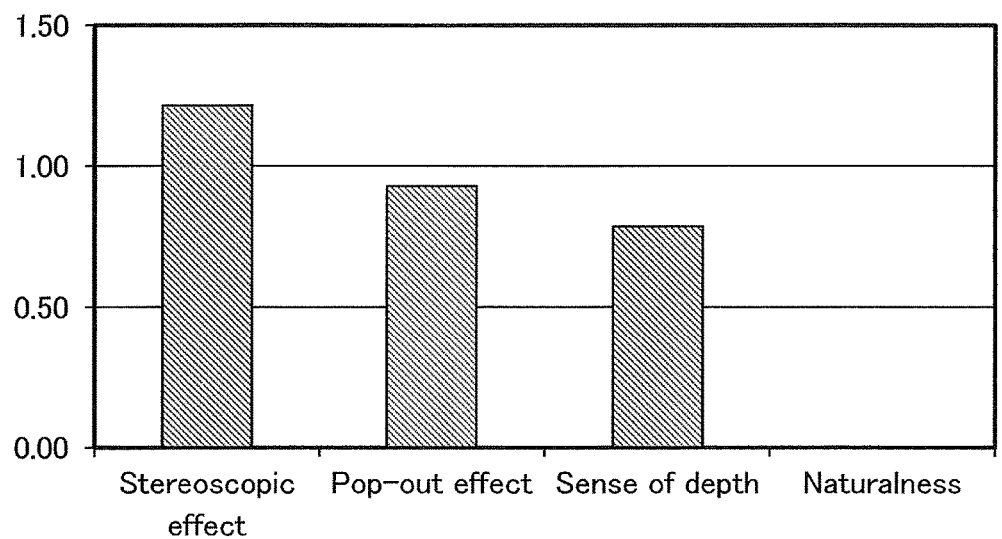
FIGS. 22A and 22B show results in Example 4.
Figure 22B:
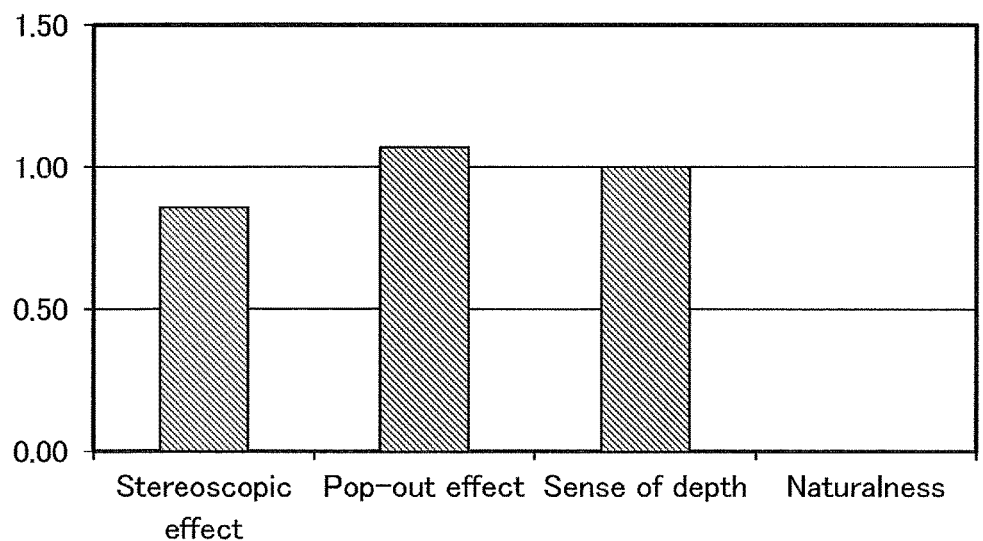
Figure 23:
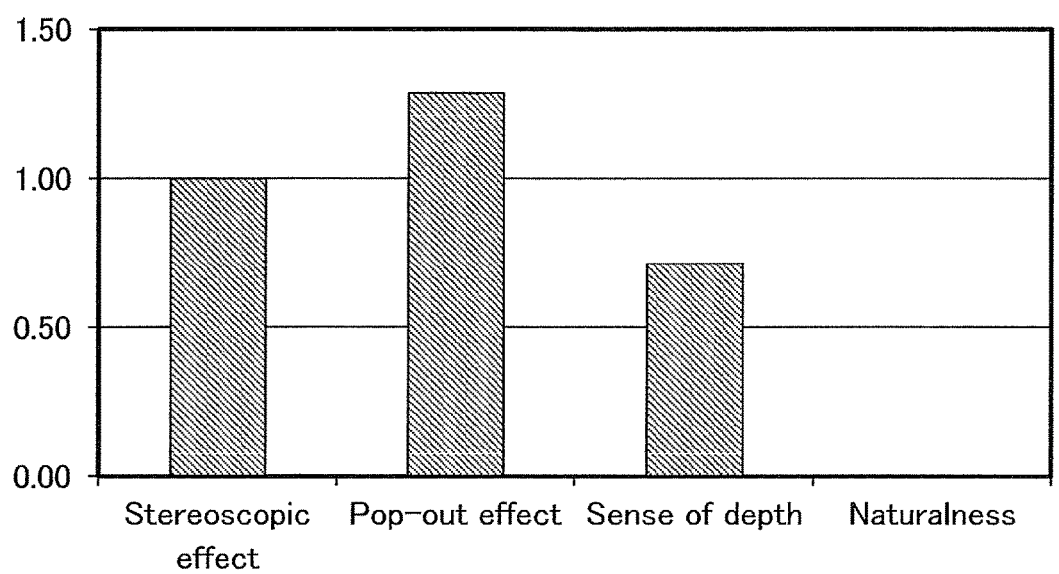
FIG. 23 shows results in Example 4.

FIGS. 22A and 22B and FIG. 23 show evaluation results. In the evaluation results, the average score of the 7 examinees is shown.

FIG. 22A shows a stereoscopic effect, a pop-out effect, a sense of depth, and naturalness in the moving image of the display portion of the sample F in comparison with the display portion of the sample E.

From the result of FIG. 22A, it was found that the display device including the display portion having a curved surface can have a stronger stereoscopic effect, pop-out effect, and sense of depth when viewing the display portion through an opening of a frame portion, than viewing the display portion without through the opening of the frame portion. In addition, it was found that a viewer did not feel large uncomfortable feeling even with a frame portion from the result that naturalness did not change.

As described above, it was found that even when a display portion is viewed through an opening of a frame portion, a display device including a display portion having a curved surface of one embodiment of the present invention can have a strong stereoscopic effect, pop-out effect, and sense of depth in a two-dimensional image.

FIG. 22B shows a stereoscopic effect, a pop-out effect, a sense of depth, and naturalness in the moving image of the display portion of the sample F in comparison with the display portion of the comparative sample.

From the result of FIG. 22B, it was found that the display device including the display portion having a curved surface can have a stronger stereoscopic effect, pop-out effect, and sense of depth when viewing the display portion through an opening of a frame portion, than viewing the display device including the display portion without a curved surface through the opening of the frame portion. In addition, it was found that a viewer did not feel large uncomfortable feeling even when the display portion has a curved surface from the result that naturalness did not change.

FIG. 23 shows a stereoscopic effect, a pop-out effect, a sense of depth, and naturalness in the moving image of the display portion of the sample G in comparison with the display portion of the sample F.

From the result of FIG. 23, it was found that the display device including the display portion having a curved surface can have a stronger stereoscopic effect, pop-out effect, and sense of depth when viewing the display portion through an opening of a curved frame portion, than viewing the display portion through an opening of a flat frame portion. In addition, it was found that a viewer did not feel large uncomfortable feeling even when the frame portion was curved from the result that naturalness did not change.

Note that although not shown in a graph, when the end portion of the display portion was able to be seen through the opening of the frame portion, a strong stereoscopic effect, pop-out effect, and sense of depth were unlikely to be obtained and further a stereoscopic effect, a pop-out effect, or a sense of depth were weakened as compared with the case where the display portion was viewed without through the opening of the frame portion. In addition, when the end portion of the display portion was able to be seen through the opening of the frame portion, the viewer felt tired strongly and the image appeared abnormal to the viewer. Accordingly, in the display device of one embodiment the present invention, it is preferable that a distance between the frame portion and the display portion be able to be controlled so that the end portion of the display portion overlaps with the frame portion and a viewer cannot see the end portion of the display portion.

As described above, it was found that the display device including the display portion having a curved surface can have a stronger stereoscopic effect, pop-out effect, and sense of depth when viewing the display portion through the opening of the frame portion, than viewing the display portion without through the opening of the frame portion. In particular, it was found that a strong stereoscopic effect, pop-out effect, and sense of depth were able to be obtained by using a curved frame portion as compared with the case of using a flat frame portion.

EXAMPLE 5

This example focused on the involuntary eye movement of a viewer at the time of viewing a two-dimensional image displayed on a display device. The involuntary eye movement is minute movement of eyes. Eyes keep moving even when the sight line stays at the same place as in the case of viewing a stationary body. Being continuously affected by the same stimulus, a visual cell gets tired with the stimulus and cannot recognize objects. The involuntary eye movement is considered as a physiological phenomenon for continuing perception of visual information. The involuntary eye movement can be classified into microsaccade (intermittent and minute saccade of a visual point, which is also referred to as flick), drift (a curvilinear oscillation), and tremor (a minute oscillation). Of the involuntary eye movement, microsaccade and drift are concerned with recognition of a high resolution image; therefore, the possibility exists that the amount of the involuntary eye movement affects the stereoscopic recognition.

In this example, as the display device, two kinds of display devices which are a flat-panel organic EL display (5.9 inch, 249 ppi, and a contrast ratio of 100000:1 or more) and a flat-panel liquid crystal display (6.05 inch, 212 ppi and a contrast ratio of 91:1) were used.

In this example, eye movement of examinees when the display device was viewed was measured using a limbus tracking method.

The two-dimensional images displayed on the two kinds of display devices are the same still images. The eye movement of an examinee was measured under a condition in which the examinee paid attention to a black Landolt ring which was displayed in a white background (luminance of 200 cd/m$^2$).

Figure 24:
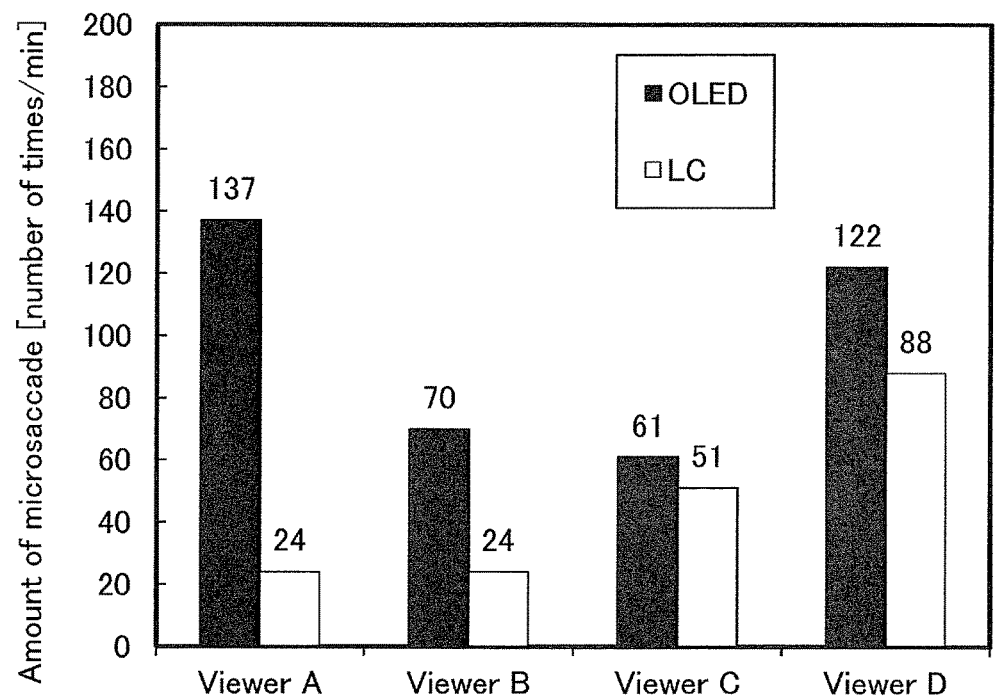
FIG. 24 shows results in Example 5.

This example focused on the amount of generated microsaccade from the measurement result of eye movement. FIG. 24 shows the amount of microsaccade generated in each examinee for each of the organic EL display and the liquid crystal display. In FIG. 24, the vertical axis represents the amount of generated microsaccade. FIG. 24 indicates that the occurrence frequency of microsaccade in the organic EL display is greater than that in the liquid crystal display. As the result of this example, it was found that there was a difference between the organic EL display and the liquid crystal display in the amount of generated microsaccade.

This application is based on Japanese Patent Application serial no. 2013-244743 filed with Japan Patent Office on November 27, 2013, Japanese Patent Application serial no. 2014-132607 filed with Japan Patent Office on Jun. 27, 2014, and Japanese Patent Application serial no. 2014-180540 filed with Japan Patent Office on Sep. 4, 2014, the entire contents of which are hereby incorporated by reference.

What is claimed is:

1. A display device comprising:
    a display portion comprising a display surface; and
    a frame portion comprising an opening, provided in front of the display surface with a distance therebetween,
    wherein the display portion is configured to be curved,
    wherein the opening of the frame portion overlaps with the display surface,
    wherein the frame portion overlaps with an end portion of the display portion, and
    wherein the frame portion is configured to be curved independently of a curvature of the display portion.

2. The display device according to claim 1, wherein a degree and a direction of the curvature of the display portion are configured to be changed.

3. The display device according to claim 1, wherein each of the display portion and the frame portion can be curved convexly or concavely in a horizontal or vertical direction.

4. The display device according to claim 1, wherein a curved line is provided at a corner of an inner frame of the frame portion.

5. The display device according to claim 4, wherein a curvature of the curved line of the corner of the inner frame is larger than a curvature of a corner of the display portion.

6. The display device according to claim 1, wherein a size of the opening of the frame portion is configured to be changed.

7. The display device according to claim 1, wherein the frame portion can be attached to and detached from the display device.

8. The display device according to claim 1, wherein the frame portion has a light-blocking property.

9. A display device comprising:
a display portion and a non-display portion surrounding the display portion; and
a frame portion comprising an opening, provided in front of a display surface of the display portion with a distance therebetween,
wherein the display portion is configured to be curved,
wherein the opening of the frame portion overlaps with the display surface,
wherein the frame portion overlaps with the non-display portion, and
wherein the frame portion is configured to be curved independently of a curvature of the display portion.

10. The display device according to claim 9, wherein a degree and a direction of the curvature of the display portion are configured to be changed.

11. The display device according to claim 9, wherein each of the display portion and the frame portion can be curved convexly or concavely in a horizontal or vertical direction.

12. The display device according to claim 9, wherein a curved line is provided at a corner of an inner frame of the frame portion.

13. The display device according to claim 12, wherein the curvature of the curved line of the corner of the inner frame is larger than a curvature of a corner of the display portion.

14. A display device comprising:
a display portion comprising a display surface;
a frame portion comprising an opening, provided in front of the display surface with a distance therebetween; and
a drive control portion,
wherein the display portion is configured to be curved by the drive control portion,
wherein the opening of the frame portion overlaps with the display surface,
wherein the frame portion overlaps with an end portion of the display portion, and
wherein the frame portion is configured to be curved independently of a curvature of the display portion.

15. The display device according to claim 14, wherein each of the display portion and the frame portion can be curved convexly or concavely in a horizontal or vertical direction.

16. The display device according to claim 14, further comprising an arithmetic processing portion,
wherein the arithmetic processing portion receives data and generates a control signal by analyzing the data, and
wherein the drive control portion receives the control signal.

17. The display device according to claim 14, wherein the data includes image data and audio data.

18. A display device comprising:
a display portion configured to be curved;
an arithmetic processing portion configured to be supplied with data and generate a control signal by analyzing the data;
a drive control portion configured to be supplied with the control signal and change a degree and a direction of a curvature of the display portion; and
a frame portion comprising an opening,
wherein the frame portion is configured to be curved,
wherein a degree and a direction of a curvature of the frame portion can be changed independently of the curvature of the display portion, and
wherein the display portion comprises a transistor in a pixel portion.

19. The display device according to claim 18,
wherein the frame portion faces a display surface of the display portion with a distance therebetween,
wherein the opening of the frame portion overlaps with the display surface, and
wherein the frame portion overlaps with an end portion of the display portion.

20. The display device according to claim 18, wherein each of the display portion and the frame portion can be curved convexly or concavely in a horizontal or vertical direction.

21. The display device according to claim 18, wherein the data includes image data and audio data.

22. A display device comprising:
a light-transmitting layer comprising a viewing surface and a convex surface opposite to each other;
a display portion comprising a curved display surface along and in contact with the convex surface of the light-transmitting layer; and
a frame portion comprising an opening, provided in front of the viewing surface,
wherein a refractive index of the light-transmitting layer is higher than a refractive index of the air,
wherein the opening of the frame portion overlaps with the display surface with the light-transmitting layer therebetween,
wherein the frame portion overlaps with an end portion of the display portion with the light-transmitting layer therebetween, and
wherein a thickness at a center of the light-transmitting layer is different from a thickness near an edge of the light-transmitting layer.

23. The display device according to claim 22, wherein the viewing surface is curved.

24. The display device according to claim 22, wherein the frame portion is in contact with the viewing surface and the end portion of the display portion.

25. The display device according to claim 22, wherein the display portion comprises a plurality of light emitting elements which emit light toward the viewing surface.

26. The display device according to claim 22, wherein the frame portion has a light-blocking property.

* * * * *